United States Patent
Ito et al.

(10) Patent No.: US 10,811,393 B2
(45) Date of Patent: *Oct. 20, 2020

(54) MEMORY DEVICE

(71) Applicant: Toshiba Memory Corporation, Minato-ku (JP)

(72) Inventors: Mikihiko Ito, Tokyo (JP); Masaru Koyanagi, Tokyo (JP); Masafumi Nakatani, Tokyo (JP); Shinya Okuno, Yokohama (JP); Shigeki Nagasaka, Kawasaki (JP); Masahiro Yoshihara, Yokohama (JP); Akira Umezawa, Tokyo (JP); Satoshi Tsukiyama, Yokohama (JP); Kazushige Kawasaki, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,576

(22) Filed: Mar. 11, 2019

(65) Prior Publication Data

US 2019/0206845 A1    Jul. 4, 2019

Related U.S. Application Data

(63) Continuation of application No. PCT/JP2017/011784, filed on Mar. 23, 2017.

(30) Foreign Application Priority Data

Sep. 23, 2016 (WO) .................. PCT/JP2016/078046

(51) Int. Cl.
*G11C 16/30* (2006.01)
*H01L 25/065* (2006.01)
(Continued)

(52) U.S. Cl.
CPC .......... *H01L 25/0657* (2013.01); *G11C 16/08* (2013.01); *G11C 16/10* (2013.01);
(Continued)

(58) Field of Classification Search
None
See application file for complete search history.

(56) References Cited

U.S. PATENT DOCUMENTS 9,496,042 B1 * 11/2016 Abiko ................. G11C 16/10
2001/0030561 A1  10/2001 Asano et al.
(Continued)

FOREIGN PATENT DOCUMENTS

JP    2001-222474    8/2001
JP    2002-305283    10/2002
(Continued)

OTHER PUBLICATIONS

International Search Report dated Jun. 13, 2017 in PCT/JP2017/011784 filed Mar. 23, 2017 (with English Translation).
(Continued)

*Primary Examiner* — Tan T. Nguyen
(74) *Attorney, Agent, or Firm* — Oblon, McClelland, Maier & Neustadt, L.L.P.

(57) ABSTRACT

According to one embodiment, a memory device includes: a first chip including a first circuit, first and second terminals; a second chip including a second circuit and a third terminal; and an interface chip including first and second voltage generators. The first chip is between the second chip and the interface chip. The first terminal is connected between the first circuit and the first voltage generator. A third end of the second terminal is connected to the third terminal and a fourth end of the second terminal is connected to the second voltage generator. A fifth end of the third terminal is connected to the second circuit and a sixth end of
(Continued)

the third terminal is connected to the second voltage generator via the second terminal. The third end overlaps with the sixth end, without overlapping with the fourth end.

13 Claims, 28 Drawing Sheets

(51) Int. Cl.
  *G11C 16/10* (2006.01)
  *G11C 16/14* (2006.01)
  *G11C 16/32* (2006.01)
  *G11C 16/26* (2006.01)
  *H01L 27/10* (2006.01)
  *G11C 16/08* (2006.01)
  *G11C 16/12* (2006.01)
  *G11C 16/34* (2006.01)
  *G11C 16/04* (2006.01)

(52) U.S. Cl.
  CPC .............. *G11C 16/12* (2013.01); *G11C 16/14* (2013.01); *G11C 16/26* (2013.01); *G11C 16/30* (2013.01); *G11C 16/32* (2013.01); *G11C 16/3404* (2013.01); *H01L 27/10* (2013.01); *G11C 16/0483* (2013.01); *H01L 2225/06513* (2013.01); *H01L 2225/06517* (2013.01); *H01L 2225/06541* (2013.01)

(56) References Cited

U.S. PATENT DOCUMENTS

| | | |
|---|---|---|
| 2002/0109236 A1 | 8/2002 | Kim et al. |
| 2006/0145301 A1 | 7/2006 | Saito et al. |
| 2008/0074930 A1 | 3/2008 | Kanda |
| 2008/0123386 A1* | 5/2008 | Kang ................ G11C 5/063 365/63 |
| 2008/0150359 A1 | 6/2008 | Yamada |
| 2009/0003103 A1 | 1/2009 | Shimizu et al. |
| 2009/0059641 A1* | 3/2009 | Jeddeloh ............ H01L 23/481 365/63 |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2012/0051155 A1 | 3/2012 | Chung |
| 2012/0063234 A1 | 3/2012 | Shiga et al. |
| 2012/0134193 A1 | 5/2012 | Ide |
| 2013/0134583 A1 | 5/2013 | Tsukiyama et al. |
| 2014/0021978 A1 | 1/2014 | Ikeda |
| 2016/0148907 A1 | 5/2016 | Segawa et al. |
| 2016/0163374 A1 | 6/2016 | Koyama et al. |
| 2016/0163386 A1 | 6/2016 | Hwang et al. |
| 2017/0077066 A1* | 3/2017 | Hamada ................ H03K 5/24 |
| 2017/0337976 A1* | 11/2017 | Okuno .................. G11C 16/12 |
| 2019/0206495 A1* | 7/2019 | Ito ........................ G11C 16/32 |

FOREIGN PATENT DOCUMENTS

| | | |
|---|---|---|
| JP | 2006-190761 | 7/2006 |
| JP | 2007-250561 | 9/2007 |
| JP | 2008-4639 | 1/2008 |
| JP | 2008-159736 | 7/2008 |
| JP | 2009-3991 | 1/2009 |
| JP | 4791924 B2 | 10/2011 |
| JP | 2012-58860 | 3/2012 |
| JP | 2014-22652 | 2/2014 |
| JP | 5814859 B2 | 11/2015 |
| JP | 2016-225484 | 12/2016 |

OTHER PUBLICATIONS

Written Opinion dated Jun. 13, 2017 in PCT/JP2017/011784 filed Mar. 23, 2017.
Office Action dated Feb. 20, 2020, in co-pending U.S. Appl. No. 16/298,591, 114 pages.

* cited by examiner

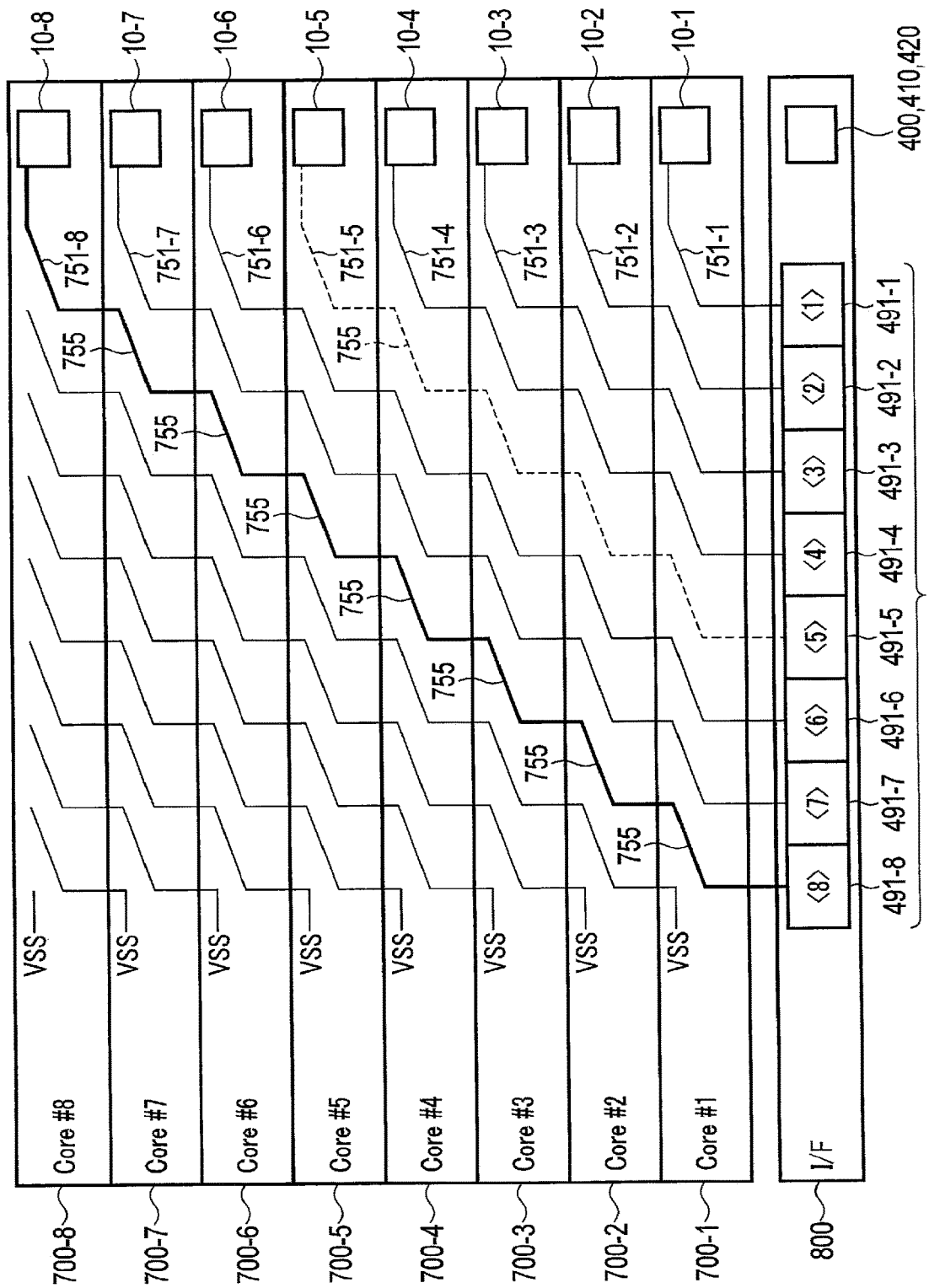
F I G. 5

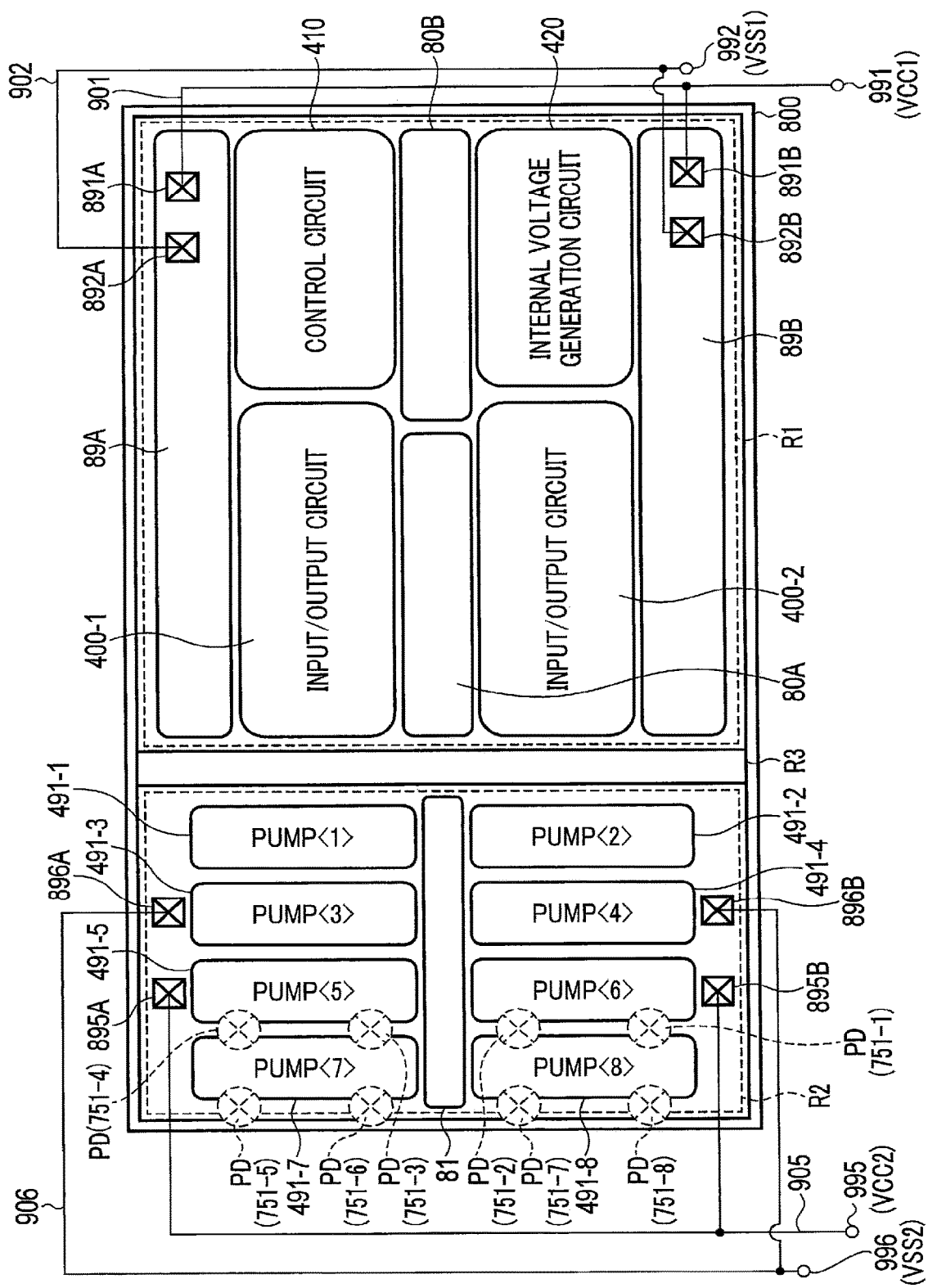
F I G. 6

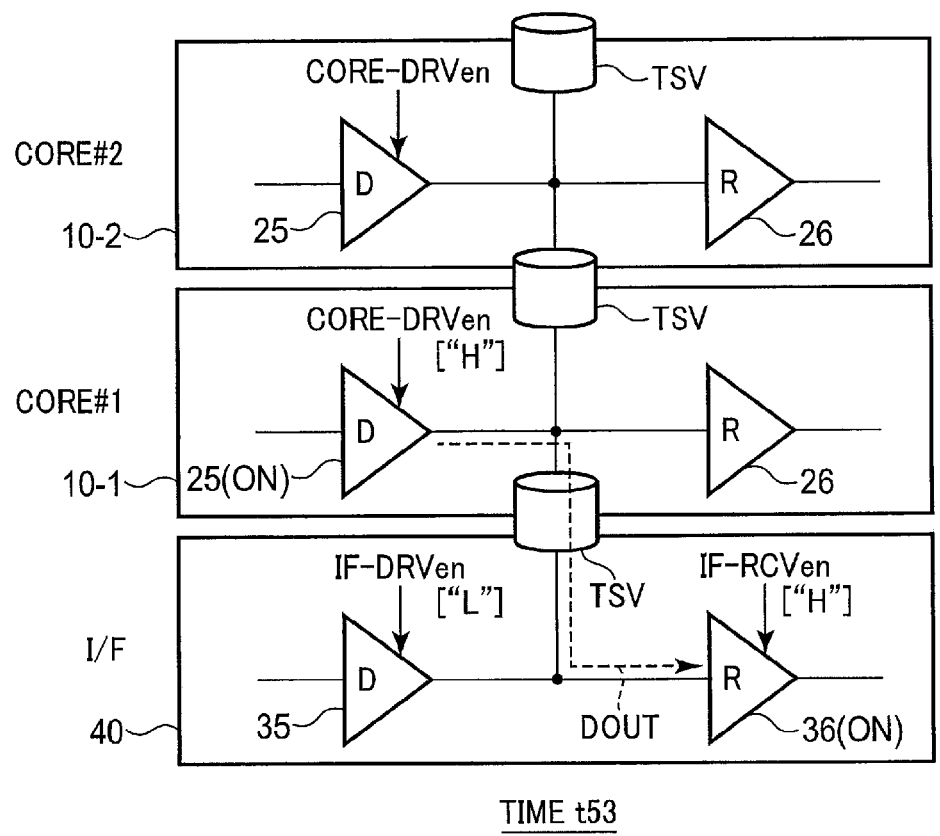
F I G. 16

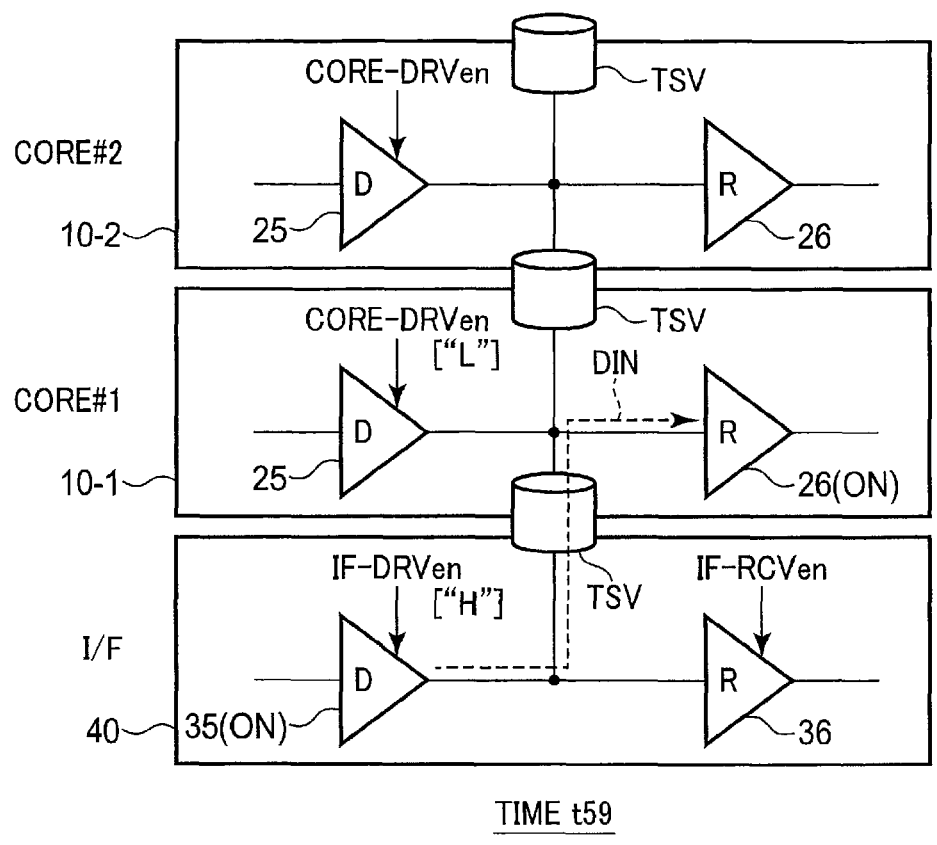
F I G. 18

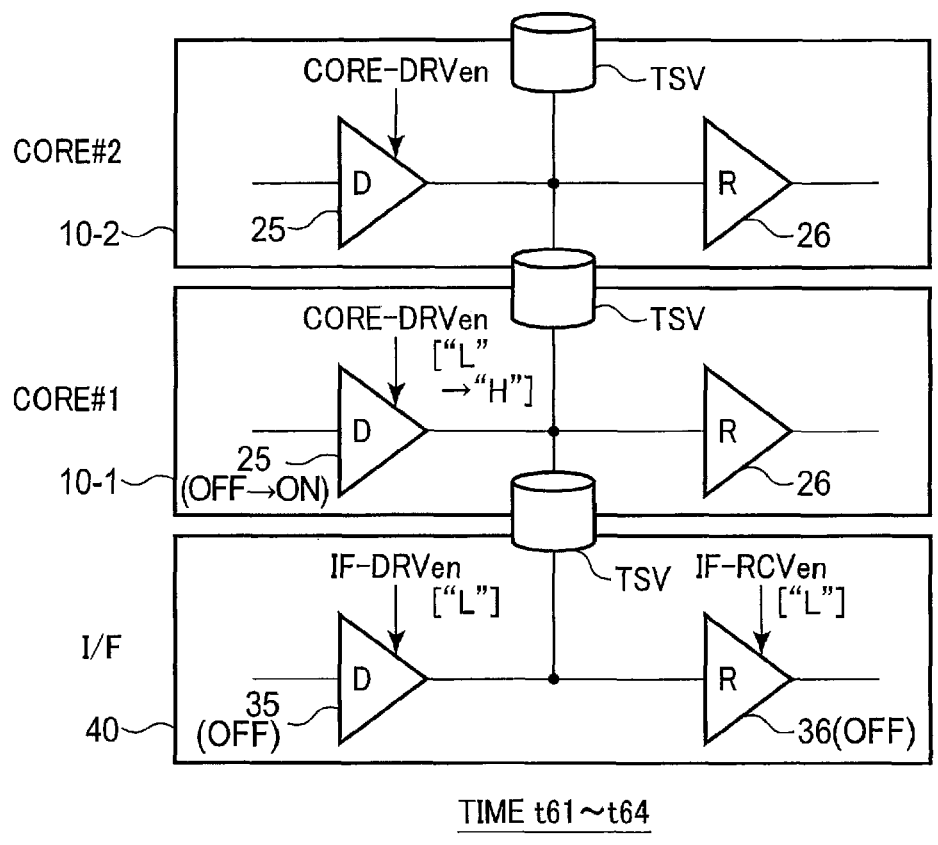
F I G. 19

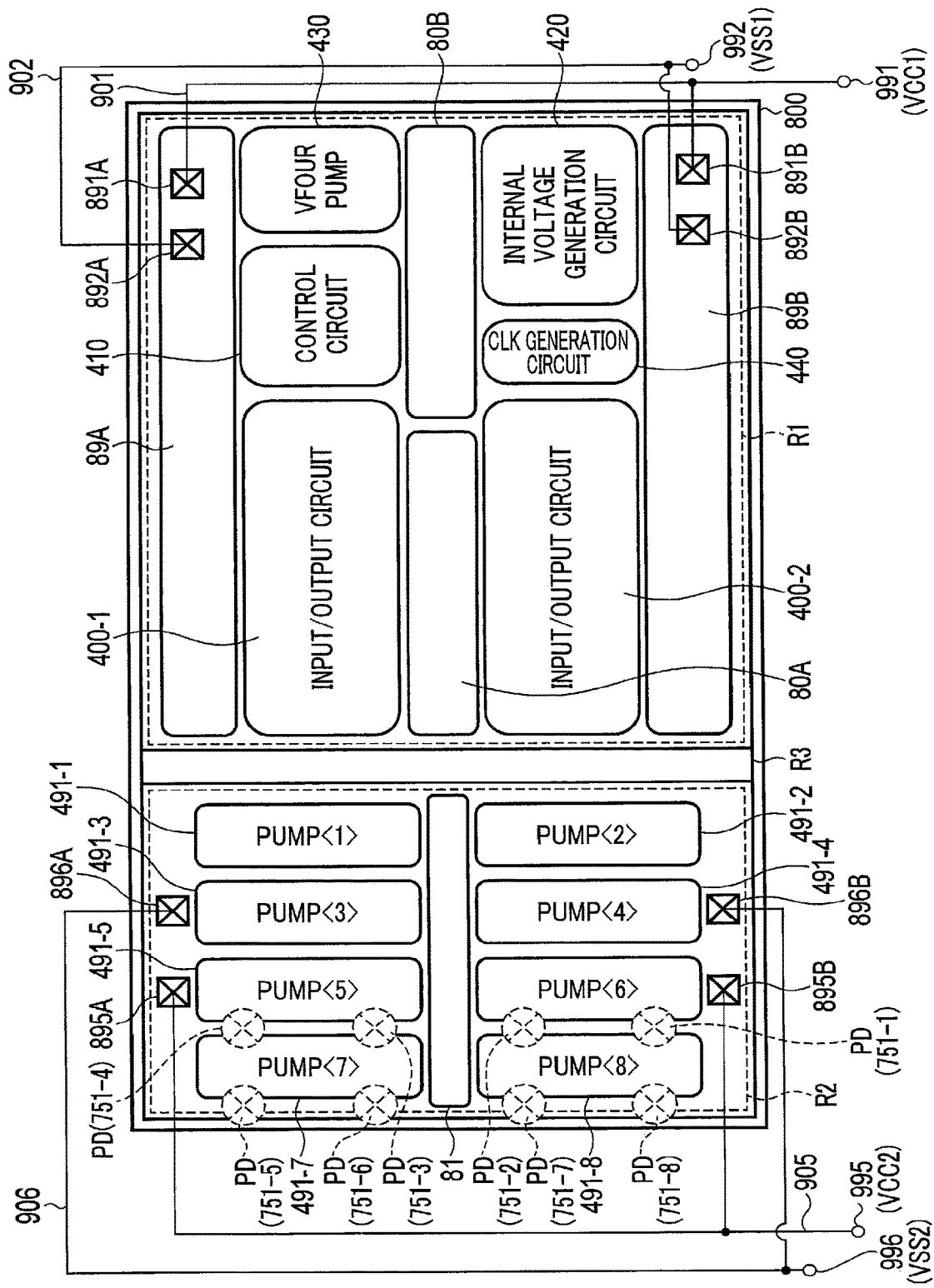
F I G. 22

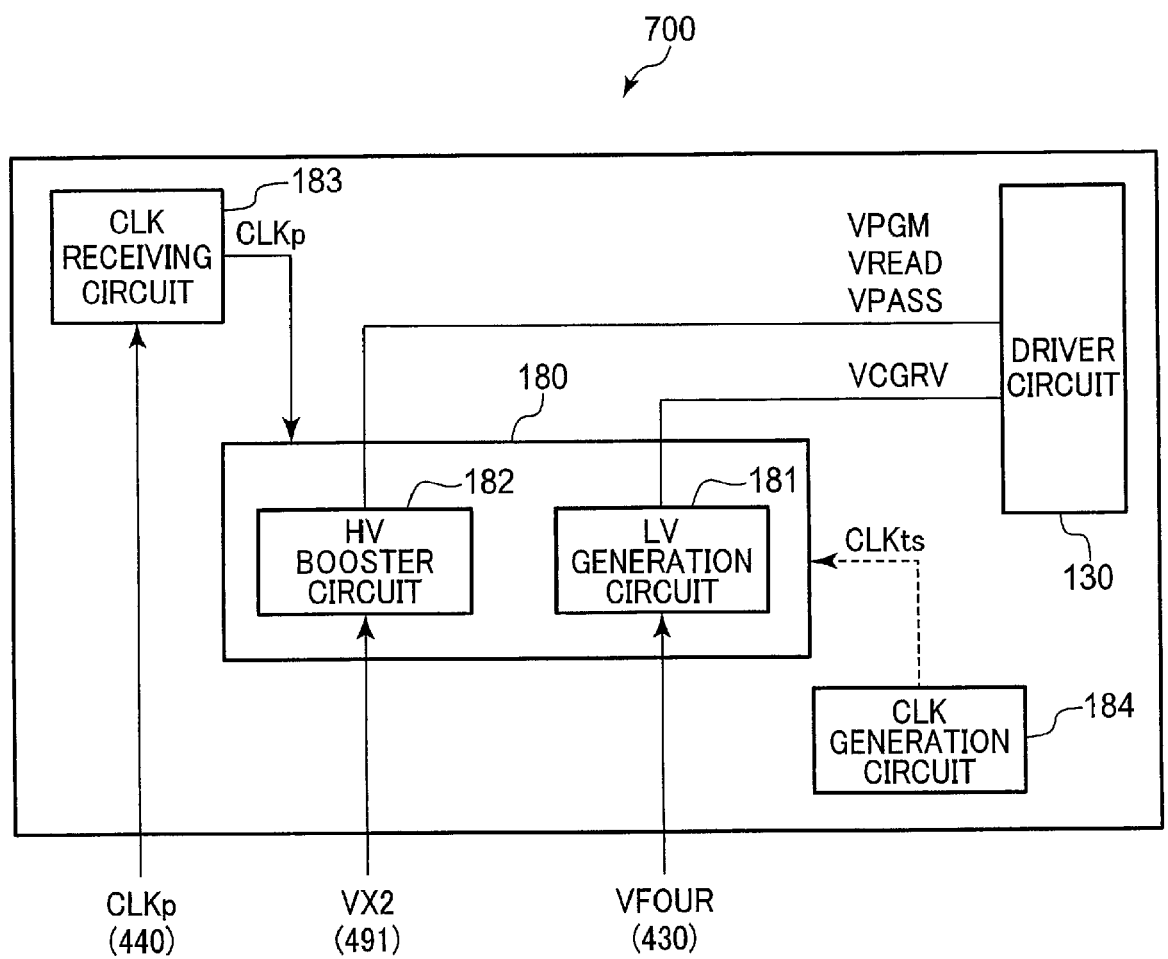
F I G. 23

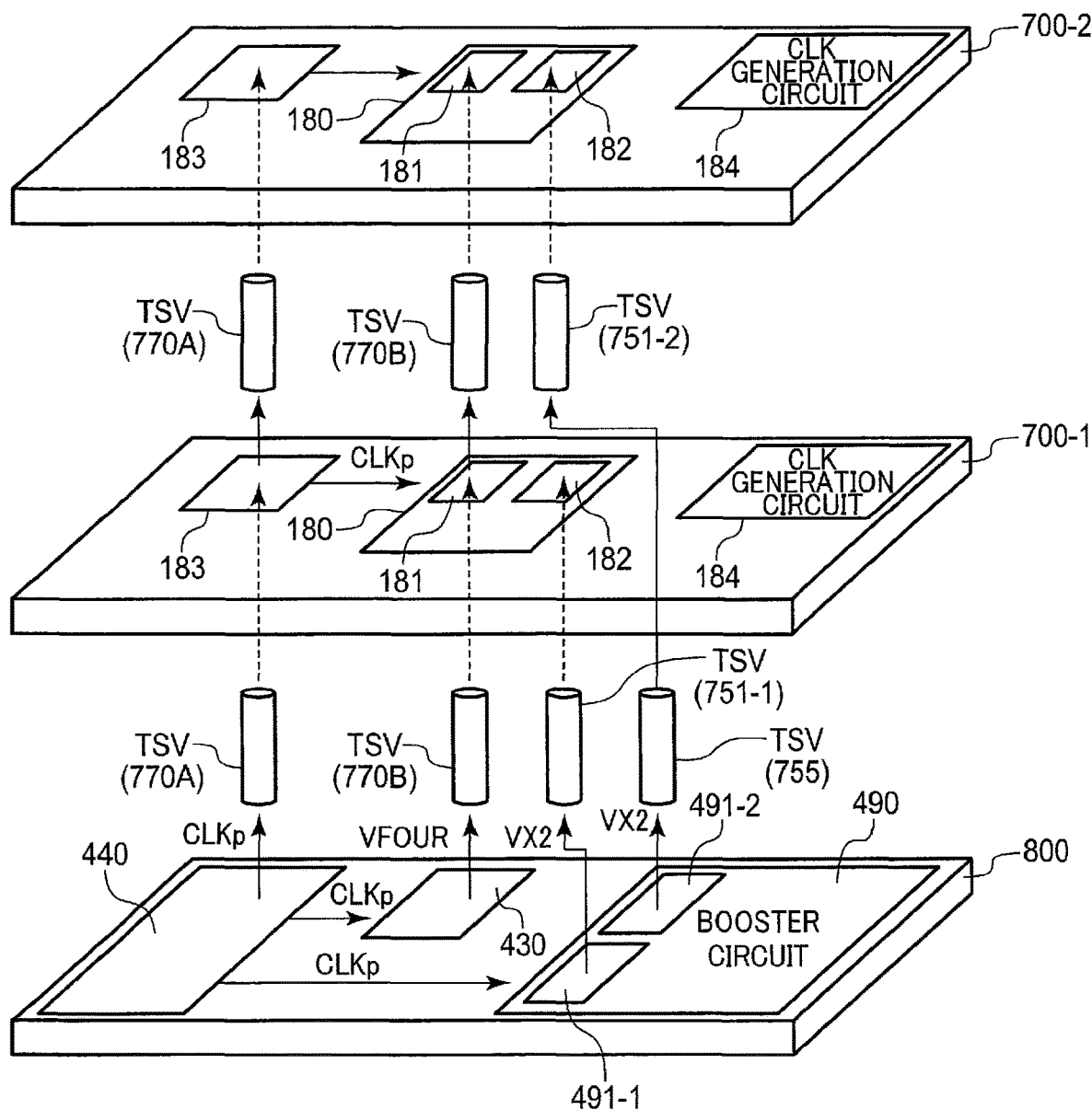
F I G. 24

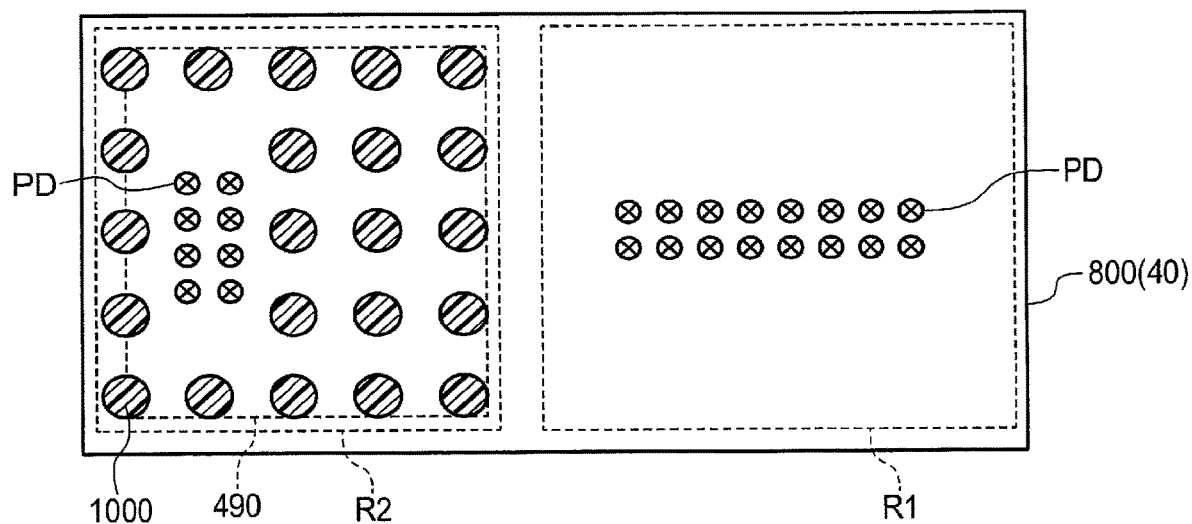
F I G. 28

MEMORY DEVICE

CROSS-REFERENCE TO RELATED APPLICATIONS

This application is a Continuation Application of PCT Application No. PCT/JP2017/011784, filed Mar. 23, 2017, and based upon and claiming the benefit of priority from PCT Application No. PCT/JP2016/0178046, filed Sep. 23, 2016, the entire contents of which are incorporated herein by reference.

FIELD

Embodiments described herein relate generally to a memory device.

BACKGROUND

A flash memory is used in various electronic devices.

BRIEF DESCRIPTION OF THE DRAWINGS

FIG. 5 is a schematic diagram showing a structural example of the memory device of the first embodiment.

FIG. 6 is a top view showing a structural example of the memory device of the first embodiment.

FIG. 16 is a schematic diagram for explaining an operation example of the memory device of the fourth embodiment.

FIG. 18 is a schematic diagram for explaining an operation example of the memory device of the fourth embodiment.

FIG. 19 is a schematic diagram for explaining an operation example of the memory device of the fourth embodiment.

FIG. 22 is a top view of an interface chip showing a structural example of a memory device of a sixth embodiment.

FIG. 23 is a top view of a memory core chip showing a structural example of the memory device of the sixth embodiment.

FIG. 24 is a schematic diagram for explaining the memory device of the sixth embodiment.

FIG. 28 is a top view of an interface chip showing a structural example of the memory device of the eighth embodiment.

DETAILED DESCRIPTION

Hereinafter, the embodiments will be described in detail with reference to FIGS. 1 to 21. In the description below, structural elements having the same functions and configurations will be denoted by the same reference symbols, and a repetitive description of such elements will be given only where necessary.

In general, according to one embodiment, a memory device includes: a first memory chip including a first circuit, a first terminal, and a second terminal; a second memory chip including a second circuit and a third terminal; and an interface chip including a first voltage generation circuit, a second voltage generation circuit, and a data input/output circuit. The second memory chip is provided above the first memory chip. The interface chip is provided below the first memory chip. A first end of the first terminal is electrically connected to the first circuit and a second end of the first terminal is electrically connected to the first voltage generation circuit. A third end of the second terminal is electrically connected to the third terminal and a fourth end of the second terminal is electrically connected to the second voltage generation circuit. A fifth end of the third terminal is electrically connected to the second circuit and a sixth end of the third terminal is electrically connected to the second voltage generation circuit via the second terminal. In a direction perpendicular to a surface of the first memory chip, the third end overlaps with the sixth end, without overlapping with the fourth end. The input/output circuit is provided in a first region of the interface chip. The first and second voltage generation circuits are provided in a second region of the interface chip. A third region is provided between the first region and the second region. The third region electrically isolates the first region from the second region.

EMBODIMENTS (1) First Embodiment

With reference to FIGS. 1 to 6, a memory device according to the first embodiment will be described.

(a) Configuration Example (a-1) Overall Configuration of Memory System

An overall configuration of a memory system including a memory device of the embodiment will be described with reference to FIG. 1.

Figure 1:
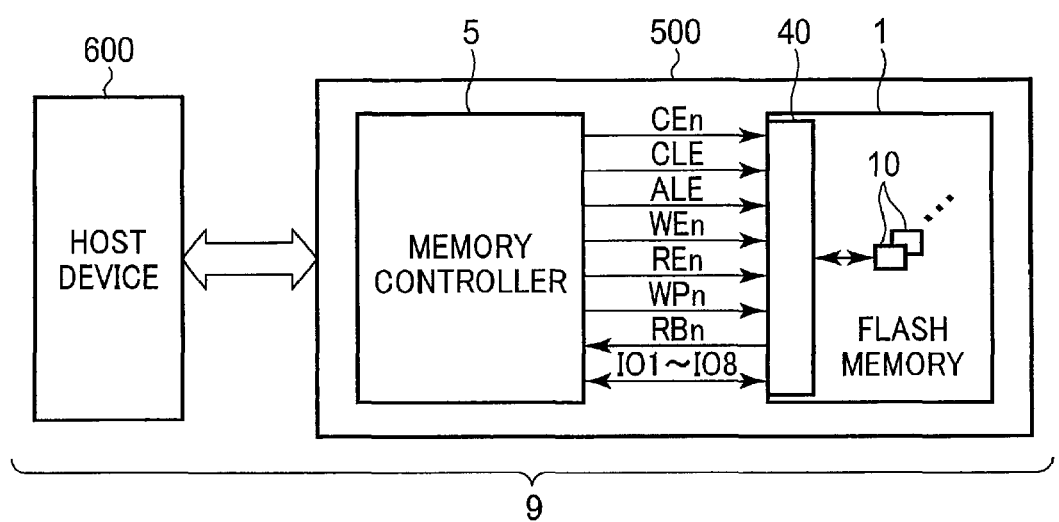
FIG. 1 is a schematic diagram of a memory system including a memory device.

FIG. 1 is a diagram showing the memory system including the memory device of the present embodiment.

As shown in FIG. 1, the memory system 9 including the memory device of the present embodiment includes a storage device 500 and a host device 600.

The host device 600 is coupled to the storage device 500 by, for example, a connector, a cable, wireless communication, a host bus, or the Internet. The host device 600 requests the storage device 500 to write data, read data, and erase data.

The storage device 500 includes a memory controller 5 and a memory device (semiconductor memory) 1.

The memory controller 5 causes the memory device 1 to execute an operation corresponding to a request from the host device 600. The memory controller 5 includes, for example, a processor (CPU), an internal memory (for example, DRAM), a buffer memory (for example, SRAM), and an ECC circuit. The memory controller 5 retains a program (software/firmware) for controlling the memory device 1 and management information (management table) of the storage device/memory device.

The memory device 1 executes writing of data, reading of data and erasing of data based on a command (request from the host device 600) from the memory controller 5.

The memory device 1 includes one or more NAND-type flash memories 1.

The storage device 500 (or the memory system 9) including the flash memory 1 is, for example, a memory card (for example, SD™ card, eMMC™), a USB memory, a solid state drive (SSD), or the like. For example, the host device 600 is a digital camera, a personal computer, a featurephone, a smartphone, or the like. For example, the host bus is a bus based on the SD™ interface.

The NAND-type flash memory 1 is connected to the memory controller 5 via a bus (hereinafter referred to as a NAND bus).

Various signals are transmitted and received between the NAND-type flash memory 1 and the memory controller 5 via the NAND bus. For example, as a control signal based on the NAND interface standard between the flash memory 1 and the memory controller 5, a chip enable signal CEn, a command latch enable signal CLE, an address latch enable signal ALE, a write enable signal WEn, a read enable signal REn, write protect signal WPn, and the like are used.

The signal CEn is a signal for enabling the flash memory 1. Each of the signals CLE and ALE is a signal for notifying that the signals on the I/O lines IO (IO1 to IO8) are command and address signals.

Each of the signal WEn and the signal REn is a signal instructing input and output of a signal via, for example, eight I/O lines IO. The signal WPn is a signal for setting the flash memory 1 in a protected state, for example, when the power is turned on and off.

For example, when the flash memory 1 executes data transfer by the DDR method, a data strobe signal (not shown) and a complementary signal of the data strobe signal are output together with a signal (data) IO from a transmitting side. A data receiving side adjusts the timing of taking in the data upon receipt of the transmitted data strobe signal and its complementary signal.

A ready/busy signal RBn is generated based on the operation status of the flash memory 1 and transmitted to the memory controller 5. The signal RBn is a signal that notifies the memory controller 5 of whether the flash memory 1 is in a ready state (a state to accept a command from the memory controller 5) or a busy state (a state not to accept a command from the memory controller 5). For example, the signal RBn is set to "L" level (busy state) during the operation such as reading of data from the flash memory 1 and is set to "H" level (ready state) when these operations are completed.

Note that the memory system including the memory device of the embodiment may be a memory system that executes data transfer by the DDR method or a memory system that executes data transfer by another method.

Figure 2:
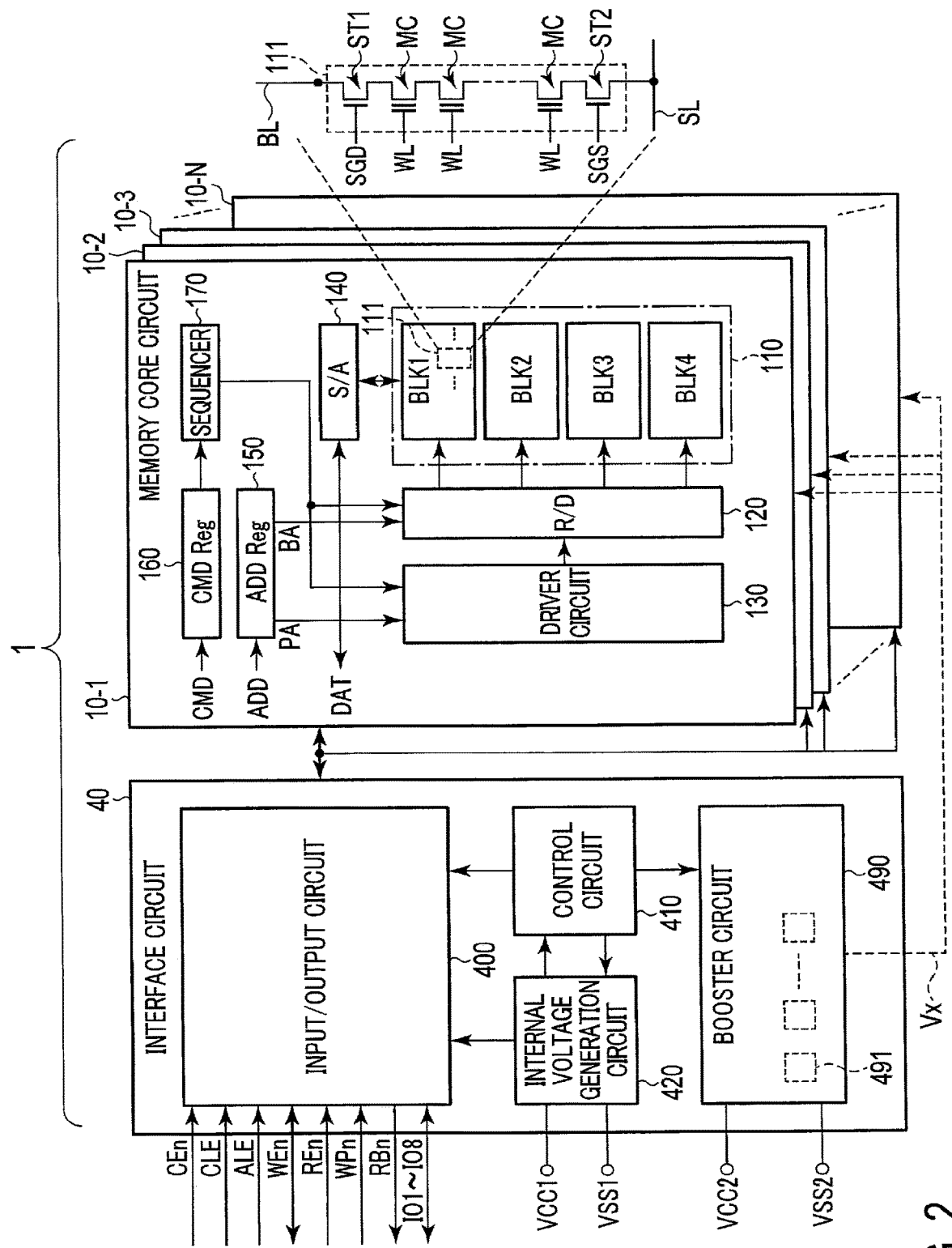
FIG. 2 is a block diagram showing an internal configuration of the memory device.

FIG. 2 is a block diagram for explaining a circuit configuration of the NAND-type flash memory according to the present embodiment.

As shown in FIG. 2, the NAND-type flash memory 1 includes a plurality of memory core circuits 10-1 to 10-N and an interface (I/F) circuit 40.

In the embodiment, in the case where the memory core circuits 10-1 to 10-N are not to be distinguished, codes subsequent to the hyphen are omitted and they are denoted as "memory core circuit 10". The same applies to other constituent elements.

The I/F circuit 40 is provided between the plurality of memory core circuits 10 and the NAND bus. The I/F circuit 40 is connected to the NAND bus. The memory core circuit 10 is connected to the NAND bus via the I/F circuit 40. As a result, the memory core circuit 10 is accessed and controlled by the memory controller 5 via the I/F circuit 40.

The memory core circuit 10 includes at least a memory cell array 110, a row decoder 120, a driver circuit 130, a sense amplifier 140, an address register 150, a command register 160, and a sequencer 170.

The memory cell array 110 stores data from the memory controller 5. The memory cell array 110 includes a plurality of (for example, four) blocks BLK (BLK0 to BLK3).

Each block BLK includes a plurality of NAND strings 111. The NAND string 111 includes a plurality of memory cells MC connected in series and at least two select transistors ST1 and ST2.

The memory cell MC includes a charge storage layer and a control gate electrode. The charge storage layer includes at least one of a floating gate electrode and a film having a trap level (for example, a silicon nitride film).

One of a plurality of word lines WL in the block BLK is connected to a gate of the corresponding memory cell MC of the plurality of memory cells MC connected in series.

One of a plurality of bit lines BL in the block BLK is connected to at least one corresponding NAND string 111 of the plurality of NAND strings 111. In the NAND string 111, one bit line BL is connected to one end of the memory cells MC connected in series via a select transistor ST1.

A source line SL is commonly connected to the NAND strings 111. In the NAND string, the source line SL is connected to the other end of the memory cells MC connected in series via a select transistor ST2.

A select gate line SGD is connected to the gate of the select transistor ST1. A select gate line SGS is connected to the gate of the select transistor ST2.

By controlling the potentials of the word lines WL, the bit line BL and the select gate lines SGD and SGS, an operation based on the command is executed for the memory cell MC.

The row decoder 120 selects one of the blocks BLK0 to BLK3 based on an address ADD from the memory controller 5 and selects the row (the word lines WL and the select gate lines SGD and SGS) in the selected block BLK.

The driver circuit 130 supplies a voltage to the selected block BLK via the row decoder 120.

The sense amplifier 140 senses a potential or a current of the bit line BL in order to determine the data read from the memory cell array 110 at the time of data reading, and performs calculation using the sense result. The sense amplifier 140 outputs data DAT based on the sense result and the operation result to the memory controller 5. The sense amplifier 140 transfers the write data DAT received from the memory controller 5 to the memory cell array 110 at the time of writing data. The sense amplifier 140 can control the potential of the bit line BL.

The address register 150 retains the address ADD received from the memory controller 5. The command register 160 retains a command CMD received from the memory controller 5.

The sequencer 170 controls the overall operation of the memory core circuit 10 based on the command CMD retained in the command register 160.

The internal configuration of the memory cell array 110 may be a structure in which the memory cells MC are two-dimensionally arranged above a semiconductor substrate. The internal configuration of the memory cell array 110 may also be a configuration in which the memory cells MC are stacked three-dimensionally above the semiconductor substrate. The configuration of the memory cell array is described in, for example, U.S. patent application Ser. No. 12/407,403 filed on Mar. 19, 2009 entitled "Three-dimensional Stacked Nonvolatile Semiconductor Memory". This is also described in U.S. patent application Ser. No. 12/406,524 filed on Mar. 18, 2009 entitled "Three-Dimensional Stacked Nonvolatile Semiconductor Memory", U.S. patent application Ser. No. 12/679,991 filed on Mar. 25, 2010 entitled "Nonvolatile Semiconductor Memory Device and Method for Manufacturing the Same", and U.S. patent application Ser. No. 12/532,030 filed on Mar. 23, 2009 entitled "Semiconductor Memory and Method for Manufacturing the Same". These patent applications are incorporated herein by reference in their entirety.

In the NAND-type flash memory 1 of the present embodiment, one I/F circuit 40 is provided for a plurality of memory core circuits 10.

The I/F circuit 40 includes an input/output circuit 400, a control circuit 410, an internal voltage generation circuit 420, a booster circuit 490, and the like.

The input/output circuit 400 inputs signals IO etc. from the memory controller 5 to the flash memory 1 and outputs signals IO etc. from the flash memory 1 to the memory controller 5.

The input/output circuit (I/O circuit) 400 includes a buffer circuit, a driver circuit, a receiver circuit, and the like.

The control circuit 410 controls the operation of each of the circuits 400, 420, and 490 in the I/F circuit 40.

The internal voltage generation circuit 420 generates voltages to be used for operations of the circuits 400 and 410 in the I/F circuit 40 using externally supplied voltages VCC1 and VSS1.

The booster circuit 490 generates voltages to be used for various operations of the flash memory 1 by using voltages VCC2 and VSS2. The booster circuit 490 supplies the generated voltage to the memory core circuit 10.

The booster circuit 490 includes one or more charge pump circuits 491. The charge pump circuit 491 can boost the voltage VCC2. For example, one charge pump circuit 491 is provided for one memory core circuit 10. However, one charge pump circuit 491 may be provided in common to the plurality of memory core circuits 10. A part of the components of the charge pump circuit 491 may be provided in the memory core circuit 10.

The operation of the booster circuit 490 may be controlled by the sequencer 170 or may be controlled by the control circuit 410.

In the present embodiment, the booster circuit 490 for generating a high voltage such as a program voltage in the flash memory is provided in the I/F circuit 40 outside the memory core circuit 10.

The NAND-type flash memory 1 may have a plurality of channels. When the NAND-type flash memory 1 has two channels Ch0 and Ch1, a certain number of memory core circuits are allocated to the channel Ch0, and the remaining number of memory core circuits are allocated to the channel Ch1. In this case, the I/F circuit 40 includes two input/output circuits 400. One of the input/output circuits corresponds to the channel Ch0, and the other of the input/output circuits corresponds to the channel Ch1. A plurality of I/F circuits may be provided so as to correspond to a plurality of channels.

(b) Configuration Example

Figure 3:
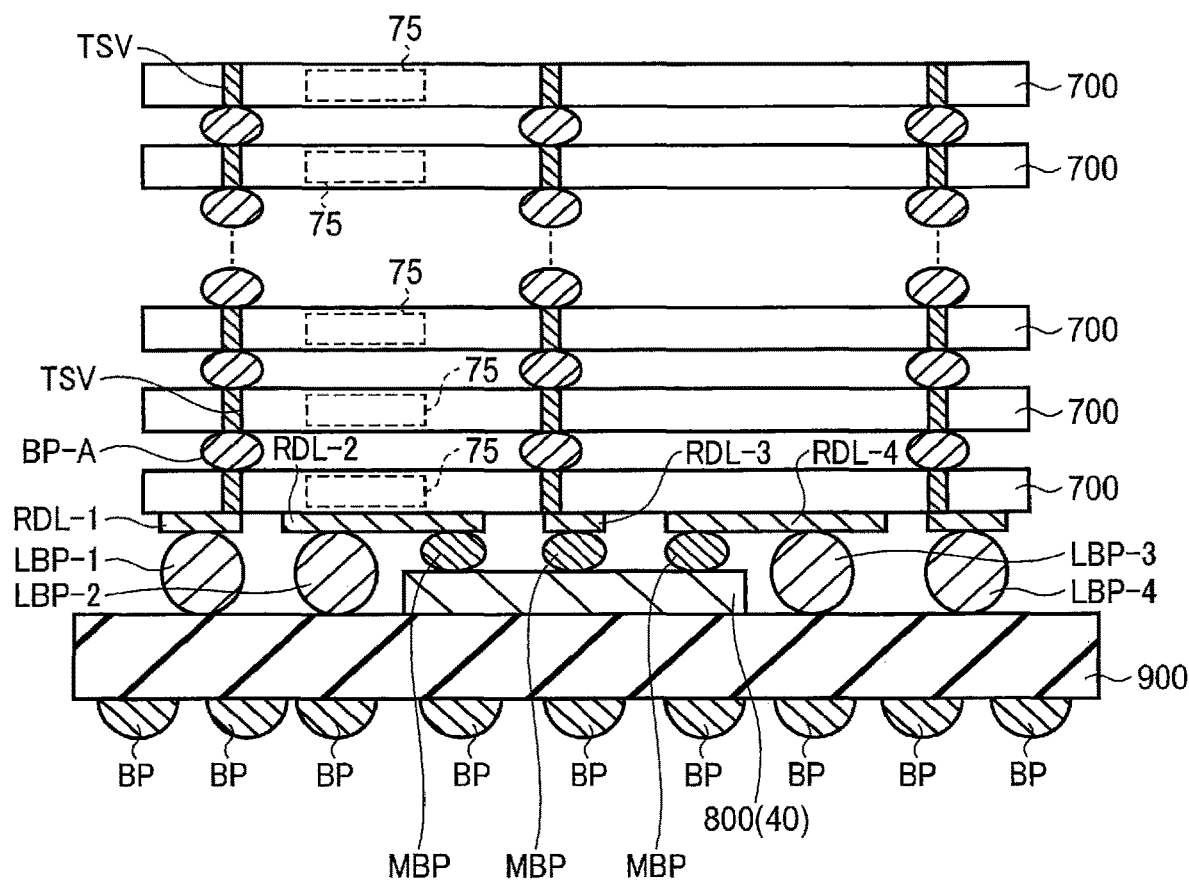
FIG. 3 is a cross-sectional view showing a structural example of a memory device.

With reference to FIG. 3, a structural example of the flash memory of this embodiment will be described.

FIG. 3 is a cross-sectional view for explaining a structural example of a mounted state of the flash memory according to the embodiment. In FIG. 3, for clarity of illustration, main constituent elements are extracted and shown. The flash memory of this embodiment includes various connection terminals (for example, bumps and pads) and various interconnects (for example, internal interconnects and redistribution layers) not shown in FIG. 3.

For example, the flash memory 1 of the present embodiment has a package structure called a Ball Grid Array (BGA).

As shown in FIG. 3, the flash memory 1 of the present embodiment includes a plurality of chips 700 and 800 in a package. In the flash memory 1 including the chips 700 and 800, the I/F circuit 40 is provided in the chip 800 different from the chip 700 including the memory core circuit 10. Hereinafter, the chip 700 of the memory core circuit 10 is called a memory core chip (or core chip) 700, and the chip 800 of the I/F circuit 40 is called an interface chip (I/F chip) 800.

A plurality of memory core chips 700 and an I/F chip 800 are stacked on a substrate 900.

The I/F chip 800 is mounted on a substrate 900.

A plurality of large bumps LBP (LBP-1, LBP-2) are provided on the upper surface of the substrate 900.

A plurality of microbumps MBP are provided on the upper surface of the I/F chip 800.

In order to stack the plurality of memory core chips 700, the large bumps LBP and the microbumps MBP are formed in consideration of the thickness of the I/F chip 800, so that the height of the microbumps MBP from the upper surface of the substrate 900 is the same as the height of the large bumps LBP from the upper surface of the substrate 900.

A plurality of bumps BP are provided on the bottom surface (lower surface) of the substrate 900. The bumps BP and the large bumps LBP are electrically connected via an interconnect (not shown) provided in the substrate 900. The bottom surface of the substrate 900 is a surface opposite to the surface of the substrate 900 on which the I/F chip 800 is provided.

The bumps BP are used for inputting/outputting a signal between a circuit in the chips 700 and 800 above the substrate 900 and another device or for supplying a power supply voltage to the flash memory 1.

The memory core chips 700 are stacked on the large bumps LBP and the microbumps MBP. The plurality of memory core chips 700 are arranged above the I/F chip 800. The I/F chip 800 is provided between the substrate 900 and the memory core chip 700 of the lowermost layer.

Each memory core chip 700 includes a plurality of electrodes TSV and a plurality of pads (not shown) and the like.

The electrode TSV is a through silicon via. The electrode TSV penetrates through the memory core chip 700. The upper portion of the electrode TSV is exposed from the upper surface of the memory core chip 700, and the lower portion of the electrode TSV is exposed from the lower surface of the memory core chip 700. In each memory core chip 700, the electrode TSV electrically connects one memory core chip 700 to another memory core chip 700 in the upper layer and/or the lower layer.

A bump BP-A is provided between the memory core chips 700. The bump BP-A is electrically connected to the electrode TSV (or the pad).

The memory core chips 700 are stacked so that the chips are electrically connected via the electrode TSV and the bump BP-A.

In FIG. 3, only the bump BP and BP-A, the large bumps LBP, and the microbumps MBP are shown. However, in the substrate 900, bumps, large bumps, and microbumps (not shown) for other input/output signals and the like are provided.

For example, the redistribution layers RDL (RDL-1, RDL-2, RDL-3) are provided on the lower surface (the surface on the substrate 900 side) of the memory core chip 700 that is the lowermost layer of the plurality of memory core chips 700. The redistribution layer RDL-1 electrically connects the large bump LBP-1 on the substrate 900 to the electrode TSV via a pad (not shown). As a result, the memory core chip 700 is electrically connected to the substrate 900 via the redistribution layer RDL-1 and the large bump LBP-1.

The redistribution layer RDL-2 electrically connects the large bump LBP-2 on the substrate 900 to the microbump MBP. As a result, the I/F chip 800 is electrically connected to the substrate 900 via the redistribution layer RDL-2 and the large bump LBP-2. The redistribution layer RDL-3 electrically connects the microbump MBP to the electrode TSV. The I/F chip 800 is electrically connected to each memory core chip 700 via the microbump MBP, the redistribution layer RDL, and the electrode TSV.

For example, in the flash memory of the present embodiment, each memory core chip 700 includes a region 75 in which a plurality of electrodes are provided. The electrodes in the region 75 are terminals for supplying a voltage (driving voltage) to the memory core circuit 10 in the memory core chip 700. Hereinafter, the electrode (voltage terminal) in the region 75 is referred to as a voltage electrode.

Configuration Example of Electrode of Memory Core Chip

Figure 4:
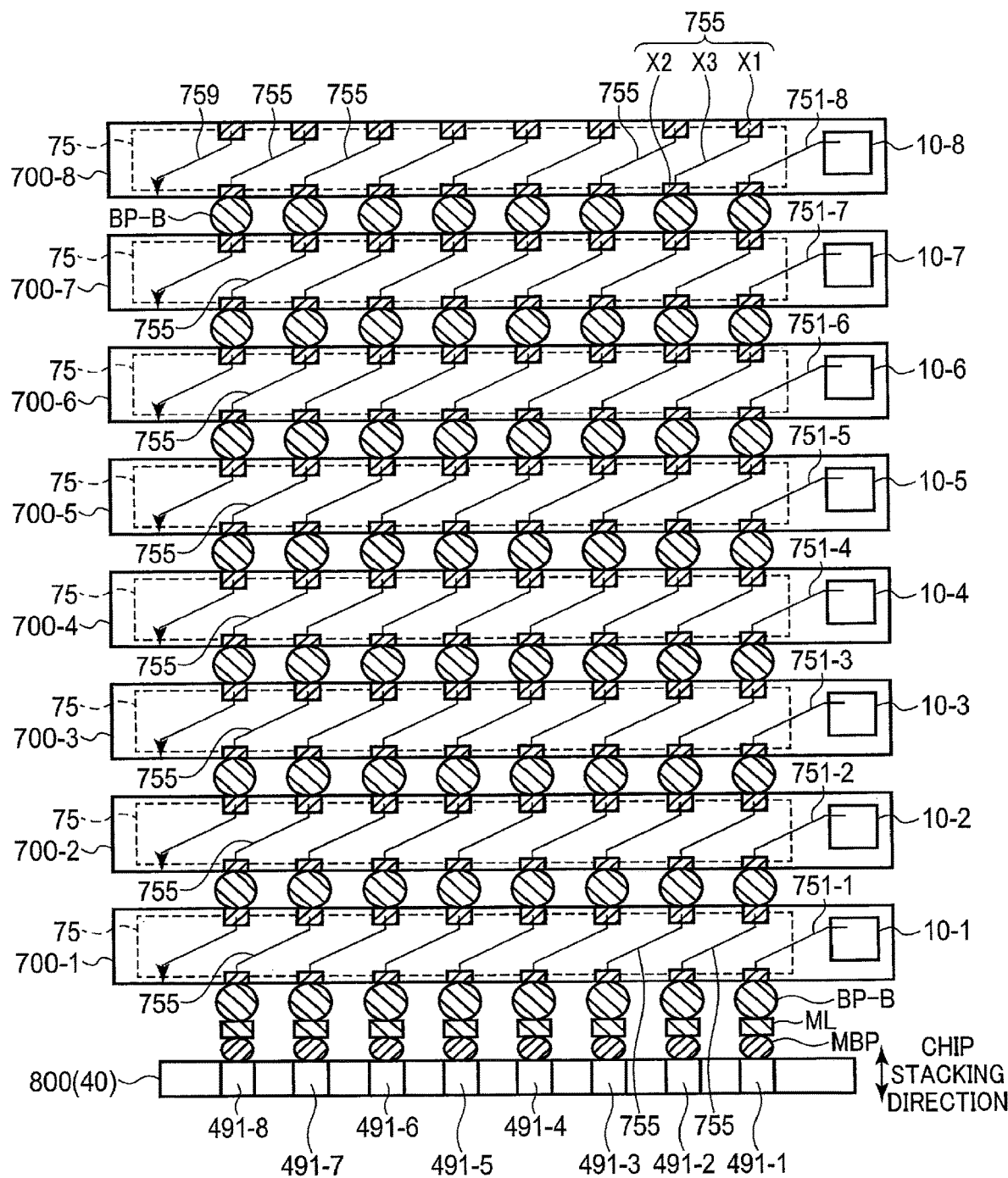
FIG. 4 is a cross-sectional view showing a structural example of a memory device of a first embodiment.

With reference to FIGS. 4 and 5, a configuration example of a voltage electrode of a chip in the flash memory of this embodiment will be described.

FIG. 4 is a schematic cross-sectional view for explaining a configuration example of a voltage electrode in a memory core chip. In FIG. 4, for the sake of clarity, voltage electrodes in the memory core chip are extracted and shown, and the illustration of the other terminals is omitted.

As shown in FIG. 4, eight memory core chips 700 (700-1 to 700-8) are stacked above the I/F chip 800.

The memory core chips 700 have substantially the same configuration with respect to the voltage electrodes 751 and 755.

A plurality of voltage electrodes 751 (751-1 to 751-8) and 755 are provided in the region 75 of the memory core chip 700. In the memory core chip 700, the region 75 including the voltage electrodes 751 and 755 is disposed at one end side of the region where the memory core circuit 10 is provided.

Each of the stacked memory core chips 700 is electrically connected to charge pump circuits 491 (491-1 to 491-8) in the I/F chip 800 via one or more voltage electrodes 751 and 755. As a result, in each memory core chip 700, the voltage generated by the charge pump circuits 491 is supplied to the memory core circuit (internal circuit) 10 of the memory core chip 700.

Of the plurality of voltage electrodes 751 and 755 in the memory core chip 700, the voltage electrode 751 is adjacent to the memory core circuit 10 in a direction parallel to the upper surface (or lower surface) of the chip 700. In the memory core chip 700, the voltage electrode 751 is electrically connected to the memory core circuit 10.

One end of the voltage electrode 751 is connected to a voltage supply terminal (a terminal to which an output of the charge pump circuit is supplied) of the memory core circuit 10. The other end of the voltage electrode 751 is exposed on the lower surface side of the memory core chip 700.

Of the plurality of electrodes 751 and 755, the plurality of voltage electrodes 755 are arranged in a region between the voltage electrode 751 and an end portion (side surface) of the memory core chip 700. In one memory core chip 700, the voltage electrode 751 is provided between the voltage electrode 755 and the memory core circuit 10. Therefore, in a direction parallel to the upper surface of the chip 700, the voltage electrode 755 is not adjacent to the memory core circuit 10. In one memory core chip 700, the voltage electrode 755 is not connected to the memory core circuit 10 in the same chip as the voltage electrode 755. Within one chip 700, the voltage electrode 755 is electrically isolated from the voltage electrode 751.

The voltage electrode 755 is an electrode for connecting the memory core circuit 10 in the chip above the certain memory core chip 700 to the charge pump circuit 491 of the I/F chip 800.

The voltage electrode 755 has an upper terminal X1, a lower terminal X2, and an internal connection portion X3.

The upper terminal X1 is provided on the upper surface side of the memory core chip 700. On the upper surface side of the memory core chip 700, a bump is provided on the upper terminal X1. The upper terminal X1 electrically connects one memory core chip 700 to another chip 700 of an upper layer. The upper terminal X1 may include at least one of a part of a through silicon via and a pad.

The lower terminal X2 is provided on the lower surface side of the chip 700. On the lower surface side of the memory core chip 700, a bump BP is provided on the lower terminal X2. The lower terminal X2 electrically connects one memory core chip 700 to another chip 700 of a lower layer. The lower terminal X2 may include at least one of a part of a through silicon via and a pad.

The internal connection portion X3 is provided within the memory core chip 700. The internal connection portion X3 connects the upper terminal X1 and the lower terminal X2 within the memory core chip 700. The internal connection portion X3 includes a contact plug, a via, an interconnect, and the like inside the chip.

With respect to one voltage electrode 755, the position of the upper terminal X1 does not overlap with the position of the lower terminal X2 in a direction perpendicular to the surface of the memory core chip 700 (chip stacking direction). The two terminals X1 and X2 connected by the internal connection portion X3 are arranged obliquely to the direction perpendicular to the surface of the chip. The internal connection portion X3 is drawn obliquely to the direction perpendicular to the surface of the chip from the upper terminal X1 to the lower terminal X2. The internal connection portion X3 may include one or more portions (for example, at least one of a via plug and a contact plug) extending in the direction perpendicular to the surface of the chip and one or more portions (for example, a metal film) extending in a direction parallel to the surface of the chip. The portions included in the internal connection portion X3 may be provided in an interlayer insulating film.

For example, with respect to two adjacent voltage electrodes 755, the position of the upper terminal X1 of one voltage electrode 755 overlaps with the position of the lower terminal X2 of the other voltage electrode 755 in the direction perpendicular to the surface of the memory core chip 700.

The end portion on the lower surface side of the voltage electrode 751 is connected to the charge pump circuit 491 or the upper terminal X1 of the voltage electrode 755. The end portion on the lower surface side of the chip of the voltage electrode 751 overlaps with the upper terminal X1 of the corresponding voltage electrode 755.

The lowermost memory core chip 700-1 is connected to the corresponding charge pump circuit 491-1 in the I/F circuit 40 by the voltage electrode 751-1, the bumps BP-B and MBP, and an intermediate interconnect ML.

In the memory core chips 700-2 to 700-8 above the lowermost memory chip 700-1, the memory core circuit 10 (10-2 to 10-8) is connected to the corresponding charge pump circuit 491 (491-2 to 491-8) via the voltage electrode 755 and the bump BP-B in one or more chips 700 in the lower layers, in addition to the voltage electrode 751 connected to the circuit 10.

The connection path between the memory core circuit 10 and the charge pump circuit 491 extends obliquely to the direction perpendicular to the surface of the chip.

For example, a ground electrode (ground terminal) 759 is provided in the region 75. In each chip, the ground electrode 759 is grounded. As a result, the ground voltage VSS is applied to the ground electrode 759. The ground electrode 759 has a structure similar to the voltage electrode 755, for example.

The number of voltage electrodes 755 provided in one chip varies according to the number of stacked chips. FIG. 4 shows an example in which the region 75 is provided on one end side of the memory core circuit 10. However, the region 75 including the voltage electrodes 751, 755, and 759 may be provided at both ends of the memory core circuit 10, or may be provided so as to surround four sides (or three sides) of the memory core circuit 10.

FIG. 5 is a diagram schematically showing the connection path (voltage path) between the memory core circuit and the charge pump circuit in the flash memory of this embodiment.

FIG. 5 shows an example in which eight memory core chips are stacked, as in the example shown in FIG. 4.

In the lowermost memory chip 700-1, the memory core circuit 10-1 is connected to the charge pump circuit 491-1 by the voltage electrode 751-1 (and bumps etc.) without passing through the voltage electrode 755.

For example, in the fifth memory core chip 700-5 counting from the I/F chip 800 side, the memory core circuit 10-5 is connected to the voltage electrode 751-5 in the chip 700-5. The voltage electrode 751-5 is connected to the charge pump circuit 491-5 corresponding to the memory core circuit 10-5 via the voltage electrode 755 in the first to fourth memory core chips 700-1 to 700-4.

Thus, five voltage electrodes 751-5 and 755 are provided in the connection path (broken line in FIG. 5) between the memory core circuit 10-5 in the memory core chip 700-5 and the charge pump circuit 491-5.

The memory core circuit 10-8, in the eighth memory core chip (uppermost layer memory core chip) 700-8 counting from the I/F chip 800 side, is connected to the charge pump circuit 491-8 corresponding to the memory core circuit 10-8 through the voltage electrode 751-8 in the chip 700-8 and the voltage electrodes 755 in the first to seventh memory core chips 700-1 to 700-7.

Thus, eight voltage electrodes 751 and 755 are provided in the connection path (thick solid line in FIG. 5) between the memory core circuit 10-8 in the memory core chip 700-8 and the charge pump circuit 491-8.

The memory core chips 700-2 to 700-8, other than the lowest chip 700-1, are different only in number of electrodes existing on the connection path between the memory core circuit 10 and the charge pump circuit 491 and have substantially the same layout, and the memory core circuit 10 and the charge pump circuit 491 which correspond to each other are connected.

Of the voltage electrodes 755 of each chip 700, the voltage electrode 755 not connected to the charge pump circuit 491 is grounded via the ground electrode 759 of the chip 700 of the lower layer.

By providing the voltage electrodes 751 and 755 having the structure as described above in the memory core chip, the flash memory of the present embodiment need not have different layouts of the electrodes (terminals) for voltage supply and interconnects in the memory core chips included in the stack of chips.

Therefore, in the flash memory of this embodiment, the layouts of the electrodes (terminals) for voltage supply and interconnects in the plurality of memory core chips can be the same in all the memory core chips in the flash memory.

As a result, the flash memory 1 of the present embodiment can reduce the manufacturing cost of the flash memory (memory core chip).

<Layout of Interface Chip>

With reference to FIG. 6, a layout of each circuit in the I/F chip in the flash memory of this embodiment will be described.

As described above, the connection path for connecting the memory core circuit 10 and the charge pump circuit 491 extends obliquely with respect to the chip stacking direction. Accordingly, in the I/F chip 800, the booster circuit 490 is provided in a region existing on an extended line of a path extending from the memory core circuit 10 to the charge pump circuit 491.

FIG. 6 is a top view showing an example of a layout of circuits in the I/F chip in the flash memory of this embodiment.

As shown in FIG. 6, the I/F chip 800 includes an area provided with the input/output circuit and the like (hereinafter referred to as an interface area) R1 and an area provided with the booster circuit 490 (hereinafter referred to as a boosting area) R2.

The I/F area R1 includes input/output circuits 400-1 and 400-2, the control circuit 410, and the internal voltage generation circuit 420.

In the I/F area R1, connection terminals such as bumps, pads, and electrodes are provided in the contact regions (bump regions and pad regions) 80A, 80B, 89A, and 89B.

The input/output circuits 400-1 and 400-2 are divided and provided into two regions. The region 80A is provided between the two input/output circuits 400-1 and 400-2. Bumps and pads for the input/output circuits 400-1 and 400-2 are provided in the region 80A. In the case where the flash memory has two channels, the input/output circuit 400-1 may be arranged so as to correspond to one channel Ch0 and the input/output circuit 400-2 may be arranged so as to correspond to the other channel Ch1.

The region 80B is provided between the control circuit 410 and the internal voltage generation circuit 420. Bumps and pads for the control circuit 410 and the internal voltage generation circuit 420 are provided in the region 80B.

The bumps and the pads in the regions 80A and 80B are electrically connected to the input/output circuit 400, the control circuit 410, and the internal voltage generation circuit 420 via interconnects in the chip.

Regions 89A and 89B are each provided between the region where the circuits are disposed and an end of the chip 800. Power supply terminals (for example pads or bumps) 891A, 891B, 892A, and 892B are provided in the regions 89A and 89B. The pads 891A and 891B are connected to an interconnect (driving voltage side power supply line) 901 and a terminal 991 to which the power supply voltage VCC1 is supplied. The pads 892A and 892B are connected to an interconnect (ground side power supply line) 902 and the terminal 992 to which the ground voltage VSS1 is supplied.

In the boosting area R2, a plurality of charge pump circuits 491 are provided. Eight charge pump circuits 491-1 to 491-8 are collectively provided in the boosting area R2 in the I/F chip 800.

The charge pump circuits 491 are laid out at a certain position in the boosting area R2 so as to correspond to the stacking order of the memory core chips.

The boosting area R2 includes a contact region 81 in which bumps, pads and the like are arranged. In this region 81, bumps and pads for the booster circuit 490 and the charge pump circuit 491 are provided. The bump and the pad are electrically connected to the booster circuit 490 and the charge pump circuit 491 via the interconnects in the chip.

In area R2, for example, pads 895A, 895B, 896A, and 896B for supplying various voltages to the booster circuit are provided. The pads 895A and 895B are connected to an interconnect (driving voltage side power supply line) 905 and the terminal 995 to which the power supply voltage VCC2 is supplied.

The pads 896A and 896B are connected to the interconnect (ground side power supply line) 906 and the terminal 996 to which the ground voltage VSS2 is supplied.

Interconnects (power supply systems for driving voltage or ground) 901 and 902 for the power supply voltage and terminals 991 and 992 for the I/F area R1 differ from interconnects 905 and 906 for the power supply voltage and terminals 995 and 996 for the boosting area R2. The power supply to the circuits 400, 410, and 420 in the I/F area R1 is electrically isolated from the power supply of the circuits 490 and 491 in the boosting area R2. As a result, it is possible to suppress the noise caused by the operation of the booster circuit 490 and the charge pump circuit 491 from being applied to the circuits 400, 410, and 420 in the I/F area R1.

A separation area R3 is provided between the boosting area R2 and the I/F area R1. For example, an insulating film is provided in the separation area R3. The I/F area R1 is electrically isolated from the boosting area R2 by the separation area R3. As a result, it is possible to suppress propagation of noise caused by the boosting area R2 to the I/F area R1.

As a result, the flash memory of the present embodiment can realize high-speed data transfer under an operating environment where the influence of noise on the input/output circuit is low.

In order to connect the booster circuit 490 and the memory core circuit 10, the pad PD is provided in the upper surface (redistribution layer) of the I/F chip 800 so as to overlap with the boosting area R2 in the direction perpendicular to the surface of the chip.

The pad PD is arranged in a region above (or below) the charge pump circuit 491 corresponding to the upper-layer memory core chips (for example, the fifth to eighth memory core chips) in the boosting area R2. The arrangement region of the pad PD has a certain distance from the charge pump circuit 491 corresponding to the memory core chip on the lower layer side.

In such a positional relationship between the pad PD and the charge pump circuit, the distance between the charge pump circuit 491 corresponding to the memory core chip on the upper layer side and the pad is smaller than the distance between the charge pump circuit 491 corresponding to the memory core chip on the lower layer side and the pad. In this case, the length of the interconnect (at least one of the internal interconnect and the redistribution layer) for connecting the charge pump circuit 491 corresponding to the memory core chip on the upper layer side and the pad can be smaller than the length of the interconnect for connecting the charge pump circuit 491 corresponding to the memory core chip on the lower layer side and the pad.

As described above, in the flash memory 1 of the present embodiment, with respect to the interconnect resistance caused by the number of voltage electrodes (voltage terminals) 755 connecting the memory core circuit 10 and the charge pump circuit 491, even if the interconnect resistance caused by the plurality of voltage electrodes in the memory core chips 700-5 to 700-8 on the upper layer side is larger than the interconnect resistance caused by the plurality of voltage electrodes in the memory core chips 700-1 to 700-4 on the lower layer side, the difference between the interconnect resistance across the memory core chips 700-5 to 700-8 and the charge pump circuit 491 on the upper layer side and the interconnect resistance across the memory core chips 700-1 to 700-4 and the charge pump circuit 491 on the lower layer side can be reduced by adjusting the length of the interconnect between the charge pump circuit 491 and the pad PD in the I/F chip 800.

Thus, in the flash memory of this embodiment, the interconnect resistance between the memory core circuit 10 and the charge pump circuit 491 can be averaged in a plurality of memory core chips.

As a result, in the flash memory of this embodiment, it is possible to suppress variations in the output resistance of the voltage supplied from the charge pump circuit to the memory core chip for each chip.

In order to simplify the redistribution layer on the chip and the routing (layout) of the interconnect on the I/F chip, it is desirable that the arrangement of the pads PD have a sequential order according to the stacking order (chip number) of the memory core chips.

The I/F area R1 and the boosting area R2 may be provided on different semiconductor chips (semiconductor substrates). In this case, the semiconductor chip including the circuits in the I/F area R1 and the semiconductor chip including the circuits in the boosting area R2 are mounted on one substrate, and the I/F chip is provided as one package including two chips.

(C) Conclusion

The flash memory of the present embodiment includes the memory core chips that are stacked, and the interface chip that includes the booster circuit. The plurality of memory core chips are connected to the corresponding charge pump circuits in the booster circuit via voltage terminals (voltage electrodes) in the memory core chip.

In the flash memory of the present embodiment, the memory core chip 700 includes the voltage terminal 751 connected to the internal circuit (memory core circuit) 10 in the chip and the voltage terminal 755 not connected to the internal circuit 10.

The voltage terminal 755 connects the voltage terminals 751 and 755 of the upper-layer memory core chip to the voltage terminal 755 of the lower-layer memory core chip.

The upper terminal X1 of the voltage terminal 755 is aligned with the lower terminal X2 of the voltage terminal 755 in an oblique direction with respect to the chip stacking direction.

With this configuration, in the flash memory 1 of the present embodiment, the structure of the voltage terminals 751 and 755 and the structure of the interconnect connected to the voltage terminals 751 and 755 in one memory core chip 700 need not be different from those of another memory core chip 700 according to the stacking order of the chips.

In the flash memory 1 of the present embodiment, the stacked memory core chips can be the same in structure.

Therefore, the flash memory 1 of the present embodiment can reduce the chip cost of the memory core chip.

In the present embodiment, in the interface chip 800, the region (boosting area) R2 where the booster circuit 490 is provided is electrically isolated from the region (interface area) R1 where the input/output circuit 400 of the interface chip 800 is provided. In the region R2, all of the plurality of charge pump circuits 491 corresponding to the respective memory core chips 700 are provided.

In the present embodiment, the power supply systems 901, 902, 991, and 992 for the input/output circuit 400 are electrically isolated from the power supply systems 905, 906, 995, and 996 for the booster circuit 490.

Thus, in the flash memory 1 of the present embodiment, it is possible to prevent the noise caused by the booster circuit 490 from being applied to the input/output circuit 400.

As a result, the flash memory of this embodiment can realize high-speed data transfer.

As described above, the manufacturing cost of the memory device of this embodiment can be reduced.

Furthermore, the memory device of this embodiment can improve operation characteristics.

(2) Second Embodiment

The memory device of the second embodiment will be described with reference to FIGS. 7 and 8.

Figure 7:
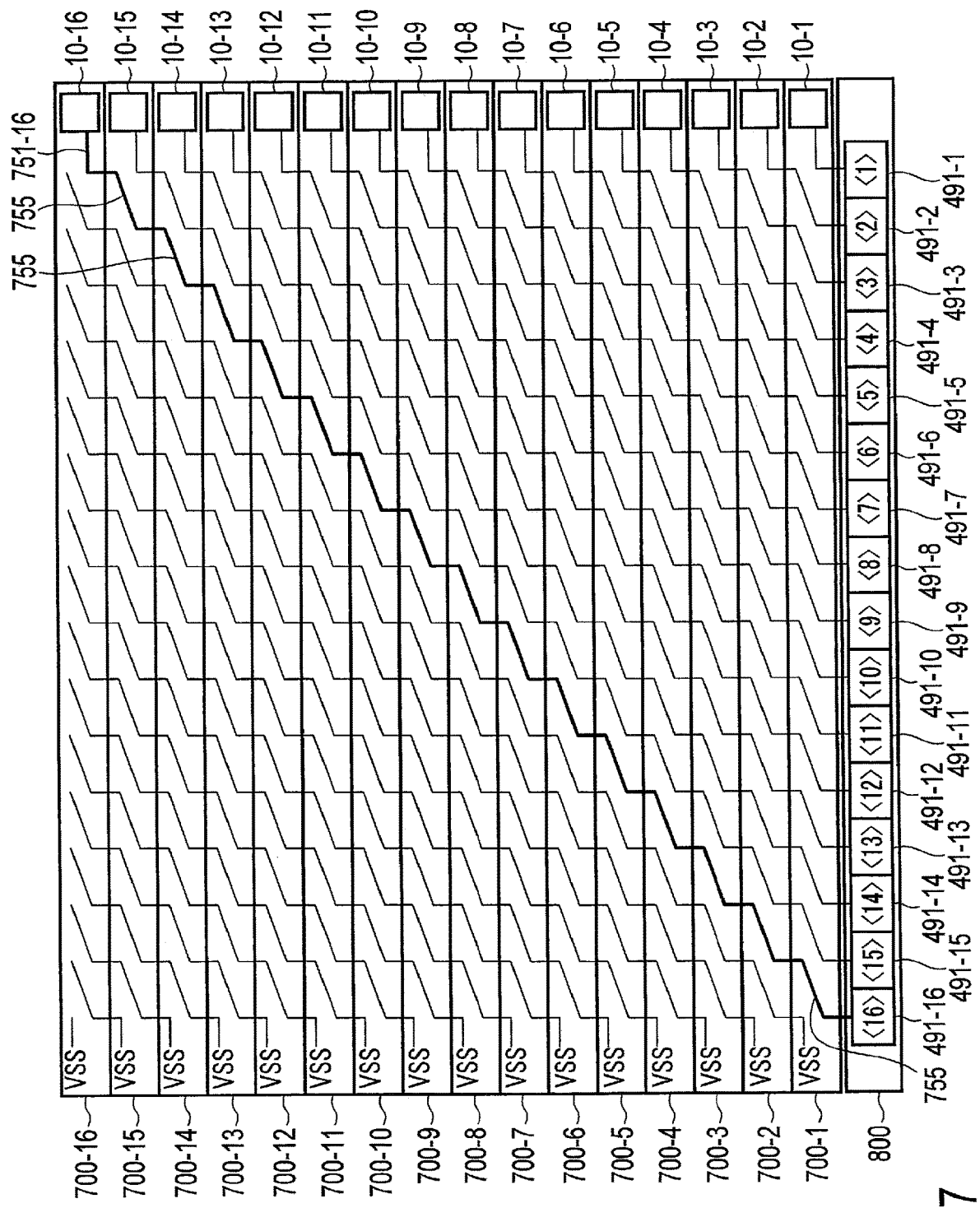
FIG. 7 is a schematic diagram showing a structural example of the memory device of a second embodiment.

FIG. 7 is a diagram schematically showing a connection path (voltage path) between a memory core circuit and a charge pump circuit in a flash memory of this embodiment.

The number of memory core chips included in the NAND-type flash memory is not limited.

As shown in FIG. 7, the NAND-type flash memory 1 of the present embodiment includes, for example, sixteen memory core chips 700-1 to 700-16. The sixteen memory core chips 700 are stacked above the I/F chip 800.

In the flash memory of this embodiment, the internal structure of the memory core chip 700 is substantially the same as the structure shown in FIGS. 2 to 4.

In each of the memory core chips 700, the voltage electrode 751 adjacent to the memory core circuit 10 (10-1 to 10-16) among the plurality of voltage terminals 751 and 755 in the region 75 is connected to the memory core circuit 10 in the same manner as in the first embodiment. The voltage electrode 755 is used to connect the chip 700 in the upper layer and the chip 700 in the lower layer. As in the present embodiment, the number of voltage electrodes 755 increases according to the number of stacked memory core chips as the number of stacked memory core chips increases.

For the sixteen memory core chips 700, one I/F chip 800 is provided in the NAND-type flash memory 1. The I/F chip 800 includes sixteen charge pump circuits 491-1 to 491-16 so as to correspond to the number of stacked memory core chips.

For example, in the sixteenth memory core chip, the memory core circuit 10-16 is connected to the charge pump circuit 491-16 using sixteen voltage electrodes 751-16 and 755. The connection path (thick line in FIG. 7) between the memory core circuit 10-16 and the charge pump circuit 491-16 has a tendency to extend in an oblique direction with respect to the chip stacking direction.

As described above, in the flash memory of the present embodiment, even when the number of memory core chips to be stacked increases, the memory core circuit 10 and the charge pump circuit 491 can be connected without a large change in the layout of the interconnects and terminals in the chips 700.

Figure 8:
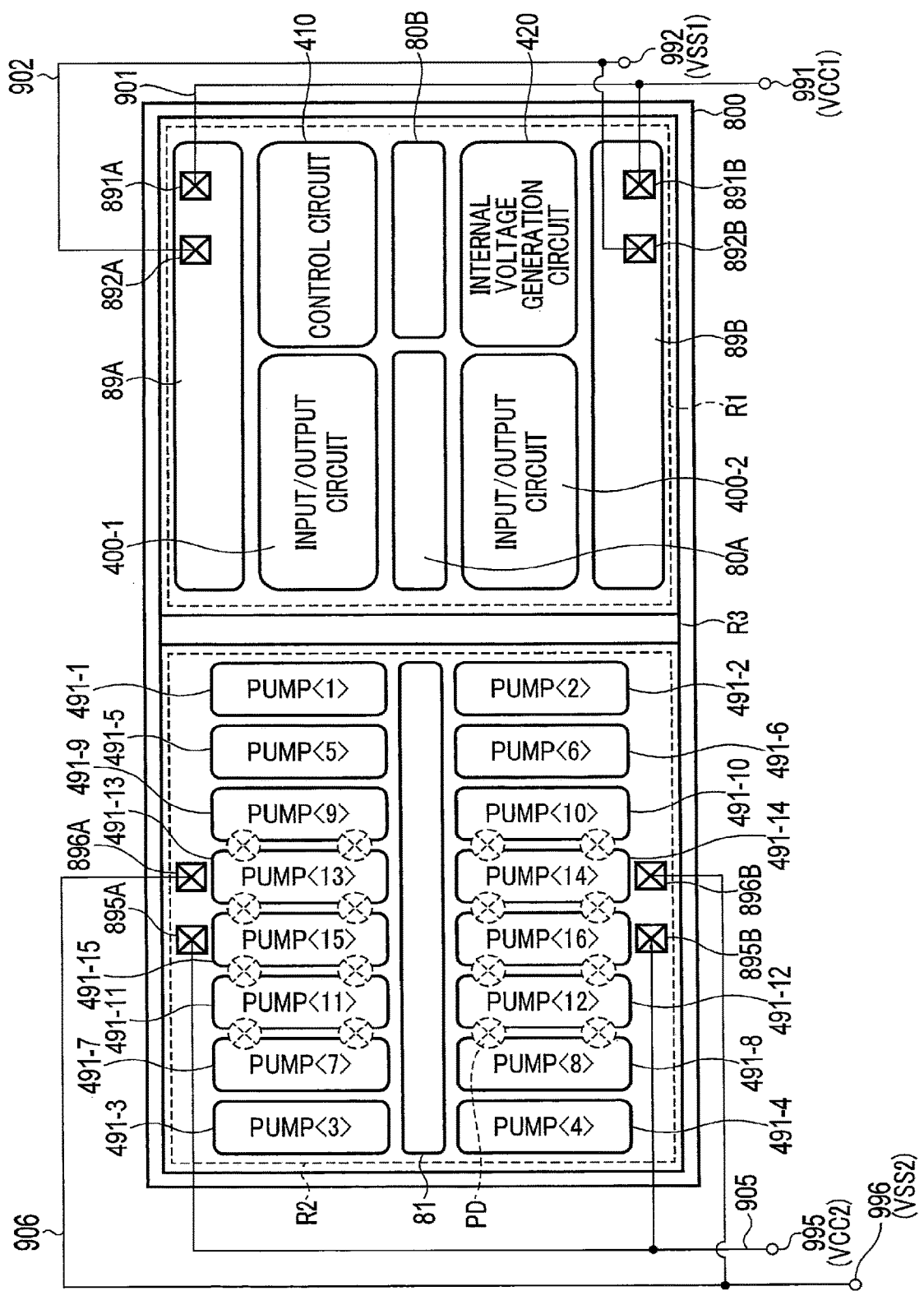
FIG. 8 is a top view showing a structural example of the memory device of the second embodiment.

FIG. 8 is a top view showing an example of a layout of a plurality of circuits in the I/F chip of the flash memory of this embodiment.

As shown in FIG. 8, the sixteen charge pump circuits 491-1 to 491-16 are collectively provided in the boosting area R2 in the I/F chip 800.

Of the plurality of stacked memory core chips, the charge pump circuits 491-9 to 491-16 corresponding to the memory core chips 700-9 to 700-16 on the upper layer side (the side opposite to the I/F chip side) are provided on a central portion of the boosting area R2. The charge pump circuits 491-1 to 491-8 corresponding to the memory core chips 700-1 to 700-8 on the lower layer side (I/F chip side) of the plurality of stacked memory core chips are arranged separately on one end side and the other end side of the boosting area R2 in the direction in which the two regions R1 and R2 are arranged.

The voltage electrodes 755 and the bump BP-B are arranged in a region above (or below) the charge pump circuit 491 corresponding to the upper-layer memory core chips (for example, the twelfth to sixteenth memory core chips). The arrangement region of the pad PD (bump BP-B)

has a certain distance from the charge pump circuit 491 corresponding to the memory core chips 700-1 to 700-8 on the lower layer side.

The distance between the pad PD and the charge pump circuits 491-9 to 491-16 corresponding to the memory core chips 700-9 to 700-16 on the upper layer side is smaller than the distance between the bump BP-B and the charge pump circuits 491-1 to 491-8 corresponding to the memory core chips 700-1 to 700-8 on the lower layer side. As a result, in the flash memory of this embodiment, the interconnect length (the length of the voltage path) for connecting each memory core circuit 10 and the charge pump circuit 491 can be averaged.

Thus, the interconnect resistance between the memory core circuit 10 and the charge pump circuit 491 can be substantially the same in the memory core chips 700 in the flash memory of the present embodiment.

Therefore, in the flash memory of this embodiment, it is possible to suppress variations in the output resistance of the voltage supplied from the charge pump circuit to the memory core chip for each chip.

As the number of stacked memory core chips increases, the difference between the interconnect resistance across the circuits in the memory core chips on the upper layer side and the charge pump circuit and the interconnect resistance across the circuits in the memory core chips on the lower layer side and the charge pump circuit tends to be large.

The effect of averaging the interconnect resistance by contriving the layout of the voltage supply terminals 755, PD, BP-B for the memory core chip in the interface chip 800 and the charge pump circuit 491 as in the present embodiment is more remarkable.

As in the first embodiment, the boosting area R2 is electrically isolated from the I/F area R1 by the separation area R3. Furthermore, the power supply system (interconnect and pad) for the charge pump circuit 491 is electrically isolated from the power supply system for each circuit 400, 410, and 420 in the I/F area R1. As a result, the noise during operation of the charge pump circuit 491 for the input/output circuit 400 can be reduced.

As described above, in the memory device and the memory system of the second embodiment, even if the number of stacked memory core chips increases, the same effect as that of the first embodiment can be obtained.

(3) Third Embodiment

A memory device according to the third embodiment will be described with reference to FIGS. 9 to 11.

(a) Configuration Example

Figure 9:
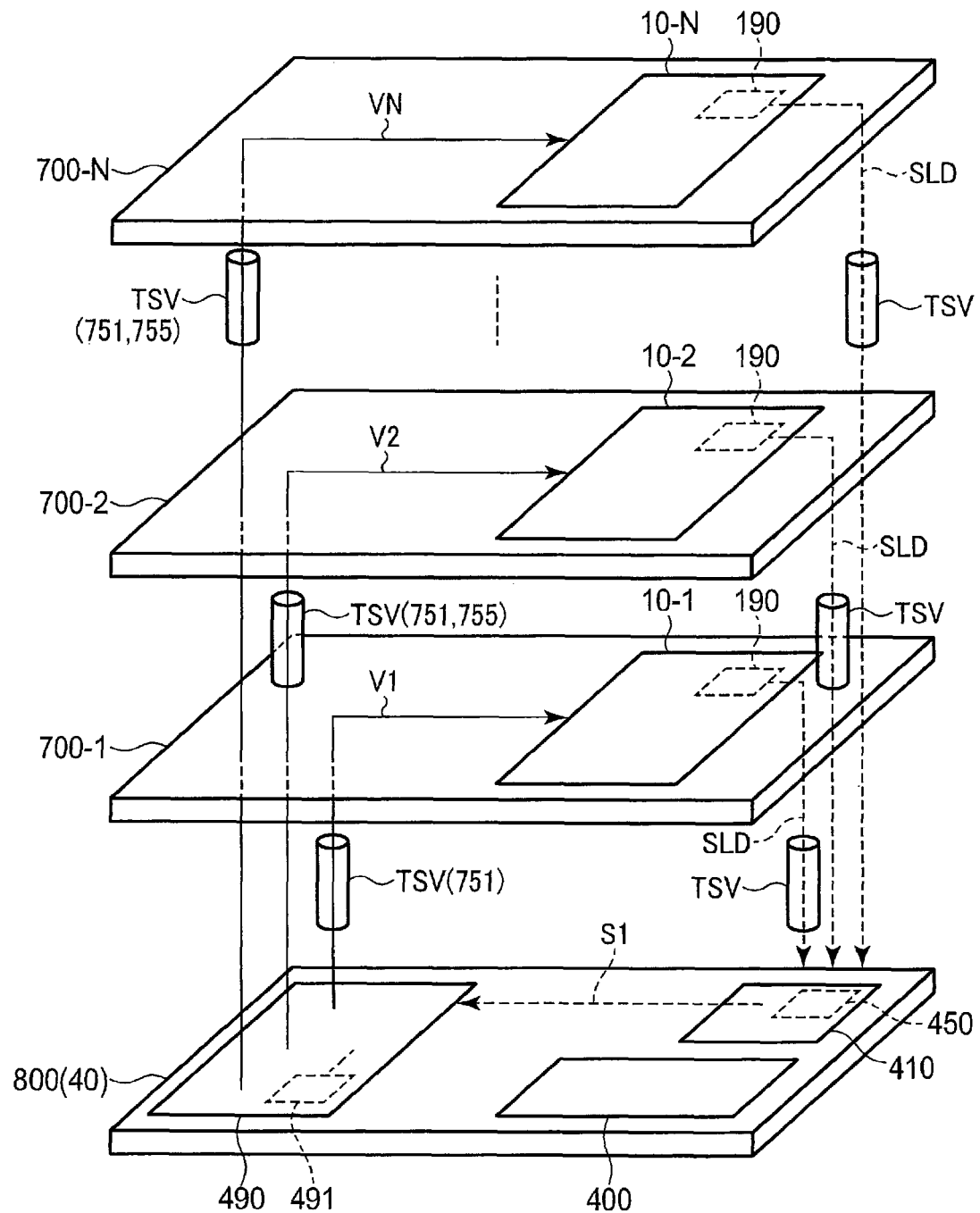
FIG. 9 is a schematic diagram for explaining a memory device of a third embodiment.

FIG. 9 is a diagram schematically showing a configuration example of a flash memory of this embodiment.

As in the above embodiment, the NAND-type flash memory 1 includes a plurality of memory core chips 700-1, 700-2, ..., and 700-N.

Voltages V1, V2, ..., and VN for operation of the respective memory core circuits 10 are supplied from a booster circuit (charge pump circuit) 490 in an I/F chip 800 to the respective memory core chips 700 via the electrodes TSV (755).

In the flash memory 1 of the present embodiment, when the voltages V1, V2, ..., and VN are supplied, each of the memory core circuits (memory core chips) 10-1, 10-2, ..., 10-N transmits a signal SDL, indicating that the voltage is being supplied, to the interface circuit 40. Generation of a load in the memory core circuit 10 (or application of a load from the charge pump circuit 491 to the memory core circuit 10) is equivalently notified to the interface circuit 40 by the signal SLD.

For example, the memory core circuit 10 has a circuit 190 for generating and transmitting the signal SLD. Hereinafter, the signal SLD is also referred to as a load generation signal SLD. In the following description, the circuit 190 is also referred to as a load generation detection circuit 190.

Based on the signal SLD, the interface circuit 40 counts the number of the memory core circuits 10 that are in a state in which a load is generated (a state in which the voltages V1, V2, VN are supplied). Based on the count result, the interface circuit 40 controls the number of the memory core circuits 10 to which the voltage from the charge pump circuit 491 should be supplied.

For example, in the interface circuit 40, the control circuit 410 includes a counter 450. The counter 450 detects a signal level of the signal SLD from the circuit 190 of each memory core circuit 10 and counts the number of the memory core circuits 10 to which the voltage is supplied. The counter 450 outputs a count signal SCT. The counter 450 changes the signal level of the signal SCT based on the count result.

The number of the memory core circuits (memory core chips) 10 to which the voltage is supplied may be detected based on one or more of the number of the charge pump circuits in operation, the number of commands supplied from the memory controller 5, monitoring of the potential of the voltage supply electrode TSV, monitoring the voltage of the word line WL of the memory core circuit 10, monitoring the current of the source line SL, the state of the command register, and the state of the signal level of the ready/busy signal RBn.

The flash memory of the present embodiment controls the number of memory core chips, to which a voltage is to be supplied, according to the operation status of the plurality of memory core chips 700.

For example, in the present embodiment, when the number of the memory core circuits 10 to which the voltages V1, V2, VN are supplied reaches a value set based on the allowable value of the load in the flash memory 1, the control circuit 410 controls the operation of the charge pump circuit 491 to delay the supply of the voltage to another memory core circuit 10 to which the voltage should be supplied, until the number of the memory core circuits 10 to which the voltages V1, V2, VN are supplied becomes smaller than the set value.

Thus, the flash memory of the present embodiment can control the magnitude of the load generated in the memory.

(b) Operation Example

The operation of the flash memory of this embodiment will be described in more detail with reference to FIG. 10.

Figure 10:
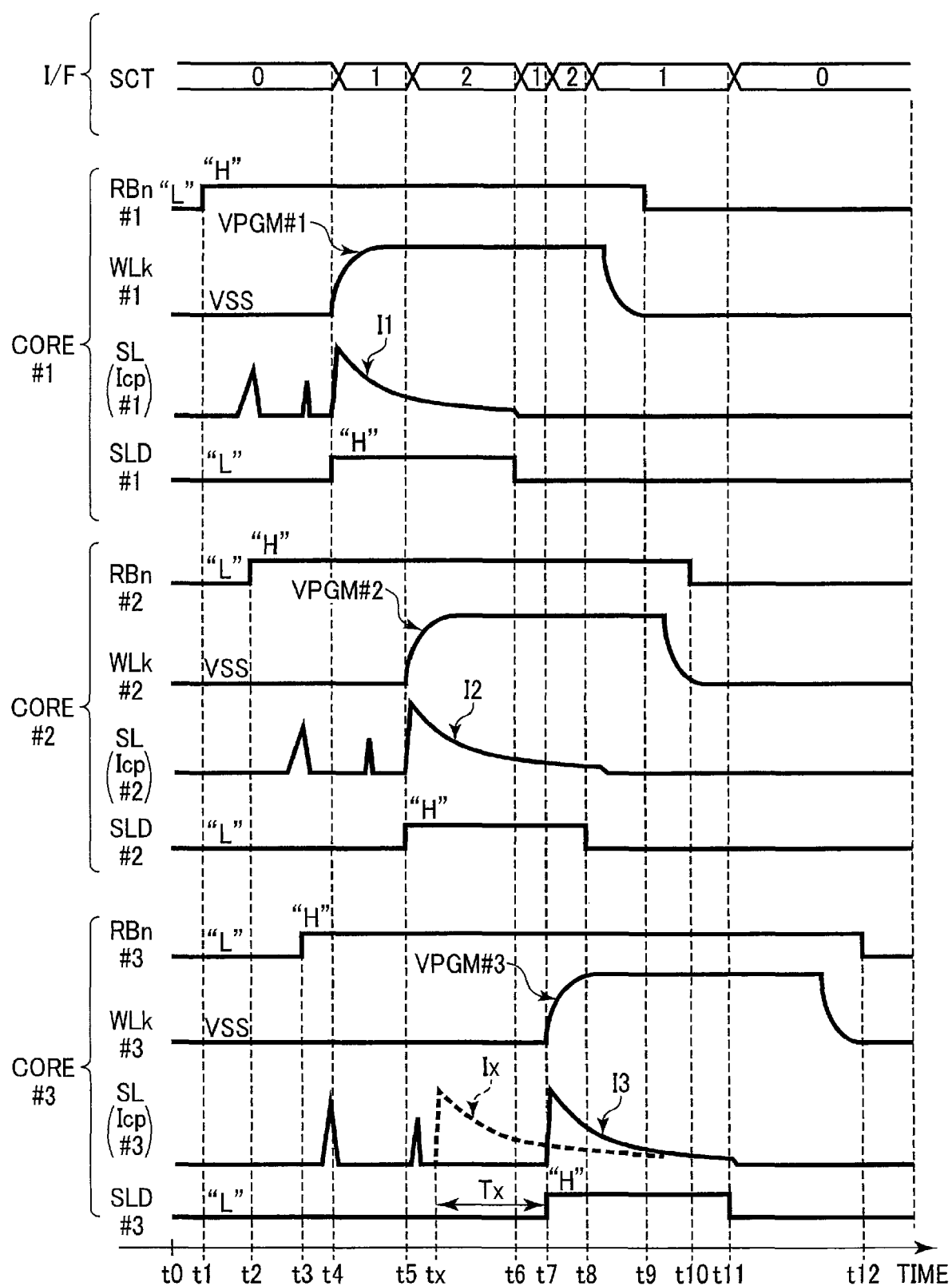
FIG. 10 is a timing chart showing an operation example of the memory device of the third embodiment.

FIG. 10 is a timing chart for explaining an operation example of the flash memory of the present embodiment. FIG. 10 shows various signals and voltage/current of interconnects (for example, a word line) in the I/F circuit (I/F chip) and the three memory core circuits (memory core chips).

In FIG. 10, the count signal SCT of the I/F circuit I/F (40) is shown. The count signal SCT indicates the number of memory core circuits to which the voltage is supplied.

FIG. 10 shows a change, with respect to time, of a ready/busy signal RBn, a potential of a selected word line WLk (WLk #1, WLk #2, WLk #3), a current (consumption current) Icp (Icp #1, Icp #2, Icp #3) generated in the source line SL (SL #1, SL #2, SL #3) in the memory core circuit, and a load generation signal SLD (SLD #1, SLD #2, SLD #3), in each of the first to third memory core circuits CORE #1, CORE #2, and CORE #3 (10).

In the present embodiment, the number of memory core circuits (chips) allowed to simultaneously generate a load is set to "2". Therefore, when the value of the count signal SCT is set to a value corresponding to "2", the supply of the voltage from the charge pump circuit to the memory core circuit is stopped.

As shown in FIG. 10, at the time t0 before the supply of the command, the counter 450 of the I/F circuit I/F sets the count signal SCT to a signal level indicating that the number of the memory core circuits CORE #1 to CORE #3 in which a load is being generated is "0".

For example, commands and addresses (and data) for each of the three memory core circuits CORE #1 to CORE #3 are continuously supplied to the flash memory 1.

The memory core circuit CORE #1 is selected based on the command and the address.

The memory core circuit CORE #1 receives the command, address and data via the I/F circuit I/F. The memory core circuit CORE #1 sets the ready/busy signal RBn #1 to "H" level at time t1. The memory core circuit CORE #1 starts control of each circuit in order to execute the operation indicated in the command. For example, in the interface circuit I/F, the charge pump circuit 491 corresponding to the memory core circuit CORE #1 generates a voltage for operation based on a command (for example, a write command) By the command and the address, the second memory core circuit CORE #2 is selected. At time t2, the memory core circuit CORE #2 sets the signal level of the ready/busy signal RBn to "H" level.

In parallel with the operation of the first memory core circuit CORE #1, the second memory core circuit CORE #2 starts control of each circuit based on the command supplied from the I/F circuit I/F.

At time t3, the memory core circuit CORE #3 supplied with the command sets the signal level of the ready/busy signal RBn to "H" level, similarly to the first and second memory core circuits CORE #1 and CORE #2. The memory core circuit CORE #3 starts control of each circuit.

At time t4, the memory core circuit CORE #1 applies a voltage (in this case, program voltage) VPGM #1 from the charge pump circuit 491 to the word line WLk #1 corresponding to the operation target address. By applying the program voltage VPGM #1, a program operation for the memory cell is executed. As a result, the threshold voltage of the memory cell MC connected to the word line WLk #1 is shifted toward the value corresponding to the data to be written according to the magnitude of the applied program voltage VPGM #1.

As the voltage is applied to the word line WL #1, a consumption current I1 is generated in the source line SL #1 of the memory core circuit CORE #1, and the current value of the current Icp #1 rises.

In the memory core circuit CORE #1, the circuit 190 detects the application of voltage (generation of a load) and changes the signal level of the signal SLD #1 from the "L (Low)" level to the "H (high)" level. In the present embodiment, the occurrence of the load in the chip is detected in association with at least one of the application of a voltage to the word line WL, the generation of a consumption current equal to or higher than a certain current value, and the supply of a voltage from the charge pump circuit 491.

The signal SLD #1 of "H" level is supplied to the I/F circuit I/F via the electrode TSV. In the I/F circuit I/F, the counter 450 changes the count signal SCT from the signal level corresponding to "0" to the signal level corresponding to "1" by supplying the signal SLD #1 of "H" level. At time t4, the signals SLD #2 and SLD #3 of the second and third memory core circuits CORE #2 and CORE #3 are set to the signal level of "L" level.

The charge pump circuit 491 corresponding to the second memory core circuit CORE #2 generates a voltage (for example, a program voltage) for the operation of the memory core circuit CORE #2.

At time t5, the generated voltage VPGM #2 is applied to the selected word line WLk #2 in the memory core circuit CORE #2. In accordance with the application of the voltage to the selected word line WLk #2, the current I2 is generated in the source line SL #2 in the memory core circuit CORE #2, and the current value of the current Icp #2 rises.

As the program voltage VPGM #2 is applied, the memory core circuit CORE #2 sets the load generation signal SLD to the "H" level. As a result, the memory core circuit CORE #2 notifies the I/F circuit I/F that a load is generated in the memory core circuit CORE #2.

At time t5, the I/F circuit I/F detects the signal SLD #2 at "H" level in the memory core circuit CORE #2. The counter 450 sets the signal level of the count signal SCT to a level indicating that the number of memory core circuits, in which a load is being generated, is "2" by means of the two "H" level signals SLD #1 and SLD #2.

While the load is being generated in the first and second memory core circuits CORE #1 and CORE #2, the third memory core circuit CORE #3 is in a state in which the program voltage can be applied.

When the count signal SCT indicates "2", the interface circuit 40 determines that the amount of the load generated in the flash memory 1 has reached the allowable range (the number of the charge pump circuits 491 that can operate simultaneously).

In the flash memory of the present embodiment, the I/F circuit I/F controls the operations of the booster circuit 490 and the charge pump circuit 491 so as to temporarily stop the supply of the voltage to the third memory core circuit CORE #3 in the charge pump circuit 491 corresponding to the memory core circuit CORE #3, based on the state of the count signal SCT.

For example, the booster circuit 490 controls on/off of a switch (for example, a field effect transistor) between the charge pump circuit 491 and the memory core circuit CORE #3 based on the control signal S1 from the control circuit 410, and electrically isolates the memory core circuit CORE #3 from the charge pump circuit 491.

At time t6, the load (for example, current consumption) in the memory core circuit CORE #1 decreases. The circuit 190 detects a decrease in load. As a result, the memory core circuit CORE #1 lowers the signal level of the load generation signal SLD #1 from "H" level to "L" level. For example, in the case where the boosting by the charge pump circuit is completed, or in the case where a part of the constituent elements of the charge pump circuit is provided in the memory core chip, the signal level of the signal SLD #1 may change from the "H" level to the "L" level during the application of the program voltage VPGM #1.

In the I/F circuit I/F, the counter 450 detects that the signal level of the signal SLD #1 has transitioned to the "L" level and changes the signal level of the count signal SCT from "2" to "1".

After the signal level of the count signal SCT is changed to the level indicating "1", the signal level of the signal S1 is controlled. By the signal S1, the memory core circuit CORE #3 is electrically connected to the charge pump circuit 491. The charge pump circuit 491 corresponding to the memory core circuit CORE #3 supplies the generated voltage (for example, program voltage) to the memory core circuit CORE #3.

As a result, the generated program voltage VPGM #3 is applied to the selected word line WLk #3 of the memory core circuit CORE #3 at time t7. A current I3 is generated in the source line SL of the memory core circuit CORE #3.

At time t7, the memory core circuit CORE #3 sets the signal level of the signal SLD #3 to "H" level in accordance with the application of the program voltage VPGM #3 (or the generation of the current I3). As a result, the signal level of the count signal SCT is set to a value corresponding to "2".

For example, when generation of a load in the memory core circuit CORE #3 is not stopped unlike a general flash memory, a current Ix is generated at time tx.

In the present embodiment, when it is determined that the load amount in the flash memory has reached the allowable range, the supply of the voltage to the memory core circuit CORE #3 that is to be operated from now is started after elapse of the period Tx in which the load amount in the flash memory is determined to be smaller than the acceptable range.

As described above, in the flash memory of the present embodiment, the transfer of the voltage from the charge pump circuit 491 to the memory core circuit 10 is delayed so that the timings of the load generation in the plurality of memory core circuits (memory core chips) 10 of the flash memory 1 are distributed.

In the present embodiment, in the period during which the signals SLD #2 and SLD #3 are at the "H" level, even if other memory core circuits become operable based on the commands for other memory core circuits, the supply of the voltage from the charge pump circuit 491 to the other memory core circuit 10 is stopped by the signal S1 corresponding to the signals SLD #2 and SLD #3 at the "H" level.

At time t8, the load (current I2) decreases in the memory core circuit CORE #2. As a result, the signal SLD #2 is set to the "L" level.

The counter 450 detects the signal SLD #2 at "L" level. The counter 450 changes the signal level of the signal SCT from a value indicating "2" to a value indicating "1".

After time t8, the memory core circuit CORE #1 applies the program voltage VPGM #1 to the word line WLk #1 in a certain period and thereafter stops applying the program voltage VPGM #1. As a result, the potential of the word line WLk #1 is set to the ground voltage VSS. After the potential of the word line WLk #1 is set to the ground voltage VSS, the verify operation for the program operation is executed. By the verify operation, it is determined whether the threshold voltage of the memory cell has reached the voltage value corresponding to the data to be written. When the verify operation is a pass, the write operation in the memory core circuit CORE #1 is completed.

For example, at time t9, the memory core circuit CORE #1 sets the signal level of the ready/busy signal RBn #1 to "L" level.

After applying the program voltage for a certain period, the memory core circuit CORE #2 changes the potential of the word line WLk #2 from the program voltage VPGM #1 to the ground voltage VSS. Thereafter, when the verify operation for the program operation is a pass, the write operation to the memory core circuit CORE #2 is completed.

For example, at time t10, the memory core circuit CORE #2 sets the signal level of the ready/busy signal RBn #2 to "L" level.

At time t11, the current I3 decreases in the memory core circuit CORE #3. The circuit 190 changes the signal level of the signal SLD #3 from "H" level to "L" level.

The counter 450 detects the signal SLD #3 at "L" level. As a result, the signal level of the signal SCT changes from a value indicating "1" to a value indicating "0".

After applying the program voltage VPGM #3, the memory core circuit CORE #3 sets the potential of the word line WLk #2 to the ground voltage VSS. Thereafter, when the verify operation for the program operation is a pass, the write operation to the memory core circuit CORE #3 is completed.

For example, at time t12, the memory core circuit CORE #2 sets the signal level of the ready/busy signal RBn #2 to "L" level.

The operation of the flash memory of this embodiment is completed in the manner described above.

It should be noted that the period during which the signal SLD is set to the "H" level may be set on the basis of experiments and simulations for the flash memory. The signal level of the signal SLD may be set to "H" level by the sequencer 170 controlling the operation of the memory core circuit 10 on the basis of the timing at which generation of the load in the memory core circuit 10 is detected.

In this operation example, the notification of the load generation state in the flash memory of the present embodiment and the control of the supply of the voltage from the charge pump circuit to the memory core circuit have been described using the write operation of the flash memory as an example. However, the operation of the flash memory of the present embodiment described above can be applied to an operation of reading data from the flash memory and an operation of erasing data in the flash memory.

An example of the flash memory of this embodiment is described, in which the number of memory core circuits that can simultaneously operate is limited to two. However, in the present embodiment, the number of memory core circuits that can simultaneously operate may be set to three or more. For example, in a flash memory including eight memory core circuits, when the number of simultaneously operable memory core circuits is set to four, the supply of the voltage to the remaining four memory core circuits (memory core circuits to be operated from now) may be delayed based on the "H" level signal SLD from the four operating memory core circuits. Of the eight memory core circuits, six memory core circuits may be set to be operable in parallel, or three memory core circuits may be set to be operable in parallel. Control substantially similar to this can also be applied to a flash memory including 16 or 32 memory core chips. Depending on the operation to be performed by the flash memory (memory core circuit), the number of memory core circuits that can simultaneously operate and the number of memory core circuits to which the supply of voltage is to be delayed may be changed.

(C) Conclusion

When a relatively high voltage, such as a write voltage, is supplied to the memory core circuit (memory core chip) 10, a load due to the high voltage is generated in the memory core circuit 10.

When the plurality of memory core circuits 10 operate in parallel, the loads generated in the plurality of memory core circuits 10 are superimposed. When considering the total load generated in the memory core circuit, there is a possibility that the circuit size of the booster circuit may be too large or current consumption generated in the flash memory may not conform to the specification of the flash memory.

The flash memory of the present embodiment controls the number of charge pump circuits that simultaneously transfer voltages to the memory core circuit 10 among the charge pump circuits in order to suppress generation of a large load in the flash memory.

Figure 11:
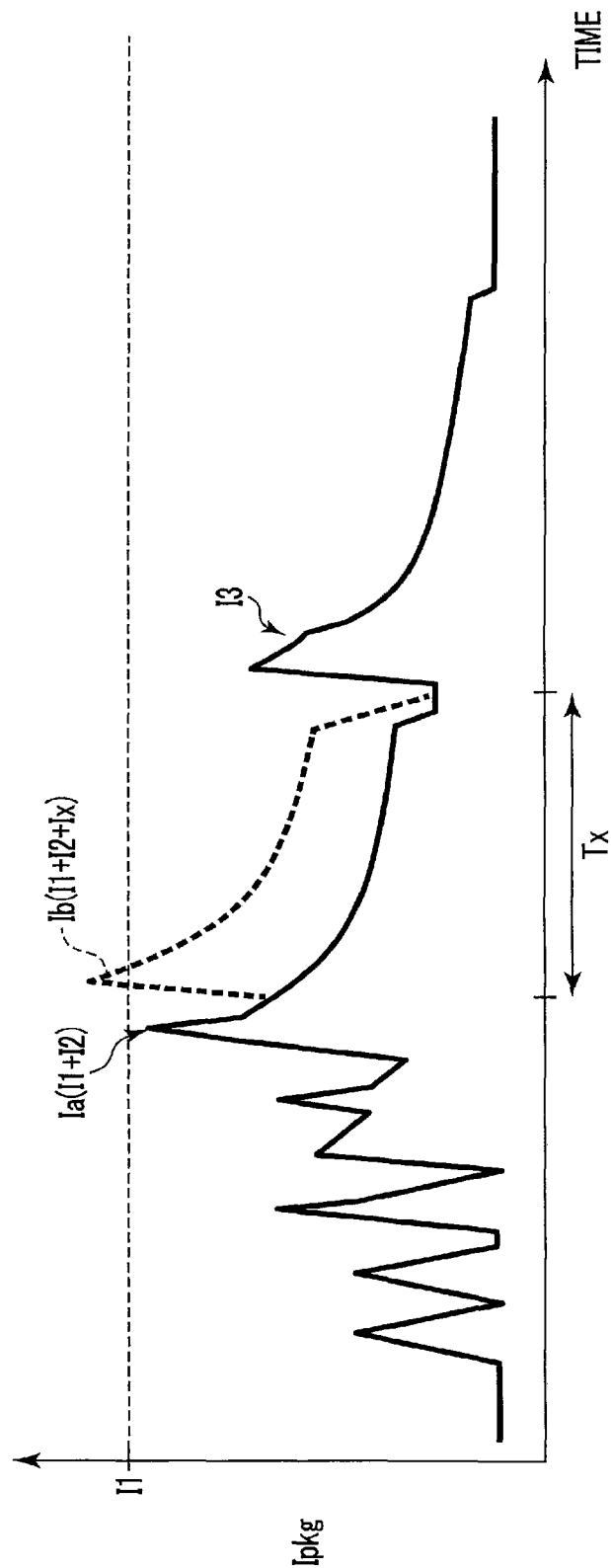
FIG. 11 is a schematic diagram for explaining the memory device of the third embodiment.

FIG. 11 is a diagram for explaining an effect of the flash memory of this embodiment.

FIG. 11 is a diagram schematically showing the relationship between a current Ipkg of the flash memory and a time during operation of the flash memory. In FIG. 11, the horizontal axis corresponds to the time, and the vertical axis corresponds to the magnitude of the current Ipkg of the entire flash memory.

The memory core circuits (memory core chips) in the flash memory execute a desired operation in parallel or successively.

As shown in FIG. 11, when the first and second memory core circuits operate in parallel, loads (consumption currents) I1 and I2 are generated substantially simultaneously (in a short period of time) in each memory core circuit. Therefore, the current Ipkg has a current (current value) Ia which is a sum of the currents I1 and I2 from the two memory core circuits.

When the third memory core circuit operates in parallel with the two memory core circuits, the current Ix arising from the third memory core circuit is further added to the current Ipkg in addition to the load of the first and second memory core circuits.

In this case, the peak value of the current Ib arising from the load of the three memory core circuits may exceed the allowable value based on the specification of the flash memory.

As described above, the flash memory of this embodiment can distribute the load generation timings of the respective memory core circuits in terms of time by detecting the occurrence of the load of each memory core circuit.

The flash memory 1 according to the present embodiment cuts off the supply of the voltage from the charge pump circuit to the third memory core circuit by detecting the load generation state of the memory core circuit. The flash memory 1 of the present embodiment delays the voltage transfer from the charge pump circuit to the third memory core circuit by a period Tx.

Accordingly, as shown in FIG. 11, the peak of the current I3 of the third memory core circuit occurs after the lapse of the period Tx from the occurrence of the peak of the current Ia arising from the other two memory core circuits.

As a result, the flash memory of the present embodiment can suppress the current peak from exceeding the allowable value based on the specification or design of the flash memory.

Therefore, in the flash memory of the present embodiment, operation failure of the flash memory can be avoided.

When a large load is generated in the flash memory, the booster circuit is designed to have a high voltage generation capacity that can support a large load. In this case, the circuit area of the booster circuit tends to be large in order to ensure high voltage generation capacity.

In the flash memory of this embodiment, since the magnitude of the load generated in the flash memory can be suppressed, an increase in the area of the booster circuit (charge pump circuit) can be prevented.

The flash memory of this embodiment can also obtain the following effects.

Since the number of charge pump circuits that simultaneously generate high voltage is restricted, as a result, the flash memory of this embodiment allows a plurality of memory core circuits to share the charge pump circuits. Therefore, in the flash memory of this embodiment, the number of charge pump circuits provided in the chip can be reduced. Accordingly, in the flash memory of this embodiment, the area of the booster circuit in the I/F chip can be reduced.

As a result, the flash memory of this embodiment can reduce the chip size of the I/F chip and reduce the chip cost of the NAND-type flash memory. Alternatively, in the case where the chip size of the I/F chip is maintained, the flash memory of this embodiment can expand the interval (the size of the separation region) between the I/F area and the booster circuit, or the allowance of the interconnect layout in the I/F chip can be improved.

As described above, the manufacturing cost of the memory device of this embodiment can be reduced. The memory device of this embodiment can improve the operation characteristics of the memory.

(4) Fourth Embodiment

A memory device according to the fourth embodiment will be described with reference to FIGS. 12 to 19.

(a) Basic Example

A basic example of the flash memory of this embodiment will be described with reference to FIG. 12.

Figure 12:
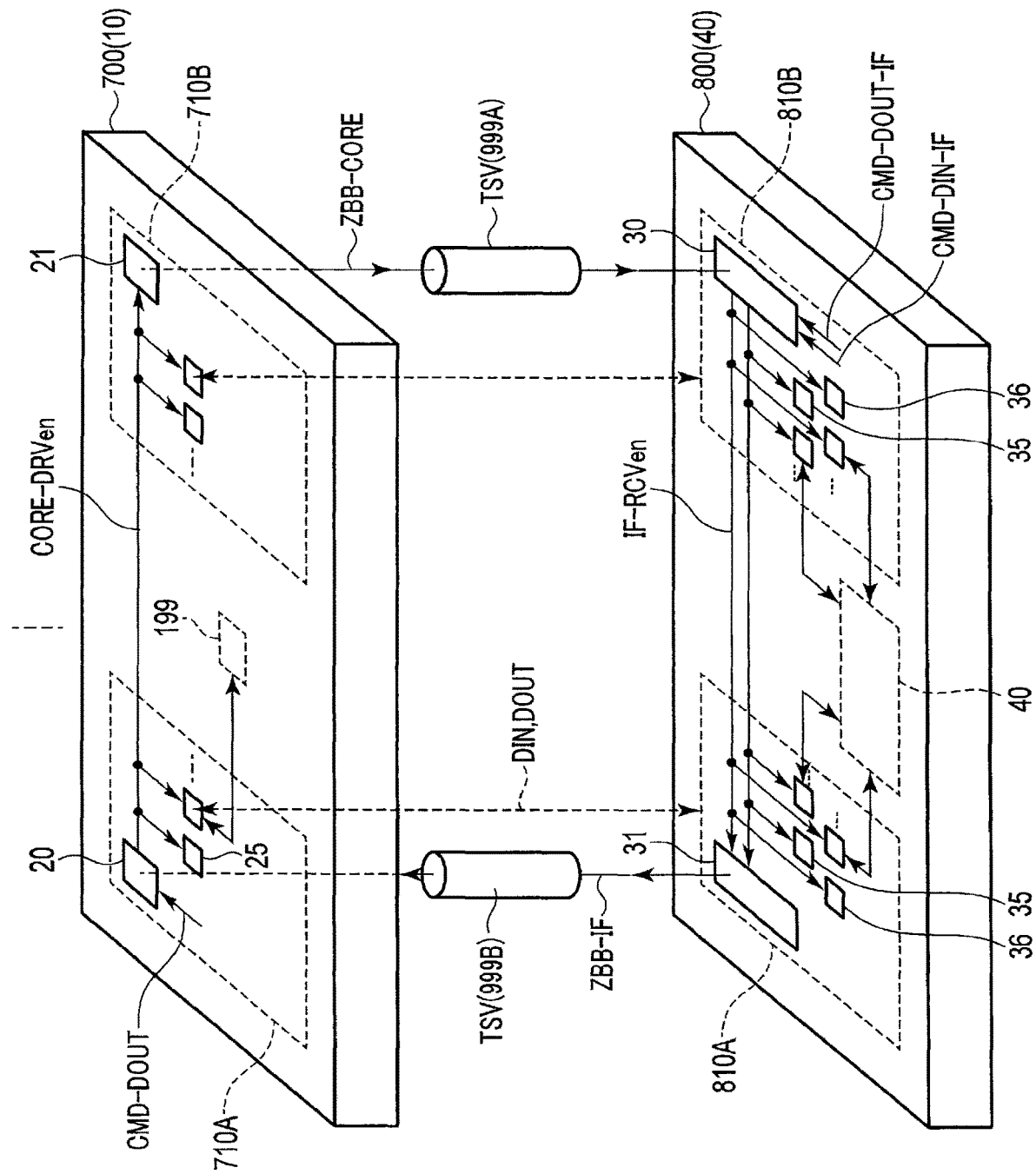
FIG. 12 is a schematic diagram for explaining a memory device of a fourth embodiment.

FIG. 12 is a schematic diagram for explaining a basic example of the memory device of the present embodiment.

In a flash memory, a signal (data) is transferred between a plurality of memory core circuits (memory core chips) and an I/F circuit (I/F chip). It is desirable that the operation status establishment order of transmitting and receiving signals in each of the memory core circuit and the I/F circuit be ensured so that the memory core circuit and the I/F circuit can transmit and receive signals in accordance with the command.

The flash memory of the present embodiment notifies the memory core circuit and the I/F circuit of the mutual operation status. Thus, the flash memory of the present embodiment ensures the operation timing between the memory core circuit and the I/F circuit.

As shown in FIG. 12, in the flash memory of the present embodiment, the memory core circuit 10 includes a circuit (for example, a driver circuit) 25 for data transfer and a receiver circuit.

The I/F circuit 40 includes a driver circuit (transmission circuit) 35 and a receiver circuit (reception circuit) 36.

The memory core circuit 10 uses the signal ZBB-CORE to notify the I/F circuit 40 of the operation status of the circuits 25 and 26. The signal ZBB-CORE is supplied from the memory core circuit 10 to the I/F circuit 40 via a signal path (bus) 999A including the electrode TSV. The I/F circuit 40 uses the signal ZBB-IF to notify the memory core circuit 10 of the operation status of the circuits 35 and 36. The signal ZBB-IF is supplied from the I/F circuit 40 to the memory core circuit 10 via a signal path (bus) 999B including the electrode TSV.

In the memory core circuit 10, the circuit 20 generates a signal CORE-DRVen using the signal ZBB-IF from the I/F circuit 40 and the signal CMD-DOUT.

The circuit 20 controls the operation timing (activation) of the circuit 25 by the signal CORE-DRVen. In the memory core circuit 10, data is transferred between a circuit (for example, a sense amplifier circuit) and the circuit 25.

The signal ZBB-CORE may be shared by the memory core circuits 10. The core circuits 10 may respectively output different signals ZBB-CORE to the I/F circuit 40.

In the I/F circuit 40, the circuit 30 generates a signal IF-DRVen and a signal IF-RCVen using the signal ZBB-CORE, a signal CMD-DIN-IF and a signal CMD-DOUT-IF.

The circuit 30 controls the operation timing of the driver circuit 35 by the signal IF-DRVen, and controls the operation timing of the receiver circuit 36 by the signal IF-RCVen. Data is transferred between the driver circuit 35 and the input/output circuit 400 and between the receiver circuit 36 and the input/output circuit 400.

In the memory core circuit 10, the circuit 21 generates the signal ZBB-CORE using the signal CORE-DRVen. In the I/F circuit 40, the circuit 31 generates the signal ZBB-IF by using the signal IF-DRVen and the signal IF-RCVen.

The signals CMD-DOUT, CMD-DOUT-IF and CMD-DIN-IF are signals generated by at least one of the memory core circuit 10 and the IF circuit 40 based on a command (write command or read command) CMD from the memory controller 5.

Hereinafter, the circuits 20, 21, 30, and 31 are referred to as the timing control circuits. Also, the driver circuit of the memory core circuit 10 is referred to as the core driver circuit, and the receiver circuit of the memory core circuit 10 is referred to as the core receiver circuit. The driver circuit of the I/F circuit 40 is referred to as the I/F driver circuit, and the receiver circuit of the I/F circuit 40 is referred to as the I/F receiver circuit.

For example, the timing control circuits 20 and 21 in the memory core circuit 10 are provided in the contact regions 710A and 710B of the memory core chip 700. Similarly, the timing control circuits 30 and 31 are provided in the contact regions 810A and 810B of the interface chip 800. For example, the contact regions 710A, 710B, 810A, 810B are regions provided with the electrodes of the TSV structure.

Accordingly, in the flash memory 1 of the present embodiment, due to the addition of the timing control circuits 20, 21, 30, and 31, a change of the design and layout of the memory core circuit 10 and the I/F circuit 40 and an increase of the chip size can be avoided.

For example, the memory core circuit 10 activates the core driver circuit 25 upon receipt of the signal ZBB-IF indicating that the I/F driver circuit or the I/F receiver circuit is in a non-active state.

For example, the I/F circuit 40 activates the I/F driver circuit 35 upon receipt of the signal ZBB-CORE indicating that the core driver circuit 25 is in the non-active state. In addition, the I/F circuit 40 activates the I/F receiver circuit 36 upon receipt of the signal ZBB-CORE indicating that the core driver circuit 25 is in an active state.

Thus, in the flash memory of the present embodiment, the order of activating/deactivating the driver circuit and the receiver circuit is controlled, so that the activation order of the driver circuit and the receiver circuit at the time of data transfer based on the specification is satisfied.

Therefore, in the flash memory of this embodiment, malfunctions during data transfer can be reduced.

(b) Specific Example

Figure 13:
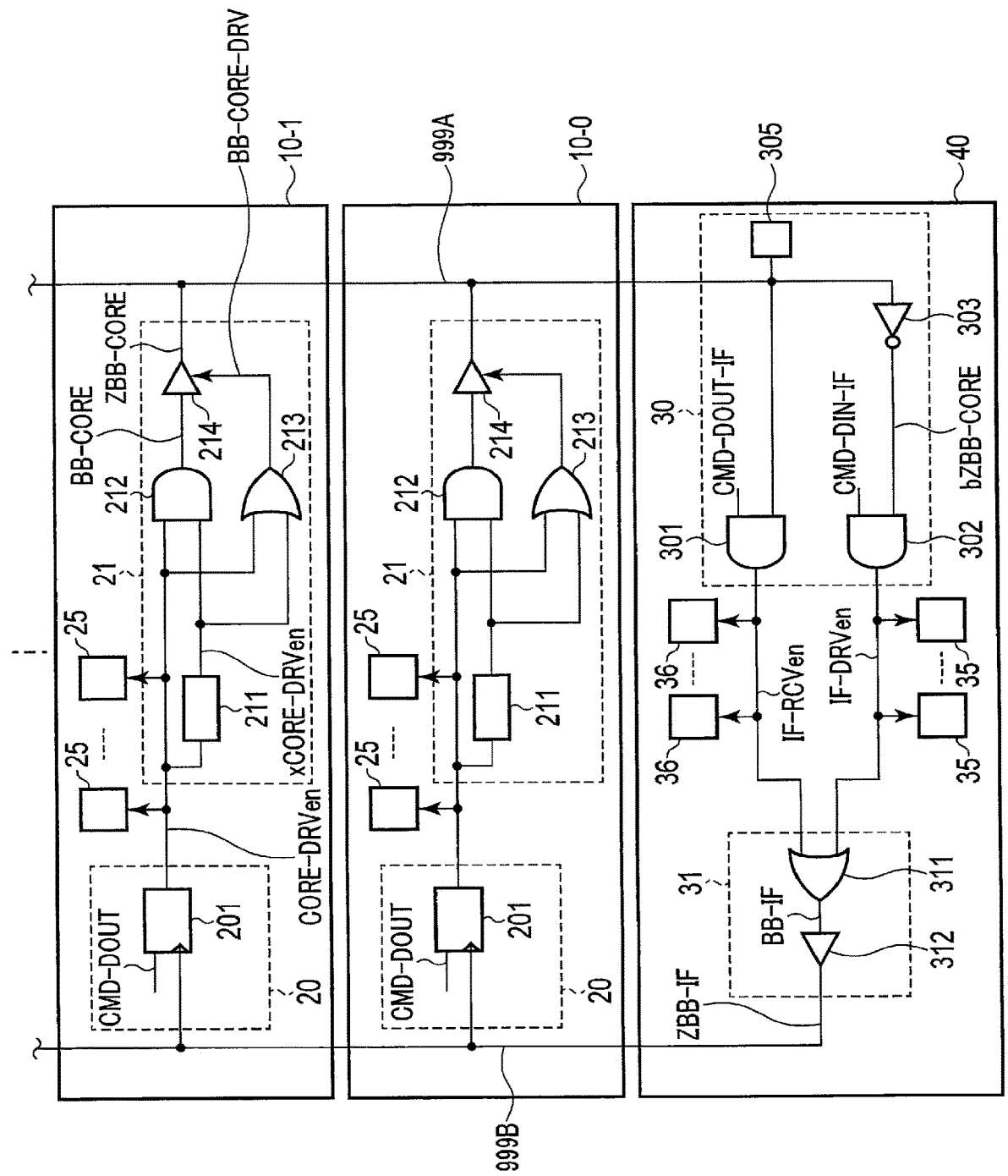
FIG. 13 is an equivalent circuit diagram showing a configuration example of the memory device of the fourth embodiment.

With reference to FIGS. 13 to 19, the flash memory of this embodiment will be described more specifically.
<Circuit Configuration>
With reference to FIG. 13, the circuit configuration of the flash memory of this embodiment will be described.

In FIG. 13, the circuits 20, 21, 30, and 31 in the regions 710A, 710B, 810A, and 810B are extracted and shown. In FIG. 13, for clarification of the illustration, circuits in the memory core circuit 10 and the I/F circuit 40 shown in FIG. 2 are omitted.

As shown in FIG. 13, the memory core circuit 10 includes timing control circuits (signal generation circuits) 20 and 21.

The timing control circuit 20 includes at least a latch 201.

The signal CMD-DOUT is supplied to one input terminal of the latch 201, and the signal ZBB-IF from the I/F circuit 40 is supplied to the other input terminal (for example, control terminal) of the latch 201.

The latch 201 outputs the signal CORE-DRVen of a certain signal level based on the signal CMD-DOUT and the signal ZBB-IF. The signal level of the signal CORE-DRVen is determined according to the signal level of the signal CMD-DOUT and the signal level of the signal ZBB-IF.

The signal CORE-DRVen is supplied to the core driver circuit 25. As a result, in the memory core circuit 10, the operation timing (activation/deactivation, ON/OFF) of the core driver circuit 25 is controlled according to the signal level of the signal CORE-DRVen. For example, the core driver circuit 25 transmits the data DOUT received from the sense amplifier 140 to the I/F circuit 40.

The timing control circuit 21 includes at least a delay circuit 211, an AND gate 212, an OR gate 213, and a buffer 214.

An input terminal of the delay circuit 211 is connected to an output terminal of the latch 201. The delay circuit 211 outputs a delay signal xCORE-DRVen of the signal CORE-DRVen from the latch 201.

The AND gate 212 has two input terminals and one output terminal.

One input terminal of the AND gate 212 is connected to the output terminal of the latch 201. The other input terminal of the AND gate 212 is connected to an output terminal of the delay circuit 211. The output terminal of the AND gate 212 is connected to an input terminal of the buffer 214.

The AND gate 212 performs an AND operation using the signal CORE-DRVen from the latch 201 and the signal xCORE-DRVen from the delay circuit 211. The AND gate 212 outputs a signal BB-CORE based on the result of the AND operation to the buffer 214. The signal level of the signal BB-CORE depends on the result of the AND operation.

The OR gate 213 has two input terminals and one output terminal.

One input terminal of the OR gate 213 is connected to the output terminal of the latch 201. The other input terminal of the OR gate 213 is connected to the output terminal of the delay circuit 211. The output terminal of the OR gate 213 is connected to a control terminal of the buffer 214.

The OR gate 213 performs an OR operation using the signal CORE-DRVen and the signal xCORE-DRVen. The OR gate 213 outputs a signal BB-CORE-DRV based on the result of the OR operation to the control terminal of the buffer 214. The signal level of the signal BB-CORE-DRV corresponds to the result of the OR operation.

The buffer 214 is, for example, a 3-state buffer. The buffer 214 outputs the signal BB-CORE from the AND gate 212 as the signal ZBB-CORE based on the control according to the signal level of the signal BB-CORE-DRV.

The signal ZBB-CORE having a signal level corresponding to the operation status of the memory core circuit 10 is supplied to the timing control circuit 30 of the I/F circuit 40 in the interface chip 800 via the signal line 999A.

In the memory core circuit 10, during the operation of the flash memory 1, the core receiver circuit is always set to the active state, so that high-speed data transfer from the I/F circuit 40 to the memory core circuit 10 is possible. Therefore, signals for controlling the activation/deactivation (ON/OFF) of the core receiver circuit are not generated by the timing control circuits 20 and 21.

The I/F circuit 40 includes at least timing control circuits 30 and 31.

The timing control circuit 30 includes at least two AND gates 301 and 302, an inverter 303, and a hold circuit 305.

Each of AND gate 301 and 302 has two input terminals and one output terminal.

The signal CMD-DOUT-IF is supplied to one input terminal of the AND gate 301. The signal ZBB-CORE from the memory core circuit 10 is supplied to the other input terminal of the AND gate 301.

The AND gate 301 performs an AND operation using the signal CMD-DOUT-IF and the signal ZBB-CORE. The AND gate 301 outputs the signal IF-RCVen based on the result of the AND operation. The signal level of the signal IF-RCVen depends on the result of the AND operation of the AND gate 301.

The signal CMD-DIN-IF is supplied to one input terminal of the AND gate 302. The other input terminal of the AND gate 302 is connected to the output terminal of the inverter 303. The signal ZBB-CORE is supplied to the input terminal of the inverter 303. The inverter 303 supplies the inverted signal bZBB-CORE of the signal ZBB-CORE to the other input terminal of the AND gate 302.

The AND gate 302 performs an AND operation using the signal CMD-DIN-IF and the signal bZBB-CORE. The AND gate 302 outputs the signal IF-DRVen based on the result of the AND operation. The signal level of the signal IF-DRVen depends on the result of the AND operation of the AND gate 302.

The signal IF-DRVen is supplied to the I/F driver circuit 35. As a result, in the I/F circuit 40, the operation timing of the I/F driver circuit 35 is controlled according to the signal level of the signal IF-DRVen. The signal IF-RCVen is supplied to the I/F receiver circuit 36. As a result, in the I/F circuit 40, the operation timing of the I/F receiver circuit 36 is controlled in accordance with the signal level of the signal IF-RCVen.

The hold circuit 305 is connected to the other input terminal of the AND gate 301 and the input terminal of the inverter 303. The hold circuit 305 stabilizes the potential at the signal line 999A, the input terminal of the AND gate 301, and the input terminal of the inverter 303.

The timing control circuit 31 includes at least an OR gate 311 and a buffer 312.

The OR gate 311 includes two input terminals and one output terminal. One input terminal of the OR gate 311 is connected to the output terminal of the AND gate 301. The other input terminal of the OR gate 311 is connected to the output terminal of the AND gate 302. The output terminal of the OR gate 311 is connected to an input terminal of the buffer 312. The OR gate 311 performs an OR operation using the signal IF-RCVen and the signal IF-RCVen. The OR gate 311 outputs the signal BB-IF based on the result of the OR operation to the buffer 312. The signal level of the signal BB-IF depends on the OR operation result of the OR gate 311.

The buffer 312 outputs the signal BB-IF from the OR gate 311 as a signal ZBB-IF to the memory core circuits 10.

In the timing control circuit 20 of the memory core circuit 10, the signal ZBB-IF having a signal level corresponding to the operation status of the I/F circuit 40 is supplied to the latch 201 via the signal path (bus) 999B.

As shown in FIG. 12, in consideration of the delay amount (interconnect delay) added to the signal, the timing control circuits 20 and 21 of the memory core circuit 10 are provided in different regions 710A, 710B, 810A, and 810B in each chip 700. However, when the circuits 20 and 21 are designed so that a desired delay amount is added to the signal, the two circuits 20 and 21 may be provided in the same region with in the chip 700. Likewise, the timing control circuits 30 and 31 of the I/F circuit 40 may be provided in the same region within the chip 800 in consideration of the signal delay amount.

The internal configuration of the timing control circuits 20, 21, 30, and 31 of the memory core circuit 10 and the I/F circuit 40 shown in FIG. 13 is an example and is not limited to the configuration shown in FIG. 13.

Operation Example

An operation example of the flash memory of the present embodiment will be described with reference to FIGS. 14 to 19. FIGS. 12 and 13 are also used as appropriate for the explanation of the operation of the flash memory of this embodiment.

Figure 14:
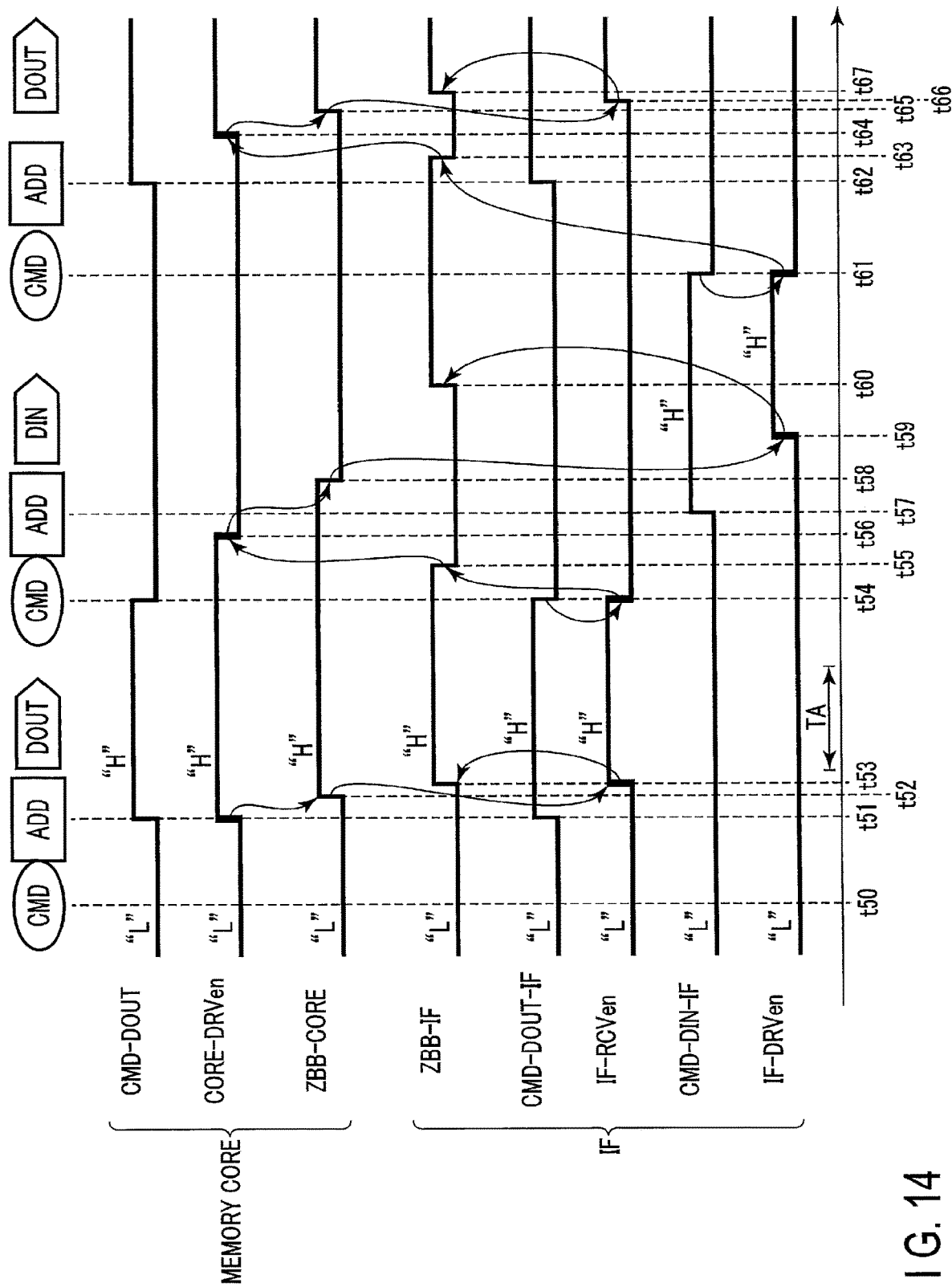
FIG. 14 is a timing chart showing an operation example of the memory device of the fourth embodiment.
Figure 15:
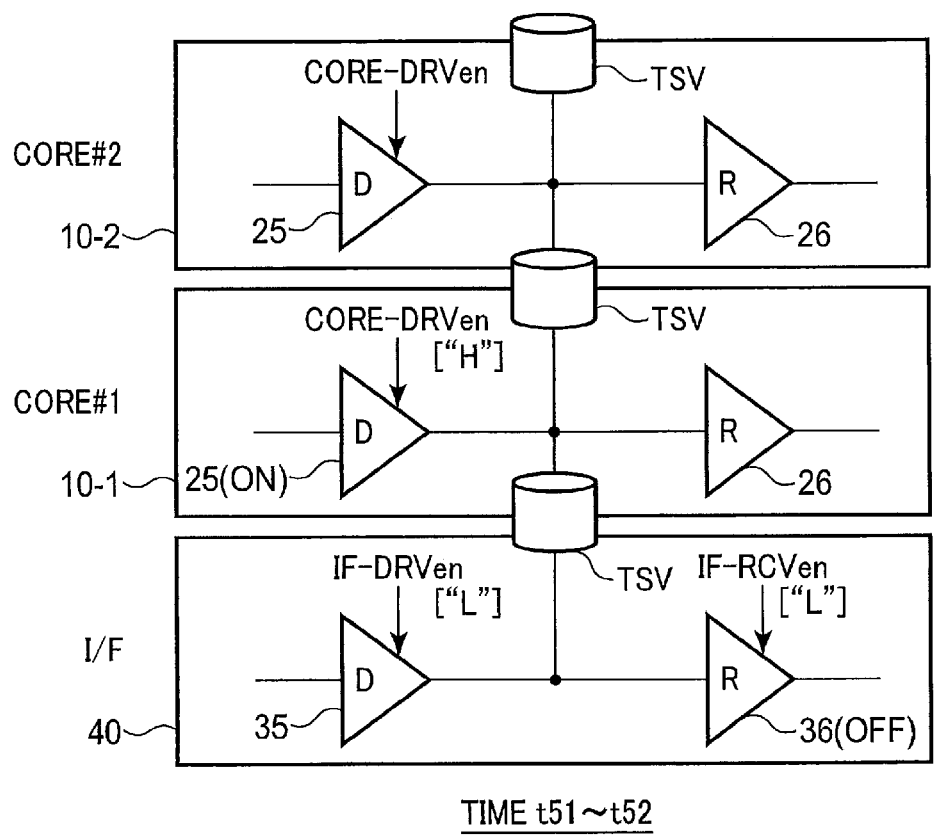
FIG. 15 is a schematic diagram for explaining an operation example of the memory device of the fourth embodiment.
Figure 17:
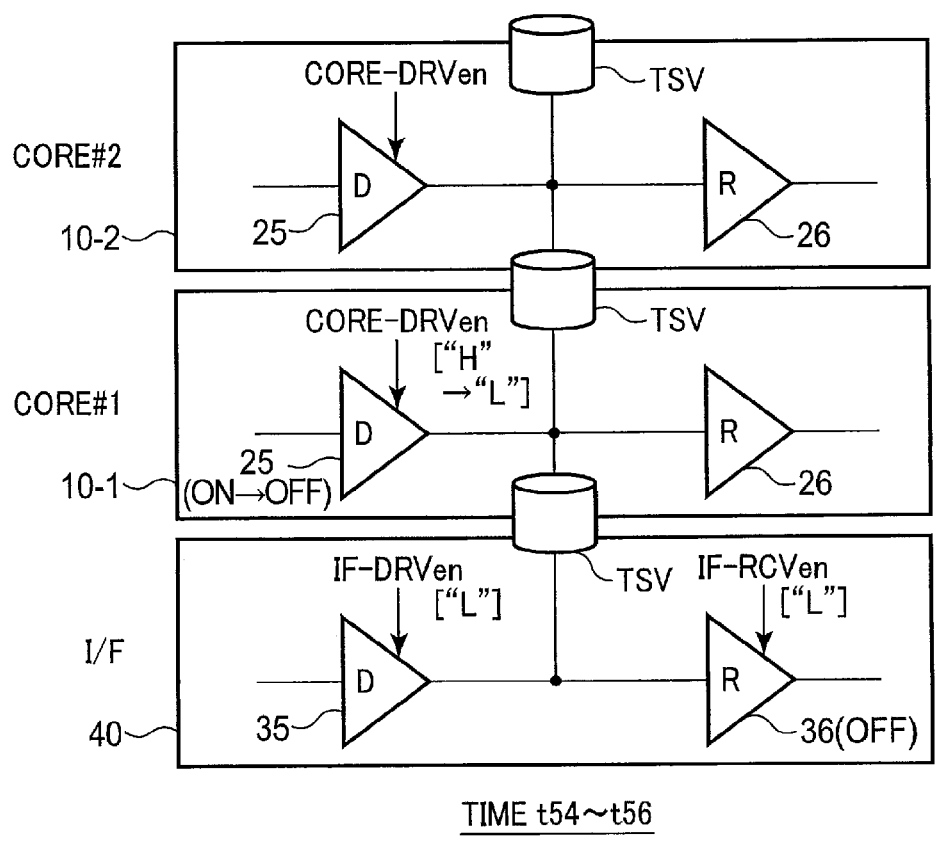
FIG. 17 is a schematic diagram for explaining an operation example of the memory device of the fourth embodiment.

FIG. 14 is a timing chart for explaining an operation example of the flash memory of the present embodiment. FIGS. 15 to 17 schematically show the operation status of the driver circuit and the receiver circuit of the memory core circuit and the operation status of the driver circuit and the receiver circuit of the I/F circuit at a certain time during the operation of the flash memory. In FIG. 15 to FIG. 17, the driver circuit and the receiver circuit are indicated by circuit symbols indicating buffers.

As shown in FIG. 14, at time t50, the command CMD is supplied to the flash memory 1.

When the command CMD is a read command at the time t51 during reception of the address, the signal level of the signal CMD-DOUT changes from the "L" level to the "H" level in the memory core circuit 10. At the time t51, the signal level of the signal CMD-DOUT-IF changes from "L" level to "H" level in the I/F circuit 40. The signal level of signal CMD-DIN-IF is set to "L" level.

At time t51, the signal levels of the signals ZBB-IF and ZBB-CORE are "L" level.

In the timing control circuits 20 and 21 of the memory core circuit 10, the signal CMD-DOUT of "H" level and a signal ZBB-IF of "L" level are supplied to the latch 201. Along with the change in the signal level of signal CMD-DOUT, the latch 201 outputs signal CORE-DRVen of "H" level.

At the time t51, the signal level of the signal ZBB-CORE is "L" level.

In the timing control circuits 30 and 31 of the I/F circuit 40, the signal CMD-DOUT-IF of "H" level and the signal ZBB-CORE of "L" level are supplied to the AND gate 301. The AND gate 301 outputs the signal IF-RCVen of "L" level.

The inverter 303 outputs a signal bZZB-CORE of "H" level to the AND gate 302.

The signal bZZB-CORE of "H" level and the signal CMD-DIN-IF of "L" level are supplied to the AND gate 302. The AND gate 302 outputs the signal IF-DRVen of "L" level.

Thus, as shown in FIG. 15, when the signal CORE-DRVen is set to "H" level at the time t51, the signal CORE-DRVen of "H" level is output to the control terminal of the core driver circuit 25 of the memory core circuit 10.

As a result, the core driver circuit 25 is set to the active state (ON state), and the core driver circuit 25 is enabled to transmit data.

On the other hand, the signal IF-DRVen and the signal IF-RCVen are both at "L" level. Therefore, at time t51, in the I/F circuit 40, the I/F driver circuit 35 and the I/F receiver circuit 36 are in the non-active state (OFF state) In the timing control circuits 20 and 21, the signal CORE-DRVen of "H" level is supplied to one terminal of the AND gate 212 and one terminal of the OR gate 213.

The delay circuit 211 delays the supplied signal CORE-DRVen. The delayed signal xCORE-DRVen is supplied to the other terminal of the AND gate 212 and the other terminal the OR gate 213. Therefore, the potential (signal level) of the other terminal of the AND gate 212 and the other terminal of the OR gate 213 changes from "L" level to "H" level at a timing later than the change of the potential of one terminal of the AND gate 212 and one terminal of the OR gate 213.

After the time t51, the signals CORE-DRVen and xCORE-DRVen of "H" level are supplied to the AND gate 212 and the OR gate 213, respectively. As a result, the output signals of the AND gate 212 and the OR gate 213 change from "L" level to "H" level.

The AND gate 212 supplies the signal BB-CORE of "H" level to the input terminal of the buffer 214, and the OR gate 213 supplies the signal BB-CORE-DRV of "H" level to the control terminal of the buffer 214. The buffer 214 outputs the signal ZBB-CORE of "H" level to the I/F circuit 40 via the signal line 999A including the electrode TSV and the like.

Thus, at time t52 after time t51, the signal level of the signal ZBB-CORE changes from "L" level to "H" level. Accordingly, the memory core circuit 10 notifies the I/F circuit 40 that the core driver circuit 25 is set to the active state (ON state, enable state).

When the signal level of the signal ZBB-CORE is set to "H" level, the signal CMD-DOUT-IF of "H" level is supplied to one input terminal of the AND gate 301, and the signal ZBB-CORE of "H" level is supplied to the other input terminal of the AND gate 301.

At time t53, the AND gate 301 outputs the signal IF-RCVen of "H" level. At this time, since the signals CMD-DIN-IF and bZBB-CORE of "L" level are supplied to the AND gate 302, the signal level of the signal IF-DRVen is set to "L" level.

The signal IF-RCVen of "H" level is supplied to one input terminal of the OR gate 311, and the signal IF-DRVen of "L" level is supplied to the other input terminal of the OR gate 311.

As a result, at time t53, the OR gate 311 outputs the signal BB-IF of "H" level to the buffer 312. The buffer 312 outputs the signal ZBB-IF of "H" level to the memory core circuit 10 via the signal line 999B including the electrode TSV and the like.

The memory core circuit 10 is notified from the I/F circuit 40 that the state of the I/F receiver circuit 36 is set to the active state (enable state).

As a result, as shown in FIG. 16, the signal IF-RCVen of "H" level is supplied to the control terminal of the I/F receiver circuit 36 at time 53 in the I/F circuit 40. As a result, at time td, the I/F receiver circuit 36 is set in the active state, and the I/F receiver circuit 36 is possible to receive the data.

Further, the signal ZBB-IF of "H" level is transmitted from the I/F circuit 40 to the memory core circuit 10, so that the memory core circuit 10 can detect that the I/F circuit 40 is possible to receive data.

In this way, after the core driver circuit 25 of the memory core circuit 10 is activated at the time t51, the receiver circuit 36 of the I/F circuit 40 is activated at the time t53.

Thus, in the present embodiment, the core driver circuit 25 and the I/F receiver circuit 36 are activated in the order that ensures stable operation. Therefore, in the flash memory of this embodiment, it is possible to prevent a through current from occurring in the I/F circuit when the order of activation of the driver circuit and receiver circuit is inappropriate.

After the core driver circuit 25 and the I/F receiver circuit 36 are activated in a predetermined order, the data DOUT is transferred from the memory core circuit 10 to the I/F circuit 40 in the period TA.

At time t54, a write command is supplied as a command CMD to the flash memory. The signals CMD-DOUT and CMD-DOUT-IF change from "H" level to "L" level.

Since the signal CMD-DOUT-IF of "L" level is supplied to the AND gate 301, the signal level of the signal IF-RCVen changes from "H" level to "L" level. As a result, the receiver circuit 36 in the I/F circuit 40 is set in the non-active state (OFF state).

The signal level of the signal CMD-DIN-IF is maintained at "L" level. Therefore, the AND gate 302 outputs the signal IF-DRVen of "L" level.

The OR gate 311 outputs the signal BB-IF of the "L" level by the two "L" level signals IF-RCVen and IF-DRVen.

At time t55, the buffer 312 outputs the signal ZBB-IF of "L" level. As a result, the I/F circuit 40 can notify the memory core circuit 10 that the I/F receiver circuit 36 is in the non-active state.

The latch 201 receives the signal ZBB-IF of "L" level via the signal line 999B. Thereafter, at time t56, the latch 201 outputs the signal CORE-DRVen at the "L" level by the signal CMD-DOUT at the "L" level and the signal ZBB-IF at the "L" level.

The core driver circuit 25 is deactivated by the signal CORE-DRVen of the "L" level and set to the OFF state.

In this way, as shown in FIG. 17, after the receiver circuit 36 of the I/F circuit 40 is deactivated during the period from the time t54 to the time t56, the core driver circuit 25 of the memory core circuit 10 is deactivated.

As a result, in the flash memory of this embodiment, generation of a through current in the I/F circuit can be prevented.

Following command CMD at time t54, address ADD and data DIN are supplied to the flash memory 1.

At the time t57 during reception of the address ADD, the signal level of the signal CMD-DIN-IF changes from "L" level to "H" level. At this time, since the signal level of the signal ZBB-CORE is "H" level, the signal bZBB-CORE of "L" level is supplied to the AND gate 302. Therefore, the signal level of the signal IF-DRVen of the AND gate 302 is maintained at "L" level. At time t57, the signal IF-RCVen is also set to "L" level.

After the delay time due to the interconnect length between the two circuits 20 and 21 has elapsed since the signal level of the signal CORE-DRVen is set to the "L" level, at the time t58, the signal CORE-DRVen of "L" level is supplied to the one input terminal of the AND gate 212 and the one input terminal of the OR gate 213.

As a result, at time t58, the signal level of the signal ZBB-CORE changes from "H" level to "L" level.

Even if the signal level of the signal CORE-DRVen is set to "L" level, the delay circuit 211 outputs the signal xCORE-DRVen of "H" level in a certain period corresponding to the delay amount set in the delay circuit 211 to the other input terminal of the AND gate 212 and the other input terminal of the OR gate 213.

After the time corresponding to the delay amount of the delay circuit 211 elapses, the signal level of the signal xCORE-DRVen changes from "H" level to "L" level. When the signal xCORE-DRVen changes from "H" level to "L" level, the AND gate 212 outputs the signal BB-CORE of "L" level by an input of the signal CORE-DRVen of "L" level and the signal xCORE-DRVen of "L" level. Also, the OR gate 213 outputs the signal BB-CORE-DRV of "L" level by an input of the signal CORE-DRVen of "L" level and the signal xCORE-DRVen of "L" level. In this case, the buffer 214 is set to the high impedance state by the signal BB-CORE-DRV of "L" level. As a result, the AND gate 212 is electrically isolated from the circuit 30.

Note that the signal level of the signal ZBB-CORE may change from "L" level to "H" level between time t56 and time t57.

After the signal level of the signal ZBB-CORE changes from "H" level to "L" level, the signal bZBB-CORE of "H" level is supplied from the inverter 303 to the other input terminal of the AND gate 302 at the time t59.

As a result, the AND gate 302 outputs the signal IF-DRVen of "H" level.

Therefore, as shown in FIG. 18, at time t59, the driver circuit 35 of the I/F circuit 40 is set to the active state by the signal IF-DRVen of "H" level, and the driver circuit 35 is set to a state of enabling transmission of the data DIN. For example, the core receiver circuit 26 of the memory core circuit 10 is always set in the active state.

In this manner, after the I/F driver circuit 35 is activated, the data DIN is transferred from the I/F circuit 40 to the memory core circuit 10. Accordingly, the flash memory of the present embodiment can prevent a current (collision current) caused by a wrong order of the activation of the driver circuit and the receiver circuit from occurring in the bus.

The signal IF-DRVen of "H" level is supplied to the input terminal of the OR gate 311. Accordingly, the OR gate 311 outputs the signal BB-IF of "H" level to the buffer 312.

As a result, the signal level of signal ZBB-IF changes from "L" level to "H" level at time t60.

By the supply of the signal ZBB-IF of "H" level, the memory core circuit 10 detects that the driver circuit and the receiver circuit of the I/F circuit 40 are in the active state.

Here, at time t60, the signal level of signal CMD-DOUT is "L" level. Therefore, even if the signal ZBB-IF of "H" level is supplied to the latch 201, the latch 201 outputs the signal CORE-DRVen of "L" level.

At time t61, for example, the read command CMD is supplied to the flash memory 1. As a result, the signal level of the signal CMD-DIN-IF changes from "H" level to "L" level. The AND gate 302 outputs the signal IF-DRVen of "L" level. Therefore, the I/F driver circuit 35 is deactivated.

At the time t62 during reception of the address ADD, the signal level of the signal CMD-DOUT is set to "H" level. The signal level of the signal COMD-DOUT-IF is set to "H" level. The AND gate 301 outputs a signal of "H" level.

At time t63, the signal level of the signal ZBB-IF changes from "H" level to "L" level.

At time t64, the latch 201 outputs the signal CORE-DRVen of "H" level. The signal CORE-DRVen of "H" level is supplied to the core driver circuit 25. As a result, the core driver circuit 25 is activated.

Therefore, as shown in FIG. 19, after deactivation of the I/F driver circuit 35 at time t61, the core driver circuit 25 is set to a state of enabling transmission of the data at time t64. Thus, the flash memory of this embodiment can prevent a collision current due to an error in the timing of activation of the core driver circuit 25 and the driver circuit 35 from occurring in the bus.

After the signal level of the signal CORE-DRVen is set to "H" level, the signal level of the signal xCORE-DRVen changes from "L" level to "H" level.

After the time t64, the AND gate 212 outputs the signal BB-CORE of "H" level, and the OR gate 213 outputs the signal BB-CORE-DRV of "H" level.

As a result, at time t65, the buffer 214 outputs a signal ZBB-CORE of "H" level.

The signal CMD-DOUT-IF of "H" level and the signal ZBB-CORE of "H" level are supplied to the AND gate 301.

Therefore, at time t66, the AND gate 301 outputs the signal IF-RCVen of "H" level. As a result, the I/F receiver circuit 36 can receive data from the memory core circuit 10.

In this manner, the core driver circuit 25 and the I/F receiver circuit 36 are activated in the same order as shown in FIGS. 15 and 16.

For example, at time t66, transfer of the data DOUT is started from the core driver circuit 25 to the I/F receiver circuit 36.

The signal CMD-DOUT-IF at "L" level and the signal bZBB-CORE at "L" level are supplied to the AND gate 302. Therefore, the AND gate 302 outputs the signal IF-DRVen of "L" level. The I/F driver circuit 35 is deactivated.

Based on the signals IF-DRVen and IF-RCVen from the AND gates 301 and 302, the signal level of the output signal of the OR gate 311 is set to "H" level.

As a result, at time t67, the signal ZBB-IF of "H" level is output from the I/F circuit 40 to the memory core circuit 10. The operation status of the I/F circuit 40 is notified to the memory core circuit 10.

As described above, data transfer between the memory core circuit and the I/F circuit in the flash memory of the present embodiment is executed.

(C) Conclusion

In the flash memory of the present embodiment, a signal indicating the operation status of the memory core circuit is transferred from the memory core circuit to the I/F circuit. At the same time, a signal indicating the operation status of the I/F circuit is transferred from the I/F circuit to the memory core circuit.

Thus, in the flash memory of this embodiment, it is possible to prevent the order of activation of the driver circuit and the receiver circuit from becoming wrong due to variations in process (chip characteristics or element characteristics) or voltage variations.

Therefore, at the time of data transfer between the memory core circuit and the I/F circuit, the flash memory of this embodiment can ensure the order of establishing the active state of the driver circuit and the receiver circuit.

As a result, the flash memory of this embodiment can suppress malfunctions during data transfer.

With the above configuration, the flash memory of this embodiment can speed up the starting time from the supply of the command.

In the flash memory of this embodiment, application of a common clock for operation timing and generation of a current due to failure of operation order can be suppressed. As a result, the flash memory of this embodiment can reduce current consumption As described above, the memory device of this embodiment can improve the operation characteristics of the memory.

(5) Fifth Embodiment

Figure 20:
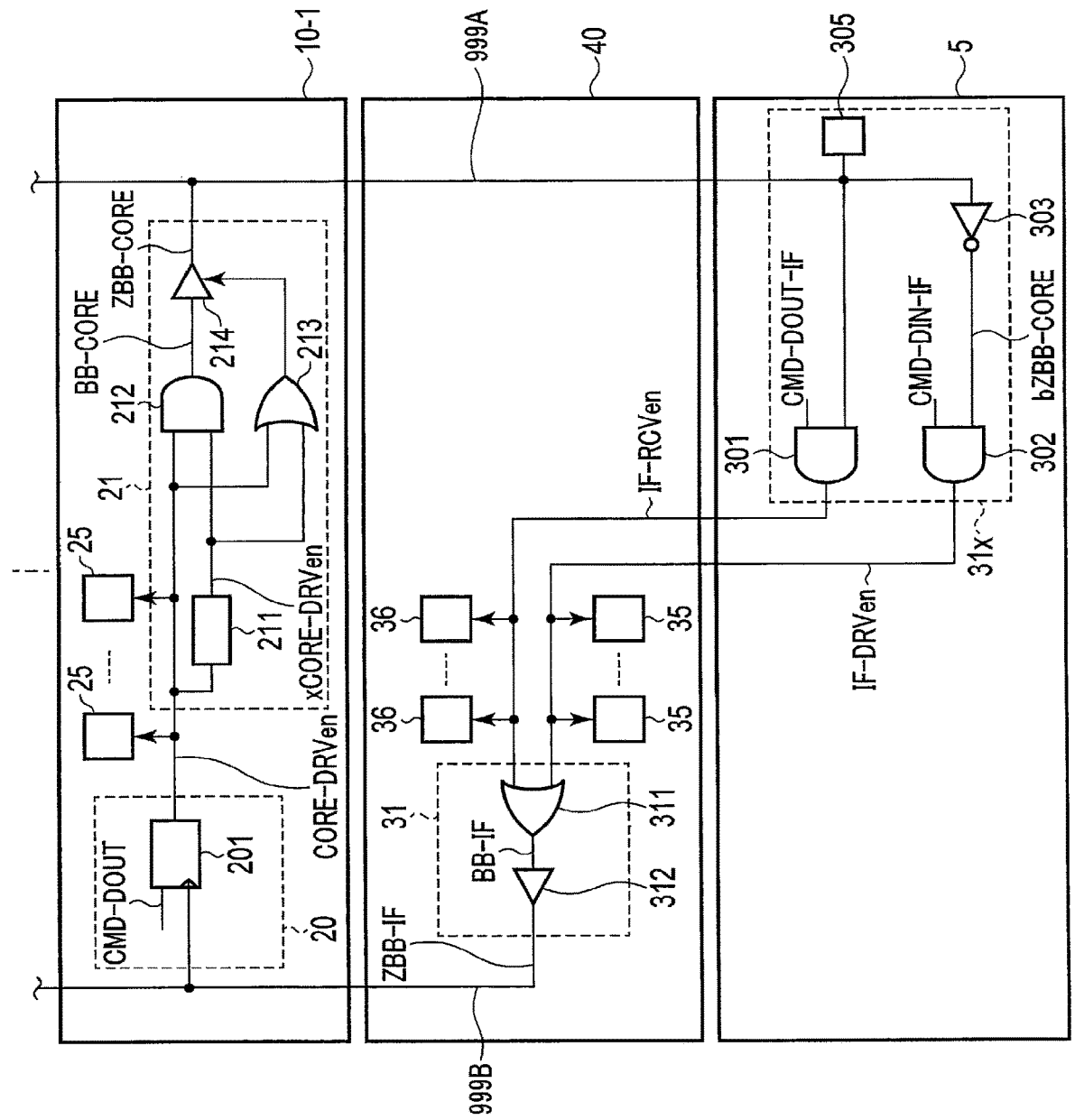
FIG. 20 is an equivalent circuit diagram showing a configuration example of a memory device of a fifth embodiment.
Figure 21:
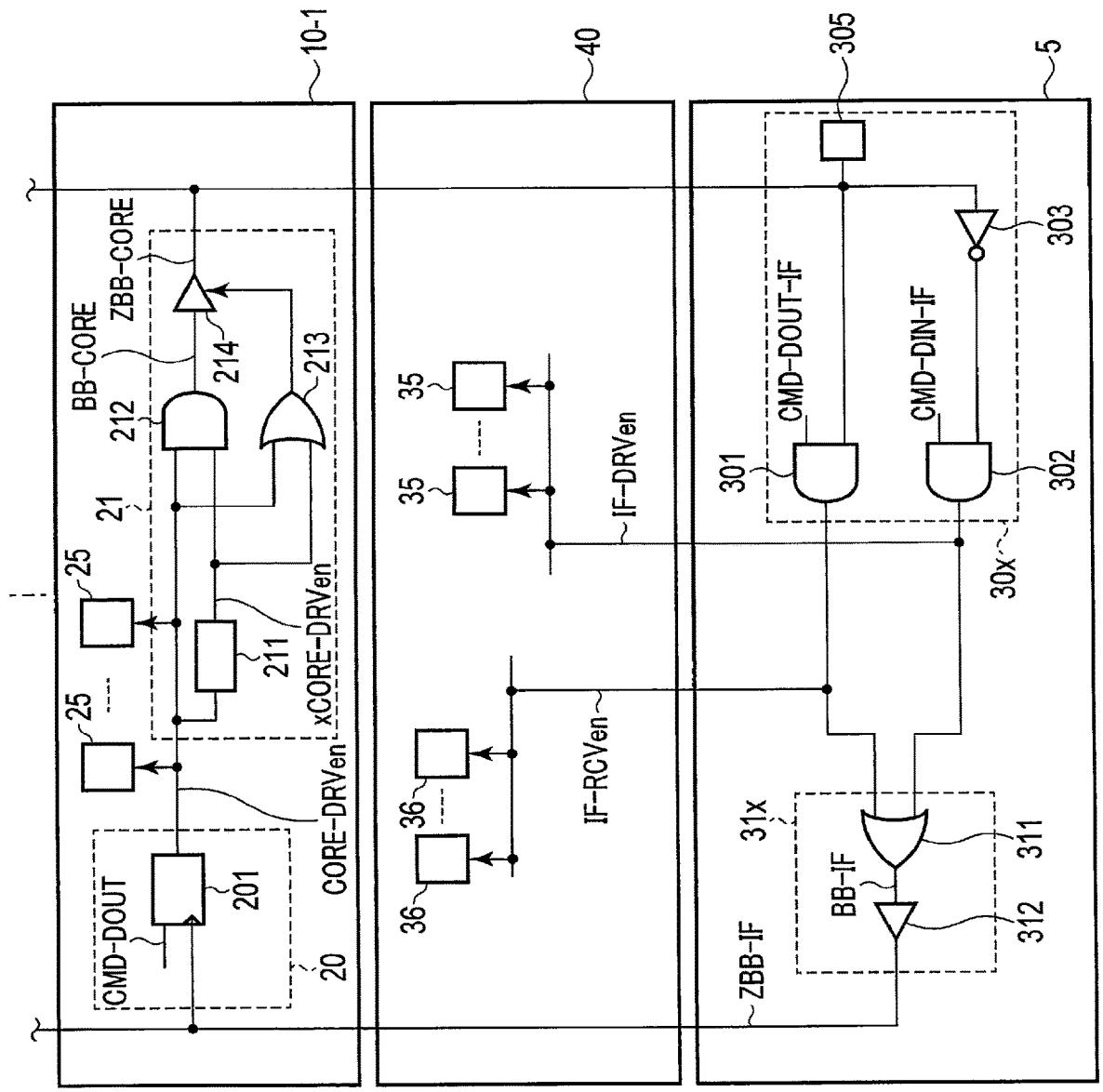
FIG. 21 is an equivalent circuit diagram showing a configuration example of the memory device of the fifth embodiment.

With reference to FIG. 20 and FIG. 21, the memory system of the fifth embodiment will be described.

The timing control circuits 30 and 31 in the I/F circuit (I/F chip) 40 in the flash memory of the fourth embodiment described above may be provided outside the flash memory 1.

FIG. 20 is a schematic diagram for explaining the memory device of this embodiment.

As shown in FIG. 20, a timing control circuit 31X on the I/F circuit 40 side may be provided in the memory controller 5.

In the memory controller 5, the timing control circuit 31X receives the signal ZBB-CORE from the memory core circuit 10 via the interface circuit 40.

The timing control circuit 31X generates the signal IF-RCVen and the signal IF-DRVen based on the signal level of the signal ZBB-CORE.

The timing control circuit 31X transmits the generated signals IF-DRVen and IF-RCVen to the I/F circuit 40.

The I/F circuit 40 receives the signals IF-DRVen and IF-RCVen. The signals IF-DRVen and IF-RCVen are supplied to the timing control circuit 30 in the I/F circuit 40. As a result, the timing control circuit 30 generates the signal ZBB-IF and transmits the generated signal ZBB-IF to the memory core circuit 10.

Further, the signal IF-DRVen is supplied to the driver circuit 35 in the I/F circuit 40, and the signal IF-RCVen is supplied to the receiver circuit 36 in the I/F circuit 40. As a result, the I/F driver circuit 35 and the I/F receiver circuit 36 are activated and deactivated by the signals IF-DRVen and IF-RCVen from the memory controller 5.

FIG. 21 is a schematic diagram for explaining a memory system including the memory device of this embodiment.

As shown in FIG. 21, the timing control circuits 30X and 31X may be provided in the memory controller 5, instead of being provided in the I/F circuit.

In this case, the signal IF-DRVen and the signal IF-RCVen are generated by the timing control circuit 31X in the memory controller 5. The memory controller 5 supplies the signals IF-DRVen and IF-RCVen to the circuits 35 and 36 in the I/F circuit 40. As a result, activation and deactivation of the I/F driver circuit 35 and the I/F receiver circuit 36 are controlled.

In the memory controller 5, the timing control circuit 31X generates a signal ZBB-IF of a certain signal level based on the signals IF-DRVen and IF-RCVen. The memory controller 5 supplies the signal ZBB-IF to the memory core circuit 10 via the I/F circuit 40.

The memory core circuit 10 generates a signal CORE-DRVen of a certain signal level according to the signal level of the signal ZBB-IF from the memory controller 5. In the memory core circuit 10, the operation of the core driver circuit 25 is controlled in accordance with the signal level of the signal CORE-DRVen.

Since the operation of the memory device of the present embodiment is substantially the same as the operation described with reference to FIGS. 14 to 19, the description thereof will be omitted.

As described above, in the memory device of the present embodiment, even when a circuit for controlling the timing of data transmission and reception between the memory core circuit and the interface circuit is provided in the memory controller, the reliability of data transfer can be improved.

(6) Sixth Embodiment

A memory device according to the sixth embodiment will be described with reference to FIGS. 22 to 24.

In the sixth embodiment described below, a voltage generation circuit is provided in the memory core chip 700, a generation circuit for generating a clock signal to be transmitted to a booster circuit of the I/F chip 800 and a voltage generation circuit of the memory core chip 700 is provided in the I/F chip 800.

The memory device of this embodiment generates a relatively low voltage of about 4V or lower in, for example, the I/F chip 800, and applies the generated voltage to each of the memory core chips 700. The memory core chip 700 boosts (or lowers) the voltage applied from the I/F chip 800, and generates a necessary voltage.

For example, in this embodiment, the process of manufacturing the I/F chip 800 differs from the process of manufacturing the memory core chip 700. In the process of manufacturing the I/F chip 800, a field-effect transistor of a low withstand voltage (for example, a withstand voltage of about 5V) having a relatively thin gate oxide film is manufactured. On the other hand, in the process of manufacturing the memory core chip 700, a field-effect transistor of a low withstand voltage and a field-effect transistor of a high withstand voltage having a thicker gate oxide film than that of the field-effect transistor of the low withstand voltage are manufactured. Therefore, the booster circuit in the I/F chip 800 boosts the power supply voltages VCC1 and VCC2 to about 4V. If a higher voltage is necessary, the voltage generation circuit (booster circuit) provided in each memory core chip 700 is used.

(a) Configuration Example

The memory device of the sixth embodiment will be explained with reference to FIG. 22 and FIG. 23.

<Layout of Interface Chip>

FIG. 22 is a top view showing an example of a layout of circuits in the I/F chip in the flash memory of this embodiment. Hereinafter, only the matters different from the first embodiment shown in FIG. 6 will be described.

As shown in FIG. 22, the I/F chip 800 of this embodiment includes a booster circuit 430 ("VFOURPUMP" in FIG. 22) and a clock generation circuit 440 ("CLK GENERATION CIRCUIT" in FIG. 22) in the I/F area R1.

Charge pump circuits 491 (491-1 to 491-8) in this embodiment are provided in the boosting area R2 as in the case of the first embodiment shown in FIG. 6. Each of the charge pump circuits 491 boosts the power supply voltage VCC2 under the control of the control circuit 410, and generates a voltage of about 4V (hereinafter referred to as "voltage VX2"). The charge pump circuit 491 supplies an AC-like current (for example, a current supplied in various operations as needed) for a word line WL, a substrate, a bit line BL, etc. to the corresponding memory core chip 700.

The booster circuit 430 boosts the power supply voltage VCC1 under the control of the control circuit 410, generates a voltage of about, for example, 4V (hereinafter referred to as "voltage VFOUR") for use in the memory core chip 700, and supplies a DC-like current (for example, a current steadily supplied in an operating state) to each memory core chip 700. For example, in an amplifier (not shown) provided within the memory core chip 700, the voltage VFOUR is used as a power supply voltage of the amplifier, if it is necessary to use a voltage higher than the power supply voltage VCC. The amount of current supplied by the booster circuit 430 is less than that supplied by the charge pump circuit 491. Therefore, a capacitor element for boosting for use in the booster circuit 430 is smaller in size than a capacitor element for boosting for use in, for example, the charge pump circuit 491. Accordingly, the power noise due to charge and discharge of the capacitor element in the booster circuit 430 is smaller than that in the charge pump circuit 491. Therefore, the booster circuit 430 is provided in the I/F area R1 and connected in common to the memory core chips 700. The booster circuit 430 may include a plurality of charge pump circuits to apply a plurality of voltages to the memory core chips 700.

The clock generation circuit 440 generates, under the control of the control circuit 410, a clock signal CLKp to be transmitted to the booster circuit 430 and the booster circuit 490 (the charge pump circuit 491) in the I/F chip 800 and the voltage generation circuit in each memory core chip 700. The control circuit 410 is configured to synchronize operations of the booster circuits 430 and 490 and the voltage generation circuit in each memory core chip 700 based on the clock signal CLKp. The clock generation circuit 440 is connected in common to the memory core chips 700. The clock signals to be transmitted to the booster circuits 430 and 490 and the voltage generation circuit in each memory core chip 700 may be the same or may be different from one another. For example, different clock signals (CLKp1, CLKp2, . . . ) may be generated for the memory core chips (700-1, 700-2, . . . ).

In I/F area R1, for example, pads 891A, 891B, 892A, and 892B for supplying various voltages to the circuits 400, 410, 420, 430, and 440 are provided above the I/F area R1. The pads 891A and 891B are connected to a interconnect 901 and a terminal 991 to which the power supply voltage VCC1 is supplied. The pads 892A and 892B are connected to a interconnect 902 and the terminal 992 to which the ground voltage VSS1 is supplied.

In the boosting area R2, for example, pads 895A, 895B, 896A, and 896B for supplying various voltages to the booster circuit 490 are provided above the boosting area R2 (the booster circuit 49). The pads 895A and 895B are connected to the interconnect 905 and the terminal 995 to which the power supply voltage VCC2 is supplied. The pads 896A and 896B are connected to the interconnect 906 and the terminal 996 to which the ground voltage VSS2 is supplied.

The interconnects 901 and 902 for the power supply voltage and the terminals 991 and 992 for the I/F area R1 differ from the interconnects 905 and 906 for the power supply voltage and the terminals 995 and 996 for the boosting area R2. The power supply to the circuits 400, 410, 420, 430, and 440 in the I/F area R1 is electrically isolated from the power supply of the circuits 490 and 491 in the boosting area R2. As a result, it is possible to suppress the noise caused by the operation of the booster circuit 490 and the charge pump circuit 491 from being applied to the circuits 400, 410, 420, 430, and 440 in the I/F area R1.

A separation area R3 is provided between the boosting area R2 and the I/F area R1. For example, the separation area R3 is provided as a line shape extending from one end to the other end of the I/F chip 800 on the upper surface of the I/F chip. As a result, it is possible to suppress propagation of noise caused by the boosting area R2 to the I/F area R1.

<Layout of Memory Core Chip>

FIG. 23 is a top view showing an example of a layout of circuits in the memory core chip in the flash memory of this embodiment. In the example shown in FIG. 23, the memory cell array 110, the row decoder 120, the sense amplifier 140, the address register 150, the command register 160, and the sequencer 170 in the memory core circuit 10, described with reference to FIG. 2 of the first embodiment, are omitted to simplify the explanation.

As shown in FIG. 23, the memory core chip 700 (the memory core circuit 10) of this embodiment includes a voltage generation circuit 180, a clock receiving circuit 183, and a clock generation circuit 184.

The voltage generation circuit 180 generates a voltage necessary in the memory core chip 700 using the voltages VX2 and VFOUR under the control of the sequencer 170, and supplies the voltage to each circuit. In the example shown in FIG. 23, to simplify the explanations, the voltage generation circuit 180 applies the voltage to the driver circuit 130. However, the voltage generation circuit 180 also supplies a necessary voltage to the other circuits, such as the sense amplifier 140, in the memory core chip 700. The voltage generation circuit 180 includes an LV generation circuit 181 and a HV booster circuit 182.

The LV generation circuit 181 lowers, for example, the voltage VFOUR supplied from the booster circuit 430, generates a necessary voltage, and applies it to the other circuits in the memory core chip 700. More specifically, for example, the LV generation circuit 181 generates a read voltage VCGRV and applies it to the driver circuit 130. The read voltage VCGRV is a voltage applied to a selected word line WL in read operation. The voltage that the LV generation circuit 181 applies to the driver circuit 130 is not limited to the read voltage VCGRV.

The HV booster circuit 182 boosts the voltage VX2 applied from the charge pump circuit 491, generates a necessary voltage, and applies it to the other circuits in the memory core chip 700. More specifically, the HV booster circuit 182 boosts the voltage VX2 in, for example, write operation, generates a program voltage VPGM and a voltage VPASS, and applies them to the driver circuit 130. The voltage VPASS is a voltage that is applied to a unselected word line WL in write operation, and turns on a memory cell MC regardless of the data (threshold voltage) retained in the memory cell MC. In addition, the HV booster circuit 182 boosts the voltage VX2 in, for example, read operation, generates a voltage VREAD and applies it to the driver circuit 130. The voltage VREAD is a voltage that is applied to an unselected word line WL in read operation, and turns on a memory cell MC regardless of the data (threshold voltage) retained in the memory cell MC. The voltage that the HV booster circuit 182 applies to the driver circuit 130 is not limited to the program voltage VPGM, the voltage VPASS, and the voltage VREAD. For example, the HV booster circuit 182 may generates a voltage to be applied to the select gate lines SGD and SGS.

The clock receiving circuit 183 supplies to the voltage generation circuit 180 the clock signal CLKp supplied from the clock generation circuit 440.

The clock generation circuit 184 generates a clock signal CLKts necessary for a test in a test step in the manufacturing process. In the test, the clock generation circuit 184 supplies the clock signal CLKts to the voltage generation circuit 180 (the HV booster circuit 182). After mounting and assembling, the clock generation circuit 184 may be electrically disconnected from the voltage generation circuit 180.

(b) Specific Example

FIG. 24 is a diagram schematically showing a configuration example of a flash memory of this embodiment. To simplify the explanation, two memory core chips 700 are shown in FIG. 24; however, any number of memory core chips 700 may be used.

As shown in FIG. 24, the clock generation circuit 440 of the I/F chip 800 is electrically connected to the clock receiving circuit 183 of each memory core chip 700 in common via the electrode TSV (770A) of each memory core chip 700. Similarly, the booster circuit 430 of the I/F chip 800 is electrically connected to the LV generation circuit 181 of each memory core chip 700 in common via the electrode TSV (770B) of each memory core chip 700. Furthermore, in the same manner as shown in FIG. 4 or FIG. 5 of the first embodiment, the HV booster circuits 182 of the respective memory core chips 700 are electrically connected to different charge pump circuits 491 via different electrodes TSV (751 and 755). More specifically, the HV booster circuit 182 of the memory core chip 700-1 is electrically connected to the charge pump circuit 491-1 via the electrode TSV (751-1) of the memory core chip 700-1, and the HV booster circuit 182 of the memory core chip 700-2 is electrically connected to the charge pump circuit 491-2 via the electrode TSV (751-2) of the memory core chip 700-2 and the electrode TSV (755) of the memory core chip 700-1. As in the first embodiment, the electrode TSV (751-1) and the electrode TSV (755) of the memory core chip 700-1 are not electrically connected.

The clock generation circuit 184 of each memory core chip 700 is not electrically connected to any other chips.

(C) Conclusion

The memory device of this embodiment is applicable to the first to fifth embodiments. Thus, the same advantageous effect as the first to fifth embodiments can be obtained.

Furthermore, in the memory device of this embodiment, the booster circuit 430 that supplies a DC-like current (voltage) can be provided in the I/F area R1 of the I/F chip 800. As a result, it is possible to reduce the influence of the noise caused by the booster circuit 490 in the boosting area R1. Therefore, malfunctions of the memory core chips 700 can be suppressed, which improves the reliability of the memory device.

Moreover, in the memory device according to the present embodiment, the memory core chip 700 includes the voltage generation circuit 180. The I/F chip 800 includes the booster circuits 430 and 490, and the clock generation circuit 440. The clock generation circuit 440 transmits the clock signal CLKp to the booster circuits 430 and 490 and the voltage generation circuit 180. As a result, the operations of the booster circuits 430 and 490 and the voltage generation circuit 180 can be synchronized. Thus, since the malfunctions relating to generation of a voltage can be suppressed in each memory core chip 700, the reliability of the memory device can be improved.

(7) Seventh Embodiment

The memory device of the seventh embodiment will be described with reference to FIGS. 25 and 26. In the description of the seventh embodiment, a sealant for the I/F chip 800 and the memory core chips 700 will be described.

(a) Basic Example

Figure 25:
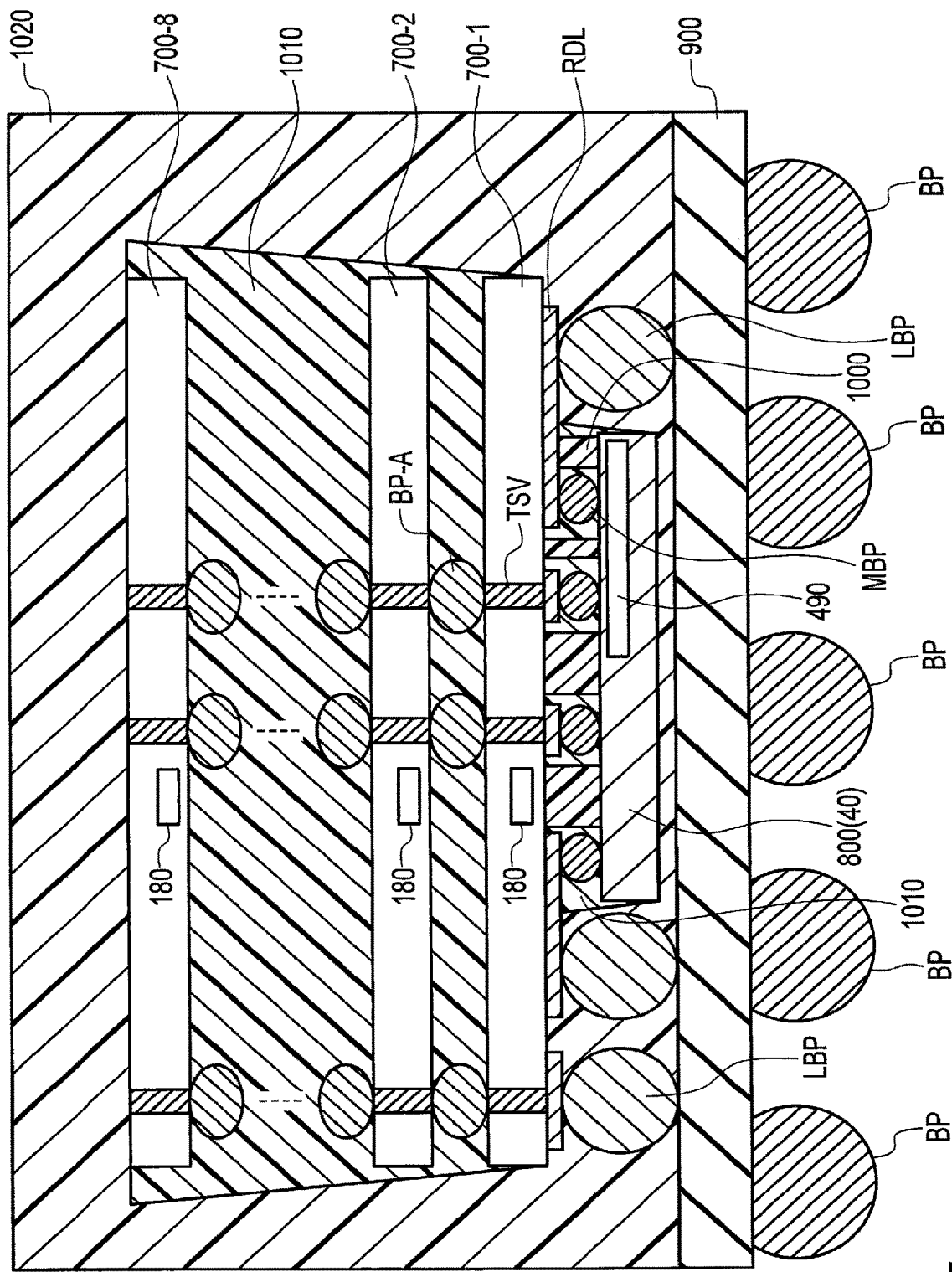
FIG. 25 is a cross-sectional view showing a structural example of a memory device of a seventh embodiment.

With reference to FIG. 25, an example of the cross-sectional configuration of a flash memory 1 of this embodiment will be described.

FIG. 25 is a cross-sectional view for explaining a structural example of a mounted state of the flash memory according to the seventh embodiment. In FIG. 25, for clarity of illustration, main constituent elements are extracted and shown. The flash memory 1 of this embodiment includes various connection terminals (for example, bumps and pads), various circuits, and various interconnects (for example, internal interconnects and redistribution layers) not shown in FIG. 25.

For example, the flash memory 1 of the present embodiment has a package structure called the BGA as in the first embodiment shown in FIG. 3.

As shown in FIG. 25, the flash memory 1 of the present embodiment includes, for example, eight memory core chips 700-1 to 700-8 and one I/F chip 800. The number of memory core chips 700 may be determined discretionarily. The I/F chip 800 and the memory core chips 700-1 to 700-8 are stacked in sequence above the substrate 900.

The I/F chip 800 includes the booster circuit 490. The memory core chip 700 of this embodiment includes the voltage generation circuit 180 described above in the sixth embodiment. The memory core chip 700 may not include the voltage generation circuit 180.

A plurality of bumps BP are provided on the bottom surface (lower surface) of the substrate 900.

A plurality of large bumps LBP are provided on the upper surface of the substrate 900.

A plurality of microbumps MBP are provided on the upper surface of the I/F chip 800.

The memory core chips 700-1 to 700-8 are stacked on the large bumps LBP and the microbumps MBP. Each memory core chip 700 includes a plurality of electrodes TSV and a plurality of pads (not shown) and the like. Redistribution layers RDL and pads electrically connected to the redistribution layers RDL are provided on the bottom surface of the memory core chip 700-1. The pads on the bottom surface of the memory core chip 700-1 are electrically connected to pads (not shown) of the substrate 900 and pads of the I/F chip 800 (not shown), respectively, via the large bumps LBP and the microbumps MBP. The memory core chips 700-1 to 700-8 are electrically connected to one another via the electrodes TSV and the bumps BP-A.

A plurality of stoppers 1000 are provided between the I/F chip 800 and the memory core chip 700-1. More specifically, the stoppers 1000 are provided to be in contact with areas including no pads, namely, the regions not electrically connected (hereinafter referred to as "non-connection regions") on the surface of the I/F chip 800 and the surface of the memory core chip 700-1 facing the I/F chip 800.

The stoppers 1000 function as stoppers and adhesive, when the memory core chip 700-1 and the I/F chip 800 are crimped with the microbumps MBP. More specifically, the stoppers 1000 function as stoppers to define the gap between the memory core chip 700-1 and the I/F chip 800, namely, the height of the microbumps MBP. The upper surfaces of the stoppers 1000 adhere to the bottom surface of the memory core chip 700-1 and the bottom surfaces of the stoppers 1000 adhere to the upper surface of the I/F chip 800, so that the stoppers 1000 also function as adhesive.

A resin that does not contain a filler, for example, metal or Si (silicon), is used as the stoppers 1000. More specifically, a thermosetting resin, for example, polyimide resin, phenolic resin, epoxy resin, benzocyclobutene resin, acrylic resin, is used as the stoppers 1000. The stoppers 1000 are formed by coating technique, such as lithography and dispensing, or film adhesion. When the lithography is used, a photosensitive resin is used as the stoppers 1000.

Space between the I/F chip 800 and the memory core chips 700 is filed with an underfill material 1010. A resin that contains a filler, for example, metal or Si (silicon), is used as the underfill 1010. More specifically, a thermosetting resin, for example, polyimide resin, phenolic resin, epoxy resin, benzocyclobutene resin, acrylic resin, is used as the underfill 1010. Since the underfill 1010 contains a filler, it has a higher coefficient of thermal conductivity and a lower coefficient of thermal expansion than the stoppers 1000.

A sealant 1020 containing a filler is provided so as to cover the memory core chips 700 and the I/F chip 800 above the substrate 900. Space between the substrate 900 and the I/F chip 800 is filled with the sealant 1020. A thermosetting resin, for example, polyimide resin, phenolic resin, epoxy resin, benzocyclobutene resin, acrylic resin, is used as the sealant 1020. The materials of the underfill 1010 and the sealant 1020 may be the same.

When the I/F chip 800 and the memory core chips 700 are sealed with the underfill 1010 and the sealant 1020, the following steps may be carried out. For example, first, the memory core chips 700 and the I/F chip 800 are stacked (in this state, the I/F chip 800 is located at the top), and the space between the I/F chip 800 and the memory core chip 700 and between the memory core chips 700 is filled with the underfill 1010. At this time, the underfill 1010 may adhere to a part (non-connection region) of the surface of the uppermost memory core chip 700. Next, the stacked body of the I/F chip 800 and the memory core chips 700 is inverted and stacked on the substrate 900. Then, the stacked body is sealed with the sealant 1020 on the substrate 900. Thereafter, the bumps BP are formed on the bottom surface of the substrate 900.

(b) Specific Example

Figure 26:
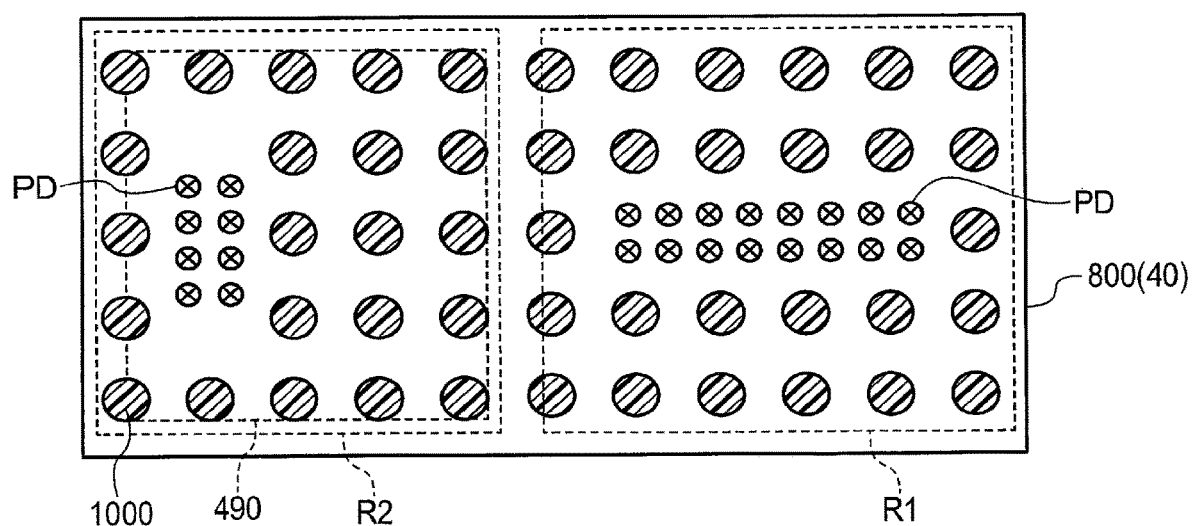
FIG. 26 is a top view of an interface chip showing a structural example of the memory device of the seventh embodiment.

With reference to FIG. 26, a layout of the stoppers 1000 on the I/F chip 800 will be described.

FIG. 26 is a top view of the I/F chip of the seventh embodiment. FIG. 26 shows an example in which the stoppers 1000 are formed on the surface of the I/F chip 800 that faces the memory core chip 700-1. However, the stoppers 1000 may be formed on the surface of the memory core chip 700 that faces the I/F chip 800.

As shown in FIG. 26, the pads PD electrically connected to the circuits (control circuit 410, the input/output circuit 400, the internal voltage generation circuit 420, etc.) in the I/F area R1, explained with reference to FIG. 6 of the first embodiment, are provided on the I/F area R1. The microbumps MBP may be formed on the pads PD of the I/F chip 800, or on the pads of the memory core chip 700-1, or the pads of both. Furthermore, pads PD electrically connected to the booster circuit 490 (charge pump circuit 491) are provided on the boosting area R2. On parts of the I/F area R1, the boosting area R2, and the separation area R3 where no pads PD are provided, a plurality of stoppers 1000 are locally provided so as not to be in contact with the pads PD (the region provided with the stoppers is also referred to as "the adhesion region"). The layout of the stoppers 1000 may be determined discretionarily. For example, linear stoppers 1000 may be provided. Furthermore, the shapes of the stoppers 1000 may be different from one another.

(C) Conclusion

The memory device of this embodiment is applicable to the first to sixth embodiments. Thus, the same advantageous effect as the first to sixth embodiments can be obtained.

In addition, according to the memory device of this embodiment, the stoppers 1000 are locally provided between the memory core chip 700-1 and the I/F chip 800 so as to bond the non-connection region of the memory core chip 700-1 and the non-connection region of the I/F chip 800. Since the stoppers 1000 contain no filler, they have a lower coefficient of thermal conductivity than the underfill 1010. Therefore, due to the provision of the stoppers 1000, the heat generated in the booster circuit 490 of the I/F chip 800 can be suppressed from being transferred to the memory core chips 700. Thus, in the memory core chips 700, variation of characteristics due to an increase in temperature of the chips can be suppressed. Accordingly, the reliability of the memory device is improved.

Furthermore, since the stoppers 1000 are used, the distance between the memory core chip 700-1 and the I/F chip 800 is defined. Therefore, it is possible to suppress excessive crush of the microbumps MBP or failure in connection between the memory core chip 700-1 and the I/F chip 800.

Moreover, when the memory core chip 700-1 and the I/F chip 800 are crimped, they are bonded with the stoppers 1000. Therefore, before the space between the memory core chip 700-1 and the I/F chip 800 is filled with the underfill 1010, the connection strength between the memory core chip 700-1 and the I/F chip 800 can be improved.

Furthermore, by locally providing the stopper 1000, degradation of accuracy in positioning of the memory core chip 700-1 and the I/F chip 800 and failure in connection of the microbumps MBP can be suppressed in comparison with a case in which the stoppers 1000 are applied to the overall surface of the I/F chip 800. For example, when the memory core chip 700-1 and the I/F chip 800 are crimped, embedding of an alignment mark by the stoppers 1000 can be suppressed by locally providing the stoppers 1000. Therefore, the degradation of positioning accuracy can be suppressed. Furthermore, since the stoppers 1000 are locally provided so as not to be in contact with the pads, the stoppers 1000 can be prevented from biting into a portion between a microbump MBP and a pad of the I/F chip 800 or between a microbump MBP and a pad of the memory core chip 700-1. Thus, failure in electrical connection between the memory core chip 700-1 and the I/F chip 800 can be suppressed. Furthermore, when the memory core chip 700-1 and the I/F chip 800 are crimped, it is possible to suppress formation of a void between the memory core chip 700-1 and the I/F chip 800.

Moreover, since the stoppers 1000 having a coefficient of thermal expansion higher than that of the underfill 1010 is used between the I/F chip 800 and the memory core chip 700-1 while no stoppers 1000 are used between the memory core chips 700, the memory core chips 700 can be prevented from warping due to the thermal expansion of the stoppers 1000.

(8) Eighth Embodiment

The memory device of the eighth embodiment will be described with reference to FIGS. 27 and 28. In the following description of the eighth embodiment, the layout of the stoppers 1000 is different from that of the seventh embodiment.

(a) Basic Example

Figure 27:
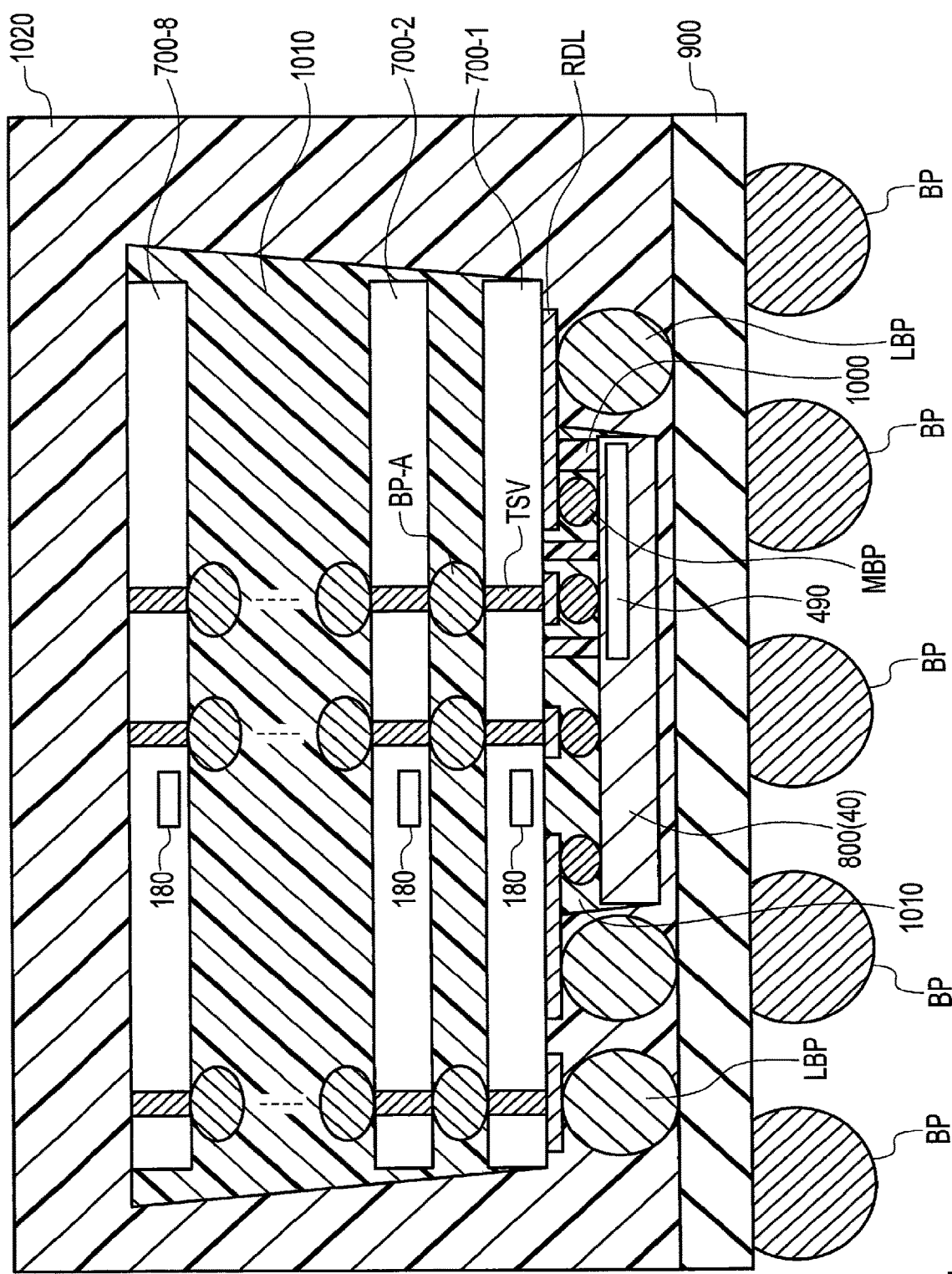
FIG. 27 is a cross-sectional view showing a structural example of a memory device of an eighth embodiment.

With reference to FIG. 27, a structural example of the flash memory 1 of this embodiment will be described. Hereinafter, only the matters different from the seventh embodiment shown in FIG. 25 will be described.

FIG. 27 is a cross-sectional view for explaining a structural example of a mounted state of the flash memory according to the eighth embodiment.

As shown in FIG. 27, in the flash memory 1 of this embodiment, stoppers 1000 are provided above the booster circuit 490 (in the vertical direction) in the I/F chip 800. Stoppers 1000 are not provided below the voltage generation circuit 180 (the HV booster circuit 182) (in the vertical direction) in the memory core chip 700-1. The other configurations are the same as those of the seventh embodiment shown in FIG. 25.

(b) Specific Example

With reference to FIG. 28, a layout of the stoppers 1000 on the I/F chip 800 will be described. Hereinafter, only the matters different from the seventh embodiment shown in FIG. 26 will be described.

FIG. 28 is a top view of the I/F chip of the eighth embodiment.

As shown in FIG. 28, the stoppers 1000 are locally provided in a part of the boosting area R2 where no pads PD are provided. The layout of the stoppers 1000 in the boosting area R2 may be determined discretionarily. No stoppers 1000 are provided in the I/F area R1. If the booster circuit 430 of the sixth embodiment shown in FIG. 22 is provided in the I/F area R1, the stoppers 1000 may be provided above the booster circuit 430 (in the vertical direction). In this embodiment, when the memory core chip 700-1 and the I/F chip 800 are crimped, the voltage generation circuit 180 of the memory core chip 700-1 is not disposed in the vertical direction of the boosting area R2. In other words, the stoppers 1000 are disposed in the vertical direction of the booster circuits (430 and 490) of the I/F chip 800, while the stoppers 1000 are not disposed in the vertical direction of the voltage generation circuit 180.

The stoppers 1000 may be provided also in the separation area R3.

(C) Conclusion

In the memory device of this embodiment, the same advantage as that of the seventh embodiment can be obtained.

Moreover, in the memory device of this embodiment, when the memory core chip 700-1 and the I/F chip 800 are crimped, the stoppers 1000 are provided in a region located in the vertical direction of the booster circuit 490 of the I/F chip 800, whereas the stoppers 1000 are not provided in a region located in the vertical direction of the voltage generation circuit 180 in the memory core chip 700-1. As a result, the heat generated in the booster circuit 490 is not likely to be transferred to the memory core chip 700-1, and the heat generated in the voltage generation circuit 180 is likely to radiate via the underfill 1010 and the I/F chip 800. Thus, in the memory core chips 700, variation of characteristics due to an increase in temperature of the chips can be further suppressed. Accordingly, the reliability of the memory device is improved.

[Others]

In the memory device of the first embodiment, the structure of the memory core chip shown in FIG. 4 or FIG. 7 may be applied to a NAND-type flash memory including a conventional interface chip. The layout of each circuit in the interface chip shown in FIG. 6 or FIG. 8 may be applied to a NAND-type flash memory including a conventional memory chip.

Note that one or more of the first to eighth embodiments may be applied to memory devices other than the NAND-type flash memory, for example, DRAM, SRAM, ReRAM, or MRAM.

Further, the above-described embodiment may be applied to a semiconductor device other than a memory device, for example, a system LSI, a CPU, a wireless device, an image sensor, or the like.

While several embodiments of the present invention have been described, these embodiments have been presented by way of example and are not intended to limit the scope of the invention. The novel embodiments described herein can be implemented in a variety of other forms; furthermore, various omissions, substitutions, and changes can be made without departing from the spirit of the invention. The accompanying claims and their equivalents are intended to cover such forms or modifications as would fall within the scope and spirit of the inventions.

What is claimed is:

1. A memory device comprising:
   a first memory chip including a first circuit, a first terminal, and a second terminal;
   a second memory chip including a second circuit and a third terminal; and
   an interface chip including a first voltage generation circuit, a second voltage generation circuit, and a data input/output circuit,
   wherein:
   the second memory chip is provided above the first memory chip;
   the interface chip is provided below the first memory chip;
   a first end of the first terminal is electrically connected to the first circuit and a second end of the first terminal is electrically connected to the first voltage generation circuit;
   a third end of the second terminal is electrically connected to the third terminal and a fourth end of the second terminal is electrically connected to the second voltage generation circuit;
   a fifth end of the third terminal is electrically connected to the second circuit and a sixth end of the third terminal is electrically connected to the second voltage generation circuit via the second terminal;
   in a direction perpendicular to a surface of the first memory chip, the third end overlaps with the sixth end, without overlapping with the fourth end;
   the input/output circuit is provided in a first region of the interface chip;
   the first and second voltage generation circuits are provided in a second region of the interface chip;
   a third region is provided between the first region and the second region; and
   the third region electrically isolates the first region from the second region.

2. The memory device according to claim 1, wherein;
the input/output circuit is electrically connected to a first power supply via a first interconnect;
the first and second voltage generation circuits are electrically connected to a second power supply via a second interconnect; and
the first interconnect is electrically isolated from the second interconnect.

3. The memory device according to claim 1, wherein
the second memory chip further includes a fourth terminal;
the first terminal is adjacent to the first circuit;
the second terminal is electrically isolated from the first terminal;
the third terminal is adjacent to the second circuit;
the fourth terminal is electrically isolated from the third terminal; and
a structure of the second memory chip is the same as a structure of the first memory chip.

4. The memory device according to claim 1,
further comprising a third memory chip provided above the second memory chip, wherein:
the first memory chip further includes a fifth terminal electrically isolated from the first and second terminals;
the second memory chip further includes a sixth terminal electrically isolated from the third terminal;
the interface chip further includes a third voltage generation circuit;
the third memory chip includes a third circuit, and a seventh terminal electrically connected to the third circuit; and
the seventh terminal is electrically connected to the third voltage generation circuit via the fifth and sixth terminals.

5. A memory device comprising:
an interface chip;
a first memory chip provided above the interface chip and including a first circuit, a first via electrically connected to the first circuit, and a second via electrically disconnected to the first via; and
a second memory chip provided above the first memory chip and including a second circuit and a third via electrically connected to the second circuit,
wherein:
the interface chip includes:
  a control circuit which controls writing, erasing, and reading performed for the first and second memory chips in accordance with an input signal;
  a first voltage generation circuit including a first voltage booster circuit electrically connected to the first circuit via the first via, and a second voltage booster circuit electrically connected to the second circuit via the second via and the third via;
  a first bump electrically connecting the first voltage generation circuit and a first power supply; and
  a second bump electrically disconnected to the first bump and electrically connecting the control circuit and a second power supply.

6. The memory device according to claim 5, wherein the first to third vias are through silicon vias.

7. The memory device according to claim 5, wherein:
the interface chip further includes a second voltage generation circuit electrically connected to the second bump;
the first memory chip further includes a fourth via electrically connecting the first circuit and the second voltage generation circuit; and
the second memory chip further includes a fifth via electrically connecting the second circuit and the second voltage generation circuit via the fourth via.

8. The memory device according to claim 7, wherein the fourth and fifth vias are through silicon vias.

9. The memory device according to claim 7, wherein:
the control circuit and the second voltage generation circuits are provided in a first region of the interface chip;
the first voltage generation circuit is provided in a second region of the interface chip;
a third region is provided between the first region and the second region; and
the third region electrically isolates the first region from the second region.

10. The memory device according to claim 9, wherein
the third region is provided from a first end face defined by a surface and a first side surface of the interface chip to a second end face defined by the surface and a second side surface opposite to the first side surface.

11. The memory device according to claim 9, wherein:
the first memory chip further includes a third voltage generation circuit electrically connected to the first voltage generation circuit;
the second memory chip further includes a fourth voltage generation circuit electrically connected to the first voltage generation circuit;
the interface chip further includes a first clock generation circuit configured to transmit a clock signal to the first, third, and fourth voltage generation circuits, and
the first clock generation circuit is provided in the first region.

12. The memory device according to claim 11, wherein:
the first memory chip further includes a second clock generation circuit electrically connected to the third voltage generation circuit;
the second memory chip further includes a third clock generation circuit electrically connected to the fourth voltage generation circuit.

13. The memory device according to claim 5, wherein:
a first end of the first via is electrically connected to the first circuit and a second end of the first via is electrically connected to the first voltage booster circuit;
a third end of the second via is electrically connected to the third via and a fourth end of the second via is electrically connected to the second voltage booster circuit;
a fifth end of the third via is electrically connected to the second circuit and a sixth end of the third via is electrically connected to the second voltage booster circuit via the second via; and
in a direction perpendicular to a surface of the first memory chip, the third end overlaps with the sixth end, without overlapping with the fourth end.

* * * * *